US006452249B1

(12) United States Patent
Maeda et al.

(10) Patent No.: US 6,452,249 B1
(45) Date of Patent: Sep. 17, 2002

(54) INDUCTOR WITH PATTERNED GROUND SHIELD

(75) Inventors: Shigenobu Maeda; Yasuo Yamaguchi; Yuuichi Hirano; Takashi Ipposhi; Takuji Matsumoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/688,812

(22) Filed: Oct. 17, 2000

(30) Foreign Application Priority Data

Apr. 19, 2000 (JP) ........................................ 2000-117720

(51) Int. Cl.$^7$ .............................................. H01L 29/00
(52) U.S. Cl. ........................................ 257/531; 257/347
(58) Field of Search ................................ 257/347, 531

(56) References Cited

U.S. PATENT DOCUMENTS

| | | | | | |
|---|---|---|---|---|---|
| 5,760,456 | A | * | 6/1998 | Grzegorek et al. | 257/531 |
| 6,030,877 | A | * | 2/2000 | Lee et al. | 438/381 |
| 2001/0013626 | A1 | * | 8/2001 | Fujii | 257/379 |
| 2001/0015473 | A1 | * | 8/2001 | Lemaire | 257/531 |

FOREIGN PATENT DOCUMENTS

| | | |
|---|---|---|
| JP | 9-270515 | 10/1997 |
| JP | 11-274412 | 10/1999 |

OTHER PUBLICATIONS

Yue et al., On–Chip Spiral Inductors with Patterned Ground Shields for Si–Based RF IC's, IEEE J. Solid–State Circuits, 33 (May 1998) 743.*
Lee et al., Characteristics of Interconnect Lines with Patterned Ground Shields and its Implication for Microwave ICs, IEEE 6$^{th}$ Inter. Conf. VLSI and CAD, Oct. 1999, 444.*
Lowther et al., On–Chip Interconnect Lines with Patterned Ground Shields, IEEE Microwave and Guided Wave Lett., 10 (Feb. 2000) 49.*
Yim et al., The Effects of a Ground Shield on Spiral Inductors Fabricated in a Silicon Bipolar Technology, IEEE Proc. Bipolar/BiCMOS Circuits and Tech. Mtg., Sep. 2000, 157.*
Fujii et al., A 0.15$\mu$m/0.6dB–NF$_{min}$ RF BiCMOS Technology Using Cobalt Silicide Ground Shields, IEEE Proc. Bipolar/BiCMOS Circuits and Tech. Mtg., Sep. 2000, 98.*
Murata et al., Effect of a Ground Shield of a Silicon On–Chip Spiral Inductor, IEEE Asia–Pacific Microwave Conf., Dec. 2000, 177.*
Shigenobu Maeda, et al., "Analysis of Delay Time Instability According to the Operating Frequency in Field Shield Isolated SOI Circuits," IEEE Transactions on Electron Devices, vol. 45, No. 7, Jul. 1998, pp. 1479–1486.
Y. Hirano, et al., Bulk–Layout–Compatible 0.18$\mu$m SOI–CMOS Technology Using Body–Fixed Partial Trench Isolation (PTI), IEEE International SOI Conference, Oct. 1999, pp. 131–132.

* cited by examiner

Primary Examiner—Richard Elms
Assistant Examiner—Christian D. Wilson
(74) Attorney, Agent, or Firm—Oblon, Spivak, McClelland, Maier & Neustadt, P.C.

(57) ABSTRACT

A semiconductor device having an inductor is provided. In an RF circuit portion (RP), a region in an SOI layer (3) corresponding to a region in which a spiral inductor (SI) is provided is divided into a plurality of SOI regions (21) by a plurality of trench isolation oxide films (11). The trench isolation oxide films (11) are formed by filling trenches extending from the surface of the SOI layer (3) to the surface of a buried oxide film (2) with a silicon oxide film, and completely electrically isolate the SOI regions (21) from each other. The trench isolation oxide films (11) have a predetermined width and are shaped to extend substantially perpendicularly to the surface of the buried oxide film (2). The semiconductor device is capable of reducing electrostatically induced power dissipation and electromagnetically induced power dissipation, and preventing the structure and manufacturing steps thereof from becoming complicated.

19 Claims, 61 Drawing Sheets

F/G. 53
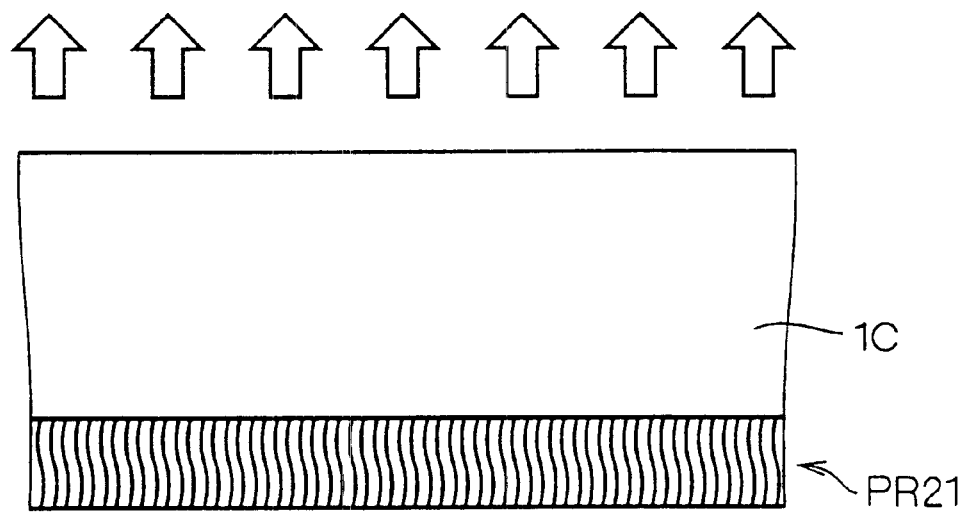
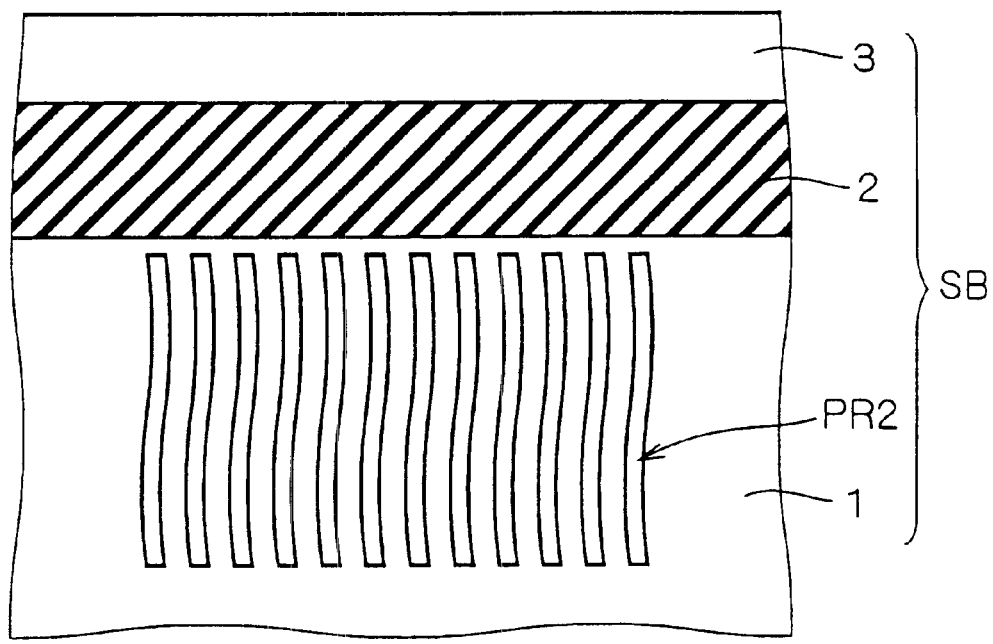

INDUCTOR WITH PATTERNED GROUND SHIELD

BACKGROUND OF THE INVENTION

1. Field of the Invention

The present invention relates to a semiconductor device and a method of manufacturing the same. More particularly, the invention relates to a semiconductor device including a high-frequency circuit having an inductor.

2. Description of the Background Art

With reference to FIG. 68, an example of constructions of a semiconductor device including a high-frequency circuit is described below. FIG. 68 is a block diagram showing a construction of a semiconductor device 90 having the function of receiving a radio wave signal of a radio frequency (10 kHz to 100 GHz) to output an audio signal.

As illustrated in FIG. 68, the semiconductor device 90 comprises an RF circuit portion 91 for demodulating the received radio wave signal, a logic portion 92 for processing the signal demodulated by the RF circuit portion 91 to convert the processed signal into the audio signal, and a memory cell portion 93 for storing therein data required for the RF circuit portion 91 and the logic portion 92 to perform the signal processing. The semiconductor device 90 is connected to an antenna device 94 for detecting the radio wave signal, and a sound output device 95 for outputting the audio signal.

The so-called high-frequency circuit, including the RF circuit portion 91, has an inductor (inductance element) in addition to a resistor and a capacitor. The inductor which functions to advance the phase of a high-frequency current may be used against a capacitor which functions to delay the phase of the high-frequency current, thereby to provide matching of the high-frequency current.

An inductor L1 in the RF circuit portion 91 is shown in FIG. 68. The inductor L1 has a parasitic capacitor C1 grounded through a resistor R1. The resistor R1 is a resistor of a semiconductor substrate which forms the RF circuit portion 91. There is no problem when the resistor R1 has an extremely low resistance or an extremely high resistance. However, some substrates have a resistance (e.g., about 10 Ωcm) which causes power consumption because of electrostatically induced power dissipation.

FIG. 69 shows a construction for preventing such electrostatically induced power dissipation. In the construction shown in FIG. 69, the parasitic capacitor C1 is not only grounded through the resistor R1 but also grounded through a resistor R2. The resistor R2 has a resistance extremely lower than that of the resistor R1. The high-frequency current predominantly flows to the ground through the resistor R2 to cause no electrostatically induced power dissipation.

The inductor L1 is shown as having an end A connected to the antenna device 94, and an end B connected to a source/drain electrode of a MOS transistor Q1. This is an example of inductor connections.

The resistor R2 is a conductor plate known as a shield plate, and is disposed in an underlying layer of the inductor L1. FIG. 70 is a perspective view showing a construction of the inductor L1 and the shield plate.

As illustrated in FIG. 70, the inductor L1 is formed of a wire wound in a spiral form and is thus referred to hereinafter as a spiral inductor SI. The center of the spiral which is a first end of the spiral inductor SI is connected to an underlying interconnect line WL through a contact portion CP extending through an interlayer insulation film not shown. The interconnect line WL is disposed on an interlayer insulation film SZ which covers a semiconductor substrate SB.

The interconnect line WL corresponds to the end B of the inductor L1 shown in FIG. 69, and the end A corresponds to a second end of the spiral inductor SI.

The semiconductor substrate SB is an SOI (silicon on insulator) substrate, which is shown in FIG. 70 as comprising only an SOI layer SL and an isolation oxide film FZ in the SOI layer SL. On the isolation oxide film FZ, a planar shield plate SP having an area at least equal to the area occupied by the spiral inductor SI, as viewed in plan, is disposed in a position corresponding to a region in which the spiral inductor SI is formed.

The shield plate SP is made of a low-resistance conductor similar to the material of the interconnect line, and is grounded through an interconnect line not shown to cause no electrostatically induced power dissipation.

However, current flowing in the spiral inductor SI generates an eddy current inside the shield plate SP to increase electromagnetically induced power dissipation, presenting another problem of the increase in total power dissipation.

To solve the problem, there has been proposed a perforated ground shield (referred to hereinafter as a PG shield) which is a shield plate with portions cut away to interrupt the path of the eddy current.

FIG. 71 shows an example of the PG shield. The PG shield shown in FIG. 71 comprises a plurality of plates PL electrically insulated from each other. The plates PL are triangular in plan configuration, and are arranged radially so that their apexes constitute a central part of the PG shield.

The use of such a construction interrupts the path of the eddy current to reduce the electromagnetically induced power dissipation.

As described above, the background art semiconductor device having the inductor uses the PG shield to reduce the electrostatically induced power dissipation and the electromagnetically induced power dissipation. However, the formation of the PG shield requires one additional conductor layer to be provided, resulting in the increase in structural complexity and the number of manufacturing steps.

SUMMARY OF THE INVENTION

According to a first aspect of the present invention, a semiconductor device comprises: a semiconductor substrate; a shield layer disposed in a main surface of the semiconductor substrate; and an inductance element disposed over a region in which the shield layer is formed, with an interlayer insulation film therebetween, wherein the shield layer has at least one conductive portion connected to a ground potential, and at least one current interrupting portion for interrupting a path of an eddy current induced by the inductance element in a plane of the at least one conductive portion.

Preferably, according to a second aspect of the present invention, in the semiconductor device of the first aspect, the semiconductor substrate is an SOI substrate comprising a substrate portion serving as a foundation, a buried oxide film disposed on the substrate portion, and an SOI layer disposed on the buried oxide film. The at least one current interrupting portion comprises a plurality of selectively disposed isolation oxide films extending from a surface of the SOI layer through the SOI layer to the buried oxide film. The at least one conductive portion comprises a plurality of SOI regions electrically isolated from each other by the plurality of isolation oxide films.

Preferably, according to a third aspect of the present invention, in the semiconductor device of the second aspect, each of the plurality of isolation oxide films has a predetermined width and extends substantially perpendicularly to a surface of the buried oxide film.

Preferably, according to a fourth aspect of the present invention, in the semiconductor device of the second aspect, each of the plurality of isolation oxide films includes a first portion having a first width and extending substantially perpendicularly to a surface of the buried oxide film, and a second portion continuous with and beneath the first portion, the second portion having a second width smaller than the first width and extending substantially perpendicularly to the surface of the buried oxide film.

Preferably, according to a fifth aspect of the present invention, in the semiconductor device of the first aspect, the semiconductor substrate is an SOI substrate comprising a substrate portion serving as a foundation, a buried oxide film disposed on the substrate portion, and an SOI layer disposed on the buried oxide film. The at least one conductive portion comprises a plurality of SOI regions obtained by thinning the SOI layer to a predetermined thickness. The at least one current interrupting portion comprises an insulation film disposed to at least fill a space between the plurality of SOI regions.

Preferably, according to a sixth aspect of the present invention, in the semiconductor device of the fifth aspect, each of the plurality of SOI regions contains a semiconductor impurity of a relatively high concentration.

Preferably, according to a seventh aspect of the present invention, in the semiconductor device of the fifth aspect, each of the plurality of SOI regions has a silicide film formed on an upper surface thereof.

Preferably, according to an eighth aspect of the present invention, in the semiconductor device of the first aspect, the semiconductor substrate is an SOI substrate comprising a substrate portion serving as a foundation, a buried oxide film disposed on the substrate portion, and an SOI layer disposed on the buried oxide film. The shield layer comprises a first group of SOI regions of a first conductivity type, and a second group of SOI regions of a second conductivity type, the first group of SOI regions and the second group of SOI regions being combined to constitute a plurality of diodes. The at least one current interrupting portion includes at least one reverse-biased diode which is at least one of the plurality of diodes to which a reverse bias is applied. The at least one conductive portion includes one of the first and second groups connected to a ground potential.

Preferably, according to a ninth aspect of the present invention, in the semiconductor device of the eighth aspect, the first group of SOI regions and the second group of SOI regions are formed in a region obtained by thinning the SOI layer to a predetermined thickness. The semiconductor device further comprises an isolation oxide film for entirely covering the first group of SOI regions and the second group of SOI regions.

Preferably, according to a tenth aspect of the present invention, in the semiconductor device of the eighth aspect, each of the first group of SOI regions includes a first region approximately equal in thickness to the SOI layer, and a second region adjacent to the first region and obtained by thinning the SOI layer. Each of the second group of SOI regions is approximately equal in thickness to the SOI layer. The semiconductor device further comprises an isolation oxide film for covering an upper surface of each of the second regions.

Preferably, according to an eleventh aspect of the present invention, in the semiconductor device of the tenth aspect, each of the first regions of the first group of SOI regions and the second group of SOI regions has a silicide film formed on an upper surface thereof.

Preferably, according to a twelfth aspect of the present invention, in the semiconductor device of the eighth aspect, each of the first group of SOI regions is a region obtained by thinning the SOI layer to a predetermined thickness. Each of the second group of SOI regions is approximately equal in thickness to the SOI layer. The first group of SOI regions and the second group of SOI regions are adjacent to each other. The semiconductor device further comprises an isolation oxide film for individually covering the first group of SOI regions.

Preferably, according to a thirteenth aspect of the present invention, in the semiconductor device of the twelfth aspect, each of the second group of SOI regions has a silicide film formed on an upper surface thereof.

Preferably, according to a fourteenth aspect of the present invention, in the semiconductor device of the twelfth aspect, the second group of SOI regions are of a rectangular plan configuration. The shield layer is of a plan configuration in which the second group of SOI regions are arranged in a matrix, with the isolation oxide film therebetween.

Preferably, according to a fifteenth aspect of the present invention, in the semiconductor device of the twelfth aspect, the second group of SOI regions are electrically connected to each other by a gate interconnect line similar in construction to a gate electrode of a MOS transistor.

Preferably, according to a sixteenth aspect of the present invention, in the semiconductor device of the eighth aspect, the first group of SOI regions and the second group of SOI regions are arranged in an alternating pattern. A gate structure of a MOS transistor is disposed on each of the first group of SOI regions.

Preferably, according to a seventeenth aspect of the present invention, in the semiconductor device of the eighth aspect, the first group of SOI regions and the second group of SOI regions are arranged in an alternating pattern. Each of the first group of SOI regions includes a first region and a second region adjacent to the first region. A gate structure of a MOS transistor is disposed on each of the second regions.

Preferably, according to an eighteenth aspect of the present invention, in the semiconductor device of the eighth aspect, the first group of SOI regions and the second group of SOI regions are arranged in an alternating pattern. Each of the first group of SOI regions includes a first region and a second region adjacent to the first region. Each of the second group of SOI regions and the first regions has a silicide film formed thereon selectively for non-engagement with the second regions.

Preferably, according to a nineteenth aspect of the present invention, in the semiconductor device of the eighth aspect, the first group of SOI regions and the second group of SOI regions are arranged in an alternating pattern. Each of the first group of SOI regions has a silicide film formed thereon selectively for non-engagement with the second group of SOI regions.

Preferably, according to a twentieth aspect of the present invention, in the semiconductor device of the first aspect, the semiconductor substrate is an SOI substrate comprising a substrate portion serving as a foundation, a buried oxide film disposed on the substrate portion, and an SOI layer disposed on the buried oxide film. The substrate portion comprises an eddy current suppressing portion for suppressing the generation of an eddy current induced by the inductance element, the eddy current suppressing portion being disposed in a region corresponding to at least a region in which the inductance element is formed, the eddy current suppressing portion having at least one hollow structure formed therein.

Preferably, according to a twenty-first aspect of the present invention, in the semiconductor device of the twentieth aspect, the eddy current suppressing portion comprises a cavity having a depth which is a factor of about one to about ten less than the length, as viewed in plan, of the inductance element, the cavity being approximately coextensive, as viewed in plan, with at least the region in which the inductance element is formed.

Preferably, according to a twenty-second aspect of the present invention, in the semiconductor device of the twentieth aspect, the eddy current suppressing portion comprises a porous layer having a depth which is a factor of about one to about ten less than the length, as viewed in plan, of the inductance element, the porous layer being approximately coextensive, as viewed in plan, with at least the region in which the inductance element is formed.

Preferably, according to a twenty-third aspect of the present invention, in the semiconductor device of the first aspect, the semiconductor substrate is an SOI substrate comprising a substrate portion serving as a foundation, a buried oxide film disposed on the substrate portion, and an SOI layer disposed on the buried oxide film. The SOI layer comprises a porous layer having a depth which is a factor of about one to about ten less than the length, as viewed in plan, of the inductance element, the porous layer being approximately coextensive, as viewed in plan, with at least a region in which the inductance element is formed.

Preferably, according to a twenty-fourth aspect of the present invention, in the semiconductor device of the first aspect, the semiconductor substrate comprises a porous layer disposed in a region corresponding to a region in which the inductance element is formed, the porous layer having a depth which is a factor of about one to about ten less than the length, as viewed in plan, of the inductance element, the porous layer being approximately coextensive, as viewed in plan, with at least the region in which the inductance element is formed.

Preferably, according to a twenty-fifth aspect of the present invention, in the semiconductor device of any one of the twenty-second to twenty-fourth aspects, the porous layer comprises a plurality of holes or trenches formed by etching or a plurality of holes formed by an anodization process.

Preferably, according to a twenty-sixth aspect of the present invention, the semiconductor device of the second aspect further comprises a plurality of trenches disposed under the plurality of isolation oxide films and extending through the buried oxide film into the substrate portion.

Preferably, according to a twenty-seventh aspect of the present invention, the semiconductor device of the fifth aspect further comprises a plurality of trenches disposed under the insulation film disposed between the plurality of SOI regions and extending through the buried oxide film into the substrate portion.

Preferably, according to a twenty-eighth aspect of the present invention, in the semiconductor device of the first aspect, the at least one current interrupting portion comprises a plurality of isolation oxide films extending from the surface of the semiconductor substrate to a predetermined depth. The at least one conductive portion comprises a plurality of substrate regions divided by the plurality of isolation oxide films. The semiconductor device further comprises a plurality of trenches reaching a predetermined depth in the semiconductor substrate.

Preferably, according to a twenty-ninth aspect of the present invention, in the semiconductor device of the twenty-fifth aspect, the plurality of holes or trenches are filled with a near-vacuum.

Preferably, according to a thirtieth aspect of the present invention, in the semiconductor device of any one of the twenty-sixth to twenty-eighth aspects, the plurality of trenches are filled with a near-vacuum.

According to a thirty-first aspect of the present invention, a semiconductor device comprises: a semiconductor substrate; and a shield layer disposed in a main surface of the semiconductor substrate under and longitudinally of an interconnect layer, the shield layer including a plurality of conductive portions spaced apart from each other longitudinally of the interconnect layer and connected to a ground potential, and a plurality of insulation portions disposed between the plurality of conductive portions.

Preferably, according to a thirty-second aspect of the present invention, in the semiconductor device of the thirty-first aspect, each of the plurality of conductive portions comprises a plurality of conductor films and a plurality of insulation films stacked in an alternating pattern.

A thirty-third aspect of the present invention is intended for a method of manufacturing a semiconductor device having an inductance element. According to the present invention, the method comprises the steps of: (a) preparing an SOI substrate including a substrate portion serving as a foundation, a buried oxide film disposed on the substrate portion, and an SOI layer disposed on the buried oxide film; (b) forming an opening extending through at least the SOI layer and the buried oxide film to the substrate portion; and (c) introducing a solution of KOH into the opening to etch the substrate portion, thereby forming a cavity having a depth which is a factor of about one to about ten less than the length, as viewed in plan, of the inductance element, the cavity being approximately coextensive, as viewed in plan, with at least a region in which the inductance element is to be formed.

A thirty-fourth aspect of the present invention is intended for a method of manufacturing a semiconductor device having an inductance element. According to the present invention, the method comprises the steps of: (a) preparing a first silicon substrate to form a porous layer in a main surface of the first silicon substrate, the porous layer having a depth which is a factor of about one to about ten less than the length, as viewed in plan, of the inductance element, the porous layer being approximately coextensive, as viewed in plan, with at least a region in which the inductance element is to be formed; (b) preparing a second silicon substrate to form a silicon oxide film on a main surface of the second silicon substrate; (c) bonding the first silicon substrate and the second silicon substrate together so that the main surface of the first silicon substrate in which the porous layer is formed and the silicon oxide film of the second silicon substrate are in face-to-face relation, the first silicon substrate being used as a substrate portion, the silicon oxide film being used as a buried oxide film, and then thinning the second silicon substrate to a predetermined thickness by polishing to form an SOI layer; and (d) forming the inductance element over a region in which the porous layer is formed.

A thirty-fifth aspect of the present invention is intended for a method of manufacturing a semiconductor device having an inductance element. According to the present invention, the method comprises the steps of: (a) preparing a first silicon substrate to form a silicon oxide film on a main surface of the first silicon substrate; (b) preparing a second silicon substrate to form a porous layer in a main surface of the second silicon substrate, the porous layer having a depth which is a factor of about one to about ten less than the length, as viewed in plan, of the inductance element, the porous layer being approximately coextensive, as viewed in plan, with at least a region in which the inductance element is to be formed; (c) bonding the first silicon substrate and the second silicon substrate together so that the silicon oxide film of the first silicon substrate and the main surface of the second silicon substrate in which the porous layer is formed are in face-to-face relation, the first silicon substrate being used as a substrate portion, the silicon oxide film being used as a buried oxide film, and then thinning the second silicon substrate to a predetermined thickness by polishing to form an SOI layer in conjunction with the porous layer; and (d) forming the inductance element over a region in which the porous layer is formed.

Preferably, according to a thirty-sixth aspect of the present invention, in the method of the thirty-fourth or thirty-fifth aspect, the step (a) comprises the steps of: (a-1) forming a plurality of holes or trenches in the main surface of the first silicon substrate by etching to constitute the porous layer; and (a-2) covering an opening of each of the plurality of holes or trenches with an insulation film, with the interior of each of the plurality of holes or trenches rendered hollow.

Preferably, according to a thirty-seventh aspect of the present invention, in the method of the thirty-fourth or thirty-fifth aspect, the step (a) comprises the steps of: (a-1) forming a plurality of holes or trenches in the main surface of the first silicon substrate by etching to constitute the porous layer; and (a-2) performing an anneal in a hydrogen atmosphere to remove an opening of each of the plurality of holes or trenches by reduction, with the interior of each of the plurality of holes or trenches rendered hollow.

Preferably, according to a thirty-eighth aspect of the present invention, in the method of the thirty-fourth or thirty-fifth aspect, the step (a) comprises the steps of: (a-1) forming a plurality of holes in the main surface of the first silicon substrate by an anodization process to constitute the porous layer; and (a-2) covering an opening of each of the plurality of holes with an insulation film, with the interior of each of the plurality of holes rendered hollow.

Preferably, according to a thirty-ninth aspect of the present invention, in the method of the thirty-fourth or thirty-fifth aspect, the step (a) comprises the steps of: (a-1) forming a plurality of holes in the main surface of the first silicon substrate by an anodization process to constitute the porous layer; and (a-2) performing an anneal in a hydrogen atmosphere to remove an opening of each of the plurality of holes by reduction, with the interior of each of the plurality of holes rendered hollow.

In accordance with the first aspect of the present invention, the semiconductor device comprises the shield layer disposed in the main surface of the semiconductor substrate, the shield layer having the at least one conductive portion connected to the ground potential, and the at least one current interrupting portion for interrupting the path of the eddy current induced by the inductance element such as a spiral inductor in a plane of the at least one conductive portion. Therefore, the semiconductor device of the first aspect can reduce electrostatically induced power dissipation, and interrupt the path of the eddy current in the shield layer to reduce electromagnetically induced power dissipation. Additionally, the shield layer which is formed in the semiconductor substrate may be formed, for example, in the step of forming a MOS transistor at the same time. Therefore, no additional conductor layer is required to form the shield layer, and the device structure is not complicated.

In the semiconductor device according to the second aspect of the present invention, the at least one current interrupting portion comprises the plurality of isolation oxide films extending to the buried oxide film, and the at least one conductive portion comprises the plurality of SOI regions electrically isolated from each other by the plurality of isolation oxide films. Current flows through the plurality of SOI regions, whereby the electrostatically induced power dissipation is reduced. The isolation oxide films interrupt the path of the eddy current to avoid the electromagnetically induced power dissipation resulting from the eddy current.

In the semiconductor device according to the third aspect of the present invention, each of the plurality of isolation oxide films has a predetermined width and is shaped to extend substantially perpendicularly to the surface of the buried oxide film. This is known as a complete isolation oxide film. Therefore, the plurality of isolation oxide films may be formed simultaneously with device isolation in a portion where a MOS transistor is formed by using the complete isolation oxide film, and a method of manufacturing the semiconductor device is not complicated.

In the semiconductor device according to the fourth aspect of the present invention, each of the plurality of isolation oxide films includes the first portion having the first width and extending substantially perpendicularly to the surface of the buried oxide film, and the second portion continuous with and beneath the first portion, the second portion having the second width smaller than the first width and extending substantially perpendicularly to the surface of the buried oxide film. Thus, the plurality of isolation oxide films are formed in the step of manufacturing a so-called partial isolation oxide film. Therefore, the plurality of isolation oxide films may be formed simultaneously with device isolation in a portion where a MOS transistor is formed by using the partial isolation oxide film, and a method of manufacturing the semiconductor device is not complicated.

In the semiconductor device according to the fifth aspect of the present invention, the at least one conductive portion comprises the plurality of SOI regions obtained by thinning the SOI layer to the predetermined thickness, and the at least one current interrupting portion comprises the insulation film disposed to at least fill the space between the plurality of SOI regions. Current flows through the plurality of SOI regions, whereby the electrostatically induced power dissipation is reduced. The insulation film interrupts the path of the eddy current to avoid the electromagnetically induced power dissipation resulting from the eddy current. Additionally, since the at least one conductive portion is formed by dividing the SOI layer, no additional conductor layer is required to form the shield layer, and the device structure is not complicated.

In the semiconductor device according to the sixth aspect of the present invention, each of the plurality of SOI regions contains the semiconductor impurity of the relatively high concentration. Therefore, the SOI regions having a low resistance are provided.

In the semiconductor device according to the seventh aspect of the present invention, each of the plurality of SOI regions has the silicide film formed on the upper surface thereof. Therefore, the SOI regions having a low resistance are provided.

In the semiconductor device according to the eighth aspect of the present invention, the at least one current interrupting portion includes at least one reverse-biased diode which is at least one of the plurality of diodes to which a reverse bias is applied, and the at least one conductive portion includes one of the first and second groups of the SOI regions connected to the ground potential. The presence of the at least one reverse-biased diode prevents the diodes from being forward-biased by a counter electromotive force which generates the eddy current, to interrupt the eddy current, thereby avoiding the electromagnetically induced power dissipation resulting from the eddy current. Additionally, since the at least one current interrupting portion and the at least one conductive portion are formed by dividing the SOI layer, no additional conductor layer is required to form the shield layer, and the device structure is not complicated.

In the semiconductor device according to the ninth aspect of the present invention, the first group of SOI regions, the second group of SOI regions and the isolation oxide film thereon constitute a so-called partial isolation structure, which may be formed simultaneously with device isolation, for example, in a portion where a MOS transistor is formed by using the partial isolation, and a method of manufacturing the semiconductor device is not complicated. Additionally, when device isolation is performed in the portion where the MOS transistor is formed by using the partial isolation, the potential of a channel region can be fixed through a well region under the partial isolation oxide film. Therefore, various problems resulting from a floating-substrate effect are prevented.

In the semiconductor device according to the tenth aspect of the present invention, the isolation oxide film which is formed only on the second regions is small in area, to prevent the generation of dishing during the manufacture.

In the semiconductor device according to the eleventh aspect of the present invention, each of the first regions of the first group of SOI regions and the second group of SOI regions has the silicide film formed on the upper surface thereof. Therefore, the SOI regions having a low resistance are provided.

In the semiconductor device according to the twelfth aspect of the present invention, the isolation oxide film which is formed only on the second regions is small in area, to prevent the generation of dishing during the manufacture. Additionally, the first and second groups of SOI regions which constitute diodes are simple in construction.

In the semiconductor device according to the thirteenth aspect of the present invention, each of the second group of SOI regions has the silicide film formed on the upper surface thereof. Therefore, the SOI regions having a low resistance are provided.

In the semiconductor device according to the fourteenth aspect of the present invention, the second group of SOI regions are arranged in a matrix, with the isolation oxide film therebetween. Therefore, a substantial change in the positioning of the conductive portion of the shield layer is made by changing the configuration of an interconnect line for connecting the second group of SOI regions.

In the semiconductor device according to the fifteenth aspect of the present invention, the second group of SOI regions are electrically connected to each other by the gate interconnect line similar in construction to a gate electrode of a MOS transistor. This simplifies the step of manufacturing the interconnect line for electrical connection between the SOI regions.

In the semiconductor device according to the sixteenth aspect of the present invention, the gate structure of the MOS transistor is disposed on each of the first group of SOI regions. When a portion constructed by the first and second groups of SOI regions is regarded as a first resistive element, the gate structure of the MOS transistor is regarded as a resistive element disposed in parallel to the first resistive element. This further reduces the resistance of the shield layer.

In the semiconductor device according to the seventeenth aspect of the present invention, the gate structure of the MOS transistor is disposed on each of the second regions, and the SOI regions on the opposite sides of the gate structure have different conductivity types. Therefore, if a gate potential is applied to the gate structure, the gate structure does not function as a gate. This provides increased flexibility in selecting potentials to be applied to the gate structure.

In the semiconductor device according to the eighteenth aspect of the present invention, each of the second group of SOI regions and the first regions has the silicide film formed thereon selectively for non-engagement with the second regions. Therefore, the resistance of the shield layer is decreased.

In the semiconductor device according to the nineteenth aspect of the present invention, each of the first group of SOI regions has the silicide film formed thereon selectively for non-engagement with the second group of SOI regions. Therefore, the resistance of the shield layer is decreased.

In the semiconductor device according to the twentieth aspect of the present invention, the substrate portion of the SOI substrate comprises the eddy current suppressing portion having at least one hollow structure formed therein to suppress the generation of the eddy current induced by the inductance element in the substrate portion, thereby reducing the electromagnetically induced power dissipation.

In the semiconductor device according to the twenty-first aspect of the present invention, the eddy current suppressing portion comprises the cavity having a depth which is a factor of about one to about ten less than the length, as viewed in plan, of the inductance element, the cavity being approximately coextensive, as viewed in plan, with at least the region in which the inductance element is formed. Therefore, the cavity prevents the eddy current from being induced by the inductance element in the substrate portion.

In the semiconductor device according to the twenty-second aspect of the present invention, the eddy current suppressing portion comprises the porous layer having a depth which is a factor of about one to about ten less than the length, as viewed in plan, of the inductance element, the porous layer being approximately coextensive, as viewed in plan, with at least the region in which the inductance element is formed. Therefore, the porous layer interrupts the path of the eddy current induced by the inductance element in the substrate portion, to avoid the electromagnetically induced power dissipation resulting from the eddy current.

In the semiconductor device according to the twenty-third aspect of the present invention, the SOI layer comprises the porous layer having a depth which is a factor of about one to about ten less than the length, as viewed in plan, of the inductance element, the porous layer being approximately coextensive, as viewed in plan, with at least the region in which the inductance element is formed. Therefore, the porous layer interrupts the path of the eddy current induced by the inductance element in the SOI layer, to avoid the electromagnetically induced power dissipation resulting from the eddy current.

In the semiconductor device according to the twenty-fourth aspect of the present invention, the semiconductor substrate comprises the porous layer having a depth which is a factor of about one to about ten less than the length, as viewed in plan, of the inductance element, the porous layer being approximately coextensive, as viewed in plan, with at least the region in which the inductance element is formed. Therefore, the porous layer interrupts the path of the eddy current induced by the inductance element in the semiconductor substrate, to avoid the electromagnetically induced power dissipation resulting from the eddy current.

The semiconductor device according to the twenty-fifth aspect of the present invention has a construction in which the porous layer is implementable.

The semiconductor device according to the twenty-sixth and twenty-seventh aspects of the present invention can reduce the electrostatically induced power dissipation by means of the shield layer, and interrupt the path of the eddy current in the shield layer to reduce the electromagnetically induced power dissipation. Additionally, the semiconductor device further comprises the plurality of trenches extending through the buried oxide film into the substrate portion. The plurality of trenches interrupt the path of the eddy current induced by the inductance element in the buried oxide film and the substrate portion, to avoid the electromagnetically induced power dissipation resulting from the eddy current.

The semiconductor device according to the twenty-eighth aspect of the present invention can reduce the electrostatically induced power dissipation by means of the shield layer formed in a so-called bulk substrate, and interrupt the path of the eddy current in the shield layer to reduce the electromagnetically induced power dissipation. Additionally, the semiconductor device further comprises the plurality of trenches extending into the substrate. The plurality of trenches interrupt the path of the eddy current induced by the inductance element in the buried oxide film and the substrate portion, to avoid the electromagnetically induced power dissipation resulting from the eddy current.

In the semiconductor device according to the twenty-ninth aspect of the present invention, the plurality of holes or trenches are filled with a near-vacuum, to interrupt the path of the eddy current induced by the inductance element and to reduce the electrostatically induced power dissipation.

In the semiconductor device according to the thirtieth aspect of the present invention, the plurality of trenches are filled with a near-vacuum, to interrupt the path of the eddy current induced by the inductance element and to reduce the electrostatically induced power dissipation.

The semiconductor device according to the thirty-first aspect of the present invention comprises the shield layer disposed in the main surface of the semiconductor substrate under and longitudinally of the interconnect layer, to reduce the electrostatically induced power dissipation resulting from the interconnect layer.

In the semiconductor device according to the thirty-second aspect of the present invention, each of the plurality of conductive portions comprises the plurality of conductor films and the plurality of insulation films stacked in an alternating pattern, to prevent current flowing in the interconnect layer from generating the eddy current in a plane perpendicular to the semiconductor substrate in the conductive portions, thereby avoiding the electromagnetically induced power dissipation resulting from the eddy current.

In the method according to the thirty-third aspect of the present invention, the cavity for suppressing the generation of the eddy current induced by the inductance element is efficiently formed in the region in which the inductance element, e.g. a spiral inductor, of the substrate portion of the SOI substrate is to be formed.

In the method according to the thirty-fourth aspect of the present invention, the porous layer for suppressing the generation of the eddy current induced by the inductance element is efficiently formed in the region in which the inductance element, e.g. a spiral inductor, of the substrate portion of the SOI substrate is to be formed.

In the method according to the thirty-fifth aspect of the present invention, the porous layer for suppressing the generation of the eddy current induced by the inductance element is efficiently formed in the region in which the inductance element, e.g. a spiral inductor, of the SOI layer of the SOI substrate is to be formed.

In the method according to the thirty-sixth and thirty-seventh aspects of the present invention, there is provided a specific method of rendering hollow the interior of the porous layer formed by etching.

In the method according to the thirty-eighth and thirty-ninth aspects of the present invention, there is provided a specific method of rendering hollow the interior of the porous layer formed by the anodization process.

It is therefore an object of the present invention to provide a semiconductor device having an inductor which is capable of reducing electrostatically induced power dissipation and electromagnetically induced power dissipation while preventing the structure and manufacturing steps thereof from becoming complicated.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 50 through 53 are cross-sectional views showing the steps of forming the porous layer by an anodization process;

DESCRIPTION OF THE PREFERRED EMBODIMENTS

<A. First Preferred Embodiment>

<A-1. Device Construction>

Figure 1:
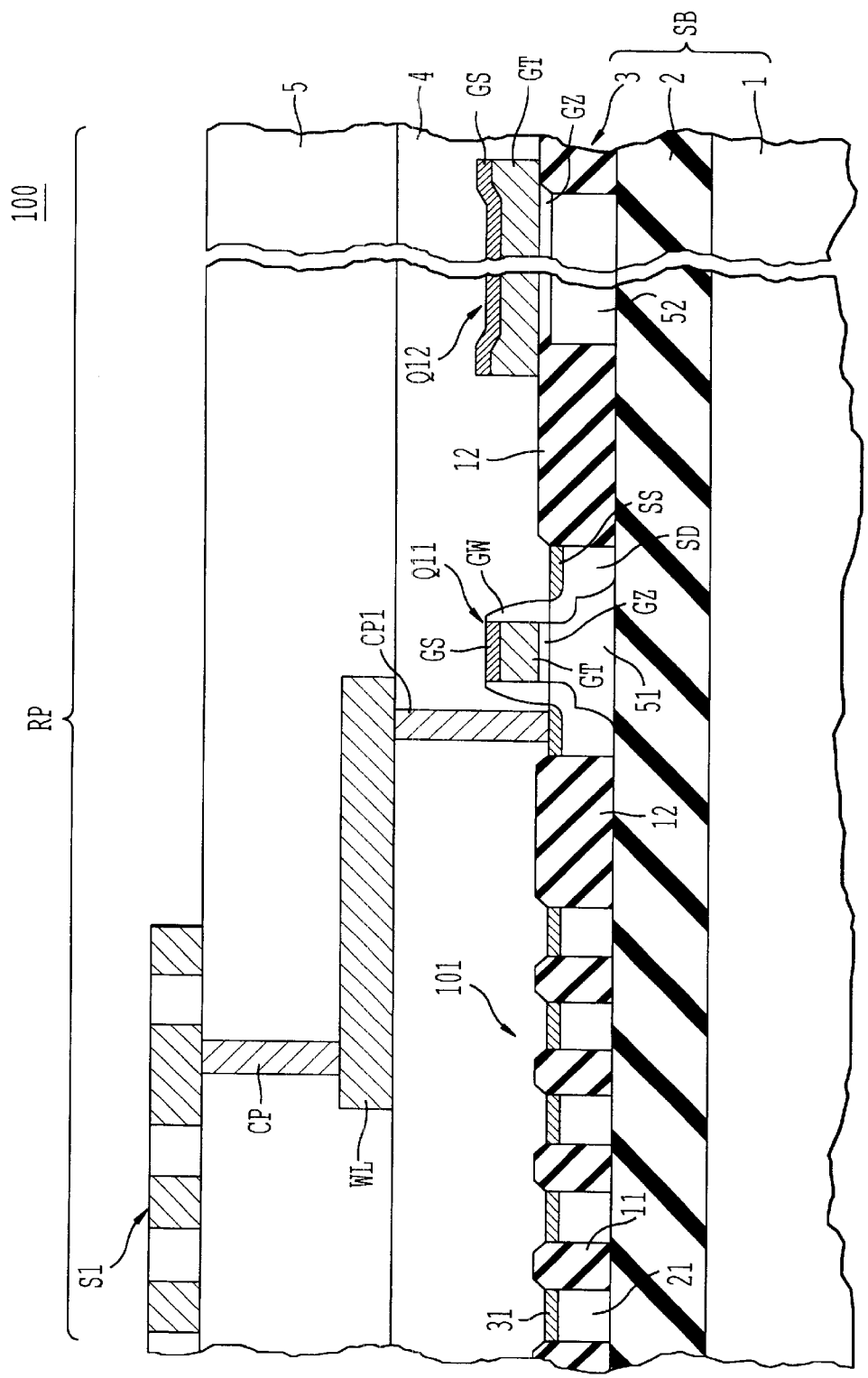
FIG. 1 is a cross-sectional view showing a construction of a semiconductor device according to a first preferred embodiment of the present invention.

FIG. 1 shows a construction of a semiconductor device 100 according to a first preferred embodiment of the present invention.

Figure 68:
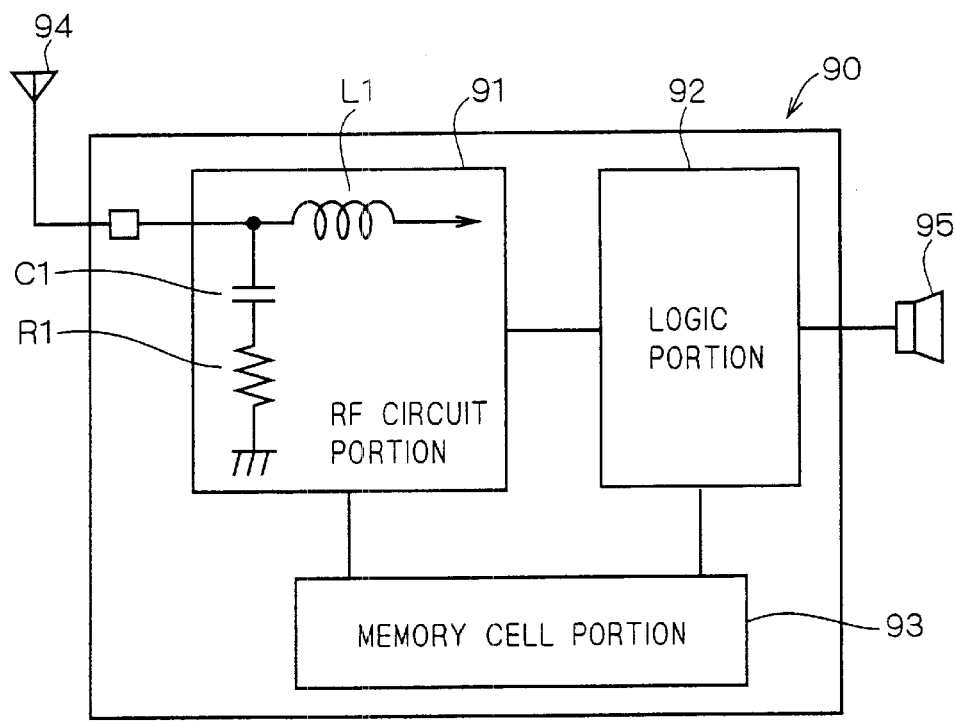
FIG. 68 is a block diagram showing a construction of a semiconductor device having a high-frequency circuit.
Figure 69:
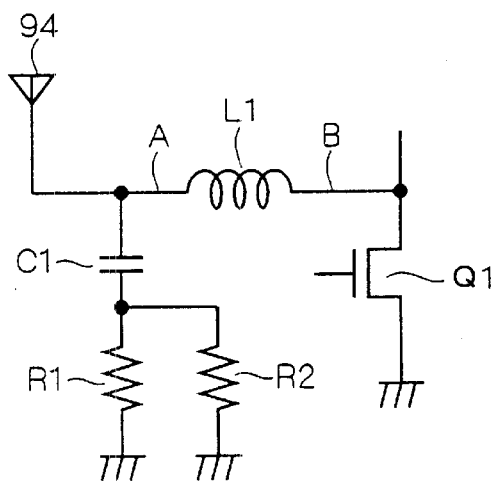
FIG. 69 illustrates electrostatically induced power dissipation caused by an inductor.

The semiconductor device 100 comprises an RF circuit portion RP, as shown in FIG. 1, which corresponds to a part of the RF circuit portion 91 of, by way of example, the semiconductor device 90 illustrated with reference to FIG. 68.

Referring to FIG. 1, the RF circuit portion RP is disposed on an SOI substrate SB including a silicon substrate 1, a buried oxide film 2 disposed on the silicon substrate 1, and an SOI layer 3 disposed on the buried oxide film 2.

Figure 70:
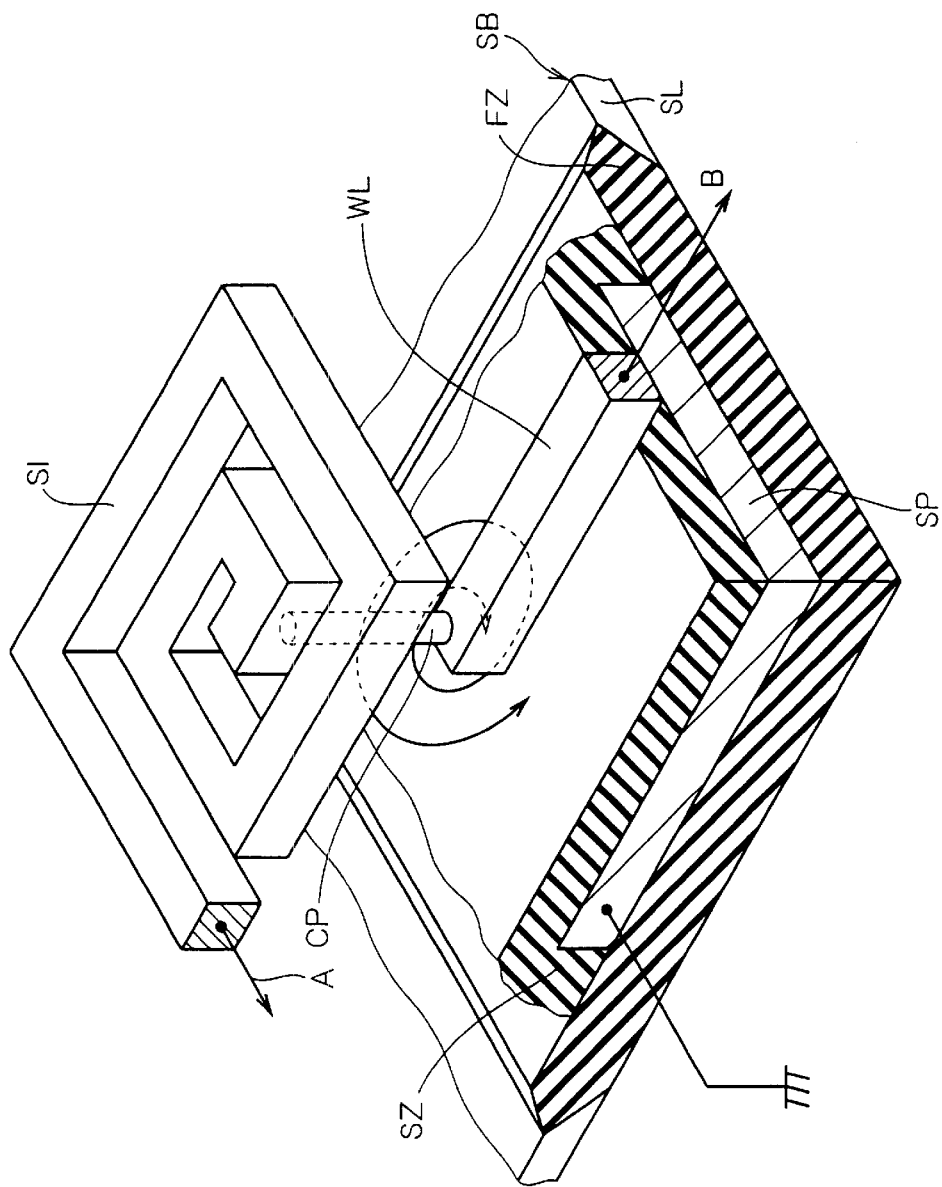
FIG. 70 is a perspective view showing a construction of a spiral inductor and a shield plate.
Figure 71:
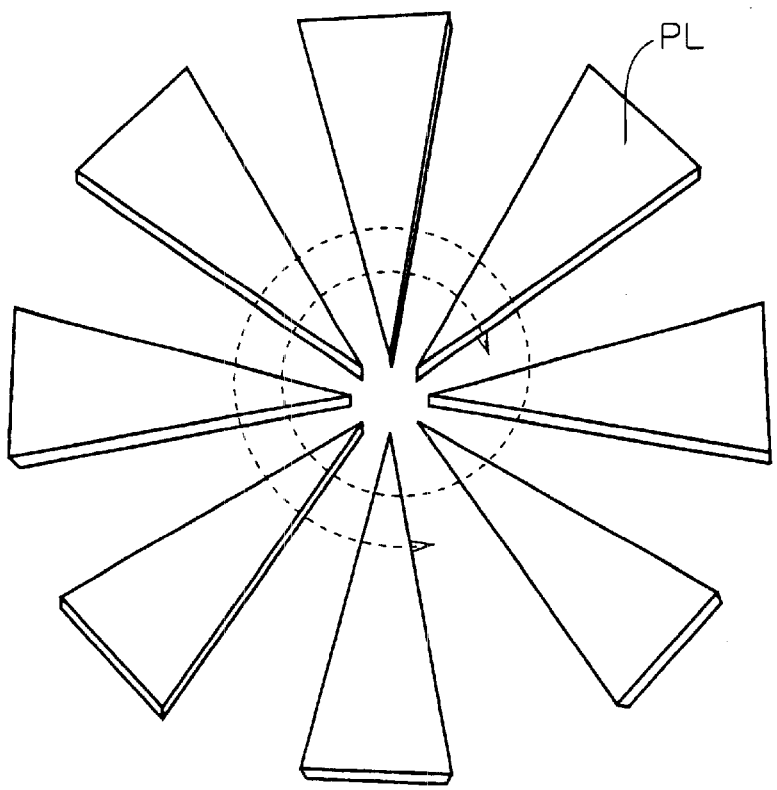
FIG. 71 shows a construction of a perforated shield.

In the RF circuit portion RP, a region in the SOI layer 3 corresponding to a region in which a spiral inductor SI (whose plan configuration is shown in FIG. 70) is provided is divided into a plurality of SOI regions 21 by a plurality of trench isolation oxide films 11. The trench isolation oxide films 11 are formed by filling trenches extending from the surface of the SOI layer 3 to the surface of the buried oxide film 2 with a silicon oxide film, and completely electrically isolate the SOI regions 21 from each other.

The trench isolation oxide films 11 have a predetermined width and are shaped to extend substantially perpendicularly to the surface of the buried oxide film 2.

A silicide film 31 is disposed on each of the SOI regions 21. The plurality of trench isolation oxide films 11, the SOI regions 21 and the silicide films 31 constitute a PG shield 101 (shield layer).

An isolation oxide film, such as the trench isolation oxide films 11, which defines completely electrically isolated SOI regions is referred to as a complete isolation oxide film.

A region in which the PG shield 101 is formed is defined by a trench isolation oxide film 12. Outside the region, the SOI layer 3 is divided into SOI regions 51 and 52 by another trench isolation oxide film 12. The trench isolation oxide films 12 are complete isolation oxide films, and completely electrically isolate the SOI regions 51 and 52 from each other.

MOS transistors Q11 and Q12 are formed in the SOI regions 51 and 52, respectively. The MOS transistors Q11 and Q12 have a gate insulation film GZ disposed on the SOI regions 51 and 52, a gate electrode GT disposed on the gate insulation film GZ, a silicide film GS disposed on the gate electrode GT, and sidewall insulation films GW disposed to cover the side surfaces of the gate insulation film GZ, the gate electrode GT and the silicide film GS. The MOS transistors Q11 and Q12 are common MOS transistors and do not have particular features in structure and manufacturing method.

Silicide films SS and source/drain regions SD of the MOS transistor Q11 are shown as disposed in the surface of the SOI region 51 outside the sidewall insulation films GW. It is needless to say that the MOS transistor Q12 has a similar construction. The silicide films SS and the source/drain regions SD of the MOS transistor Q12 are not shown in FIG. 1 only because the cross-sectional configuration of the MOS transistor Q12 along the length of the gate electrode GT is depicted.

An interlayer insulation film 4 made of, for example, silicon oxide covers the entire top surface of the SOI substrate SB. An interconnect line WL for electrically connecting the spiral inductor SI to the MOS transistor Q11 is disposed on the interlayer insulation film 4. A first end of the interconnect line WL is connected to a contact portion CP1 extending through the interlayer insulation film 4 to one of the silicide films SS of the MOS transistor Q11. The contact portion CP1 is formed by filling a contact hole extending through the interlayer insulation film 4 with a conductor.

An interlayer insulation film 5 made of, for example, silicon oxide covers the top surface of the interlayer insulation film 4. The spiral inductor SI is disposed on the interlayer insulation film 5. A first end of the spiral inductor SI is connected to the interconnect line WL through a contact portion CP extending through the interlayer insulation film 5 to the interconnect line WL.

Figure 2:
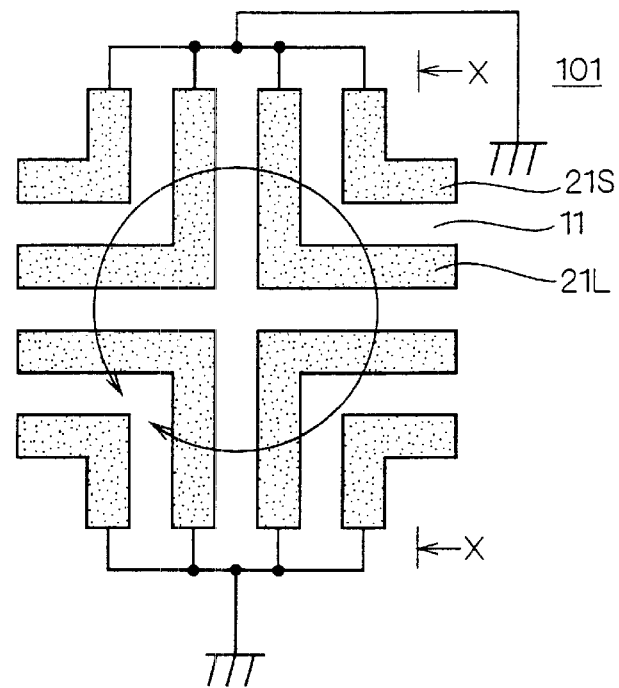
FIG. 2 shows a plan configuration of a PG shield of the semiconductor device according to the first preferred embodiment of the present invention.

FIG. 2 shows a plan configuration of the PG shield 101. As shown in FIG. 2, the SOI regions 21 constituting the PG shield 101 are each substantially L-shaped in plan configuration, and are arranged in a symmetrical pattern.

The plurality of SOI regions 21 are classified into two types having different sizes and geometrically similar form: an SOI region 21L and an SOI region 21S. The SOI region 21S is provided in a region (referred to hereinafter as an inside region) defined by two orthogonal arms of the SOI region 21L and disposed in a similar fashion to the SOI region 21L.

When the pair of SOI regions designated in FIG. 2 by 21L and 21S are defined as a first unit, a second unit is disposed so that the first unit and the second unit are of line-symmetrical configuration, and third and fourth units are disposed so that the first and second units and the third and fourth units are of line-symmetrical configuration. Thus, the PG shield 101 has four SOI regions 21S and four SOI regions 21L.

Since one of the two arms of each of the four SOI regions 21L is opposed to one of the two arms of another, the trench isolation oxide film 11 defined by the four SOI region 21L is of a cross-shaped planar configuration.

The construction of the PG shield 101 of FIG. 1 corresponds to, for example, the cross-section taken along the line X—X of FIG. 2. Each of the SOI regions 21 is electrically connected to a predetermined interconnect line (not shown) through a contact portion (not shown) extending through the interlayer insulation film 4 of FIG. 1 to a corresponding one of the silicide films 31, and is grounded through the interconnect line.

<A-2. Function and Effect>

As described above, the PG shield 101 has a plurality of multi-layer structures each comprising the SOI region 21 and the silicide film 31 and electrically isolated from each other by the trench isolation oxide films 11. The multi-layer structures have a relatively low resistance because of the presence of the silicide films 31 to reduce electrostatically induced power dissipation. Further, the trench isolation oxide films 11 interrupt the path of eddy current to avoid the occurrence of electromagnetically induced power dissipation resulting from the eddy current.

The increase in electrostatically induced power dissipation and in electromagnetically induced power dissipation decreases a Q-factor (energy stored in the inductor which is divided by various types of power dissipation) indicating inductor performance. Therefore, the reduction in electrostatically induced power dissipation and in electromagnetically induced power dissipation contributes to the enhancement of the Q-factor.

The trench isolation oxide films 11 are formed, for example, by simultaneously patterning the SOI layer 3 using a common resist mask in the step of forming the trench isolation oxide films 12 in a device region in which the MOS transistors Q11, Q12 and the like are to be formed. The silicide films 31 are formed simultaneously with the silicide films GS and SS of the MOS transistors Q11 and Q12. Thus, no additional step is required to form the PG shield 101, and the manufacturing method is not complicated.

Further, since the PG shield 101 is formed in the SOI layer 3, no additional conductor layer is required to form the PG shield 101, and the device structure is not complicated.

Although the trench isolation is used to isolate the devices from each other in the above description, other isolation techniques such as LOCOS (Local Oxide of Silicon) isolation and mesa isolation may be, of course, used, even in second to sixteenth preferred embodiment of the present invention to be described later except those intended for solving a dishing problem peculiar to the trench isolation.

<A-3. Modification>

The plan configuration of the PG shield is not limited to that shown in FIG. 2, but may be designed to have a cut away portion to interrupt the path of the eddy current.

FIGS. 3 through 7 show other examples of the plan configuration of the PG shield.

Figure 3:
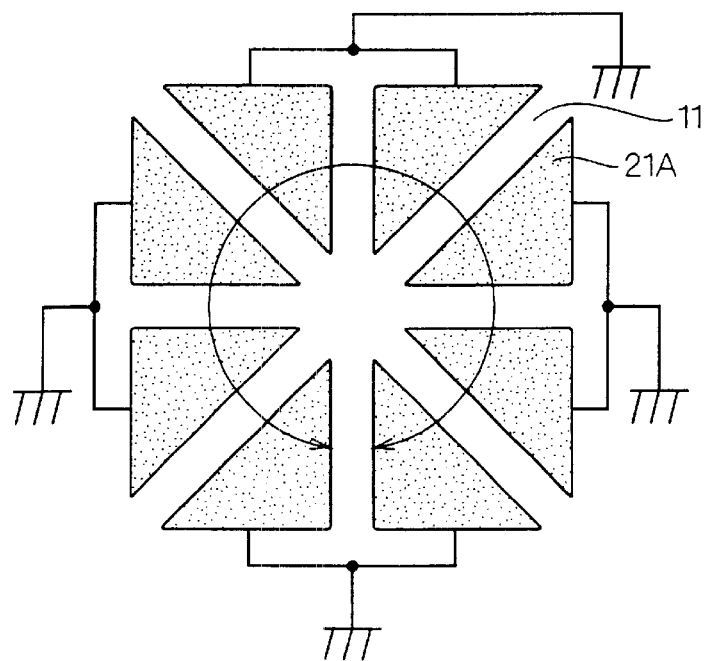
FIGS. 3 through 7 show other plan configurations of the PG shield.

The PG shield shown in FIG. 3 comprises a first unit having a pair of SOI regions 21A of triangular plan configuration disposed with their bases opposed to each other, a second unit disposed so that the first unit and the second unit are of line-symmetrical configuration, and third and fourth units disposed so that the first and second units and the third and fourth units are of line-symmetrical configuration. Thus, the PG shield of FIG. 3 has eight SOI regions 21A. The trench isolation oxide films 11 are disposed between the SOI regions 21A.

Figure 4:
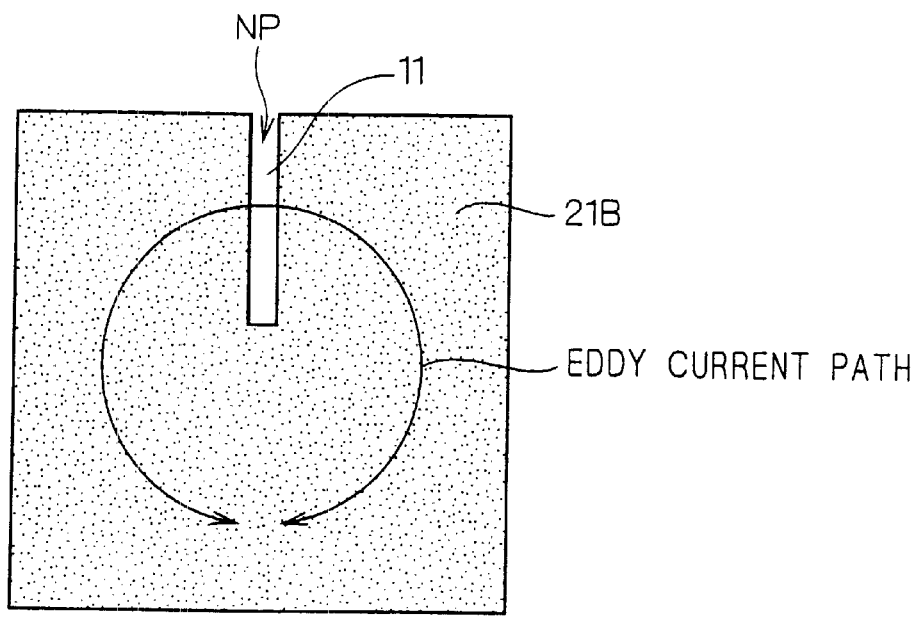

The PG shield shown in FIG. 4 comprises an SOI region 21B of rectangular plan configuration, the SOI region 21B being equal in size to the entire PG shield and having a cut away portion NP extending to the center thereof. The trench isolation oxide film 11 is disposed in the cut away portion NP which interrupts the eddy current.

Figure 5:
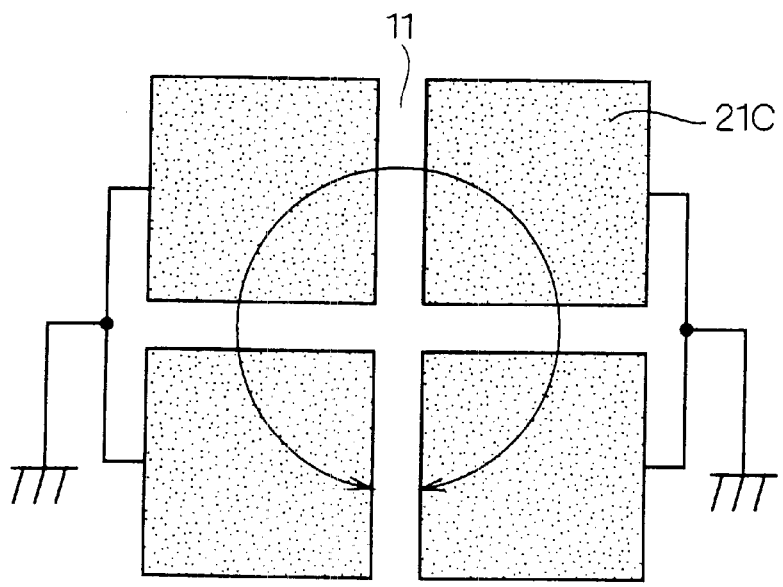

The PG shield shown in FIG. 5 comprises four rectangular SOI regions 21C arranged in a 2×2 matrix. The trench isolation oxide films 11 are disposed between the SOI regions 21C.

Figure 6:
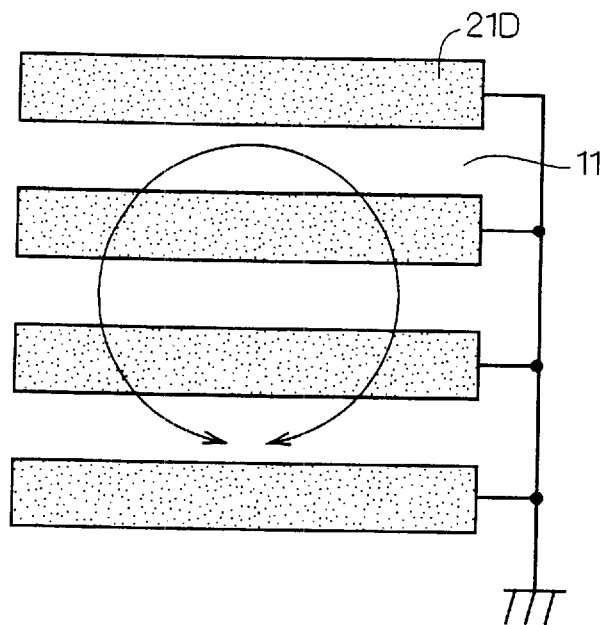

The PG shield shown in FIG. 6 comprises four elongated SOI regions 21D arranged in a column with their longitudinal sides parallel to each other. The trench isolation oxide films 11 are disposed between the SOI regions 21D.

Figure 7:
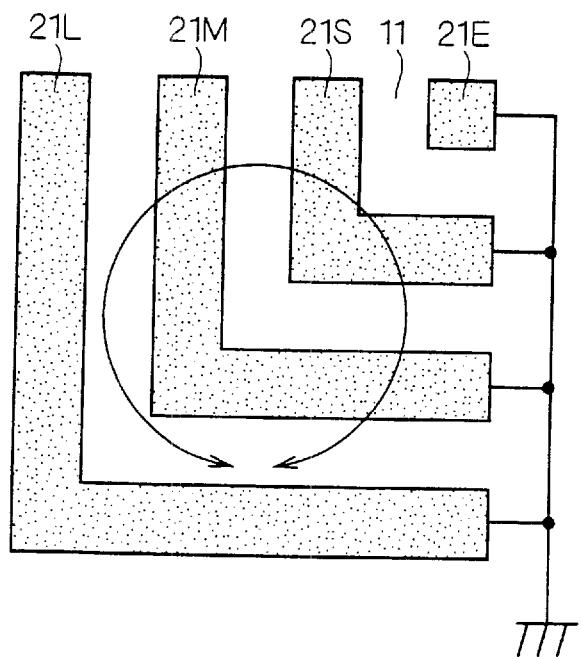

The PG shield shown in FIG. 7 comprises three geometrically similar, L-shaped SOI regions 21L, 21M, 21S of relatively large, medium and small sizes, respectively, and a rectangular SOI region 21E. The SOI region 21M is provided in an inside region defined by two orthogonal arms of the SOI region 21L and disposed in a similar fashion to the SOI region 21L. The SOI region 21S is provided in an inside region defined by two orthogonal arms of the SOI region 21M and disposed in a similar fashion to the SOI region 21M. The SOI region 21E is provided in an inside region defined by two orthogonal arms of the SOI region 21S. The trench isolation oxide films 11 are disposed between the SOI regions 21L, 21M, 21S and 21E.

The plan configurations of the PG shield shown in FIGS. 2–7 are only examples and the present invention is not restricted by the plan configuration of the PG shield. As for the silicide film, $TiSi_2$, $NiSi_2$, $CoSi_2$ and so on can be used. Especially $NiSi_2$ and $CoSi_2$ which include ferromagnetic materials such as Ni, and Co is preferable, because ferromagnetic materials prevent the magnetic force from penetrating the substrate.

<B. Second Preferred Embodiment>
<B-1. Device Construction>

Figure 8:
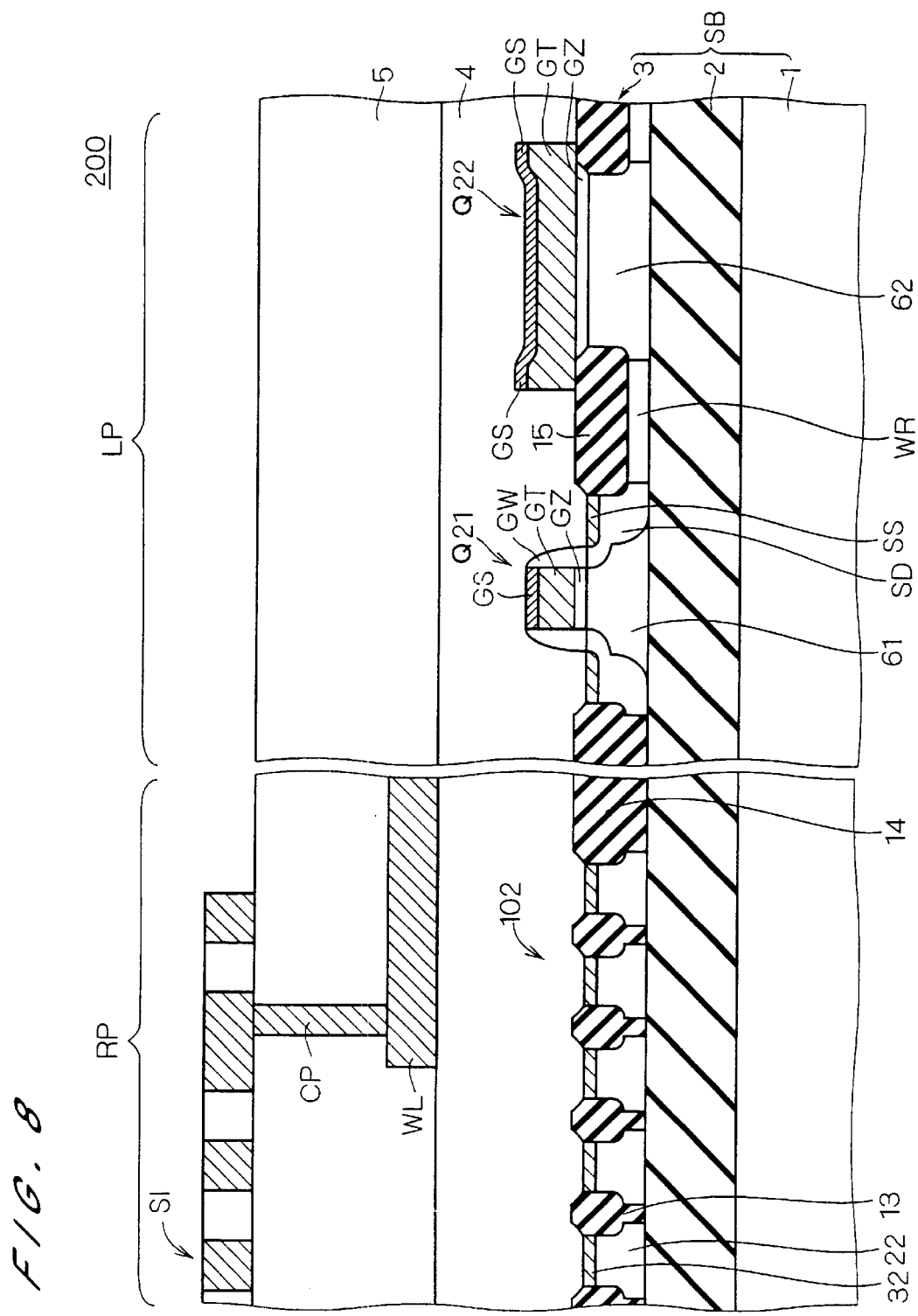
FIG. 8 is a cross-sectional view showing a construction of the semiconductor device according to a second preferred embodiment of the present invention.

FIG. 8 shows a construction of a semiconductor device 200 according to a second preferred embodiment of the present invention.

The semiconductor device 200 comprises the RF circuit portion RP and a logic portion LP, as shown in FIG. 8, which correspond to parts of the RF circuit portion 91 and the logic portion 92 of, by way of example, the semiconductor device 90 illustrated with reference to FIG. 68.

Referring to FIG. 8, the RF circuit portion RP and the logic portion LP are disposed on the SOI substrate SB including the silicon substrate 1, the buried oxide film 2 disposed on the silicon substrate 1, and the SOI layer 3 disposed on the buried oxide film 2.

In the RF circuit portion RP, a region in the SOI layer 3 corresponding to the region in which the spiral inductor SI (whose plan configuration is shown in FIG. 70) is provided is divided into a plurality of SOI regions 22 by a plurality of trench isolation oxide films 13. The trench isolation oxide films 13 are formed by filling trenches extending from the surface of the SOI layer 3 to the surface of the buried oxide film 2 with a silicon oxide film, and completely electrically isolate the SOI regions 22 from each other.

A silicide film 32 is disposed on each of the SOI regions 22. The plurality of trench isolation oxide films 13, the SOI regions 22 and the silicide films 32 constitute a PG shield 102 (shield layer).

Each of the trench isolation oxide films 13 includes a first portion having a first width and extending substantially perpendicularly to the surface of the buried oxide film 2, and a second portion continuous with the first portion and having a second width less than the first width, the second portion extending substantially perpendicularly to the surface of the buried oxide film 2.

The plan configuration of the PG shield 102 may be, for example, the configuration illustrated with reference to FIG. 2 or any one of the configurations illustrated with reference to FIGS. 3 through 7.

A trench isolation oxide film 14 electrically isolates the RF circuit portion RP and the logic portion LP from each other. In the logic portion LP, the SOI layer 3 is divided into SOI regions 61 and 62 by a trench isolation oxide film 15.

An isolation oxide film, such as the trench isolation oxide films 15, which does not completely electrically isolate the SOI regions because of the presence of the SOI layer 3 as a well region WR beneath the same is referred to as a partial isolation oxide film.

<B-1-1. Partial Isolation Oxide Film>

The partial isolation oxide film will be discussed briefly. In principle, latch-up does not occur between a MOS transistor completely electrically isolated from other devices by the complete isolation oxide film and other MOS transistors.

Thus, the use of the complete isolation oxide film in the manufacture of an SOI device having a CMOS transistor is advantageous in that a minimum isolation width determined by micro-lithography may be used to reduce the area of a chip. The use of the complete isolation oxide film, however, presents drawbacks affected by a so-called floating-substrate effect, such as a current-voltage characteristic kink effect caused by carriers (holes for an NMOS transistor) generated by impact ionization and stored in a channel region (body region), the degradation in operation breakdown voltage, and the frequency-dependence of delay time due to the unstabilized electric potential of the channel region.

Such variations in potential of the channel region are specifically disclosed in IEEE TRANSACTIONS ON ELECTRON DEVICES, VOL. 45, NO. 7, July 1, 1998, pp. 1479–1484, "Analysis of Delay Time Instability According to the Operating Frequency in Field Shield Isolated SOI Circuits" S. Maeda et al. (Reference 1). A transient variation in the potential of the body region accordingly causes a transient variation in transistor characteristics to result in instability of circuit operation (See FIG. 7 of Reference 1). The entire disclosure of Reference 1 is herein incorporated by reference.

It is also verified that the frequency-dependence appears in the delay time as shown in FIG. 5 of Reference 1.

To solve these problems, the partial isolation oxide film known also as a partial trench isolation has been devised. In the construction of FIG. 8 as an example, carriers can move through the well region WR beneath the trench isolation oxide film 15 and therefore are prevented from being stored in the channel region. Further, the potential of the channel region can be fixed through the well region WR. Therefore, various problems resulting from the floating-substrate effect do not arise.

The construction in which the partial isolation oxide film and the complete isolation oxide film are used in combination is shown in FIG. 8. An example of the use of the partial and complete isolation oxide films in combination and the manufacturing method thereof are disclosed in FIGS. 4 through 7 and FIGS. 8 through 27 of Japanese Patent Application No. 11-177091 (1999). The entire disclosure of Japanese Patent Application No. 11-177091 (U.S. patent application Ser. No. 09/466,934 filed on Dec. 20, 1999) is herein incorporated by reference.

For the use of the partial and complete isolation oxide films in combination, a combination isolation oxide film is sometimes used which has the configuration of the complete isolation oxide film on one side thereof and the configuration of the partial isolation oxide film on the other side. The construction of the combination isolation oxide film and the manufacturing method thereof are disclosed in FIGS. 1 through 38 of Japanese Patent Application No. 2000-39484. The entire disclosure of Japanese Patent Application No. 2000-39484 (U.S. patent application Ser. No. 09/639,953 filed on Aug. 17, 2000) is herein incorporated by reference.

The cross-sectional configuration of the partial isolation oxide film is disclosed in a SEM photograph of FIG. 2 of IEEE International SOI Conference, October 1999, pp. 131–132, "Bulk-Layout-Compatible 0.18 $\mu$m SOI-CMOS Technology Using Body-Fixed Partial Trench Isolation (PIT)" Y. Hirano et al. (Reference 2). The entire disclosure of Reference 2 is herein incorporated by reference.

Referring again to FIG. 8, MOS transistors Q21 and Q22 are formed in the SOI regions 61 and 62, respectively, in the logic portion LP of FIG. 8.

The MOS transistors Q21 and Q22 are common MOS transistors and similar in basic constituents to the MOS transistors Q11 and Q12 shown in FIG. 1. The constituents of the MOS transistors Q21 and Q22 similar to those of the MOS transistors Q11 and Q12 are designated by the same reference characters, and are not particularly described.

The constituents of the semiconductor device 200 similar to those of the semiconductor device 100 of FIG. 1 are designated by the same reference characters, and are not particularly described.

<B-2. Manufacturing Method>

Figure 9:
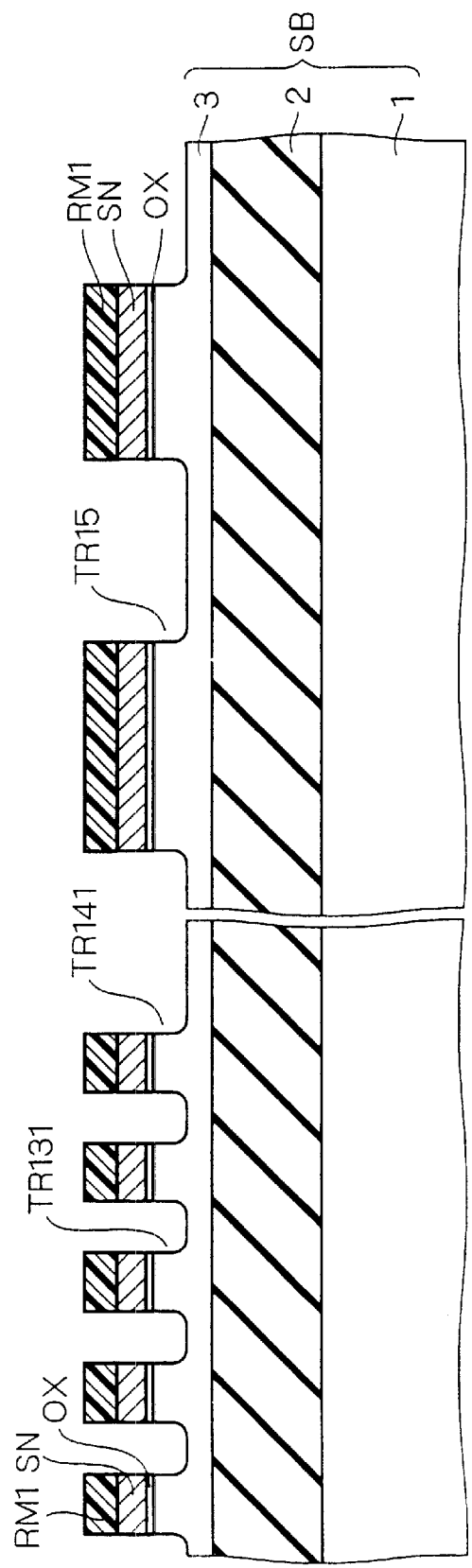
FIGS. 9 through 11 are cross-sectional views showing manufacturing steps of the semiconductor device according to the second preferred embodiment of the present invention.

A method of manufacturing the semiconductor device 200 will be described with reference to FIGS. 9 through 11 which illustrate manufacturing steps in order.

First, the SOI substrate SB is prepared. In the step shown in FIG. 9, a silicon oxide film OX having a thickness of about 20 nm is formed on the SOI layer 3, and a silicon nitride film SN having a thickness of about 200 nm is formed on the silicon oxide film OX. Thereafter, a patterned resist mask RM1 is used to etch a multi-layer film comprised of the silicon oxide film OX, the silicon nitride film SN and the SOI layer 3 so as to leave a lower part of the SOI layer 3, thereby forming trenches TR131, TR141 and TR15 in regions where the respective trench isolation oxide films 13, 14 and 15 are to be formed.

Figure 10:
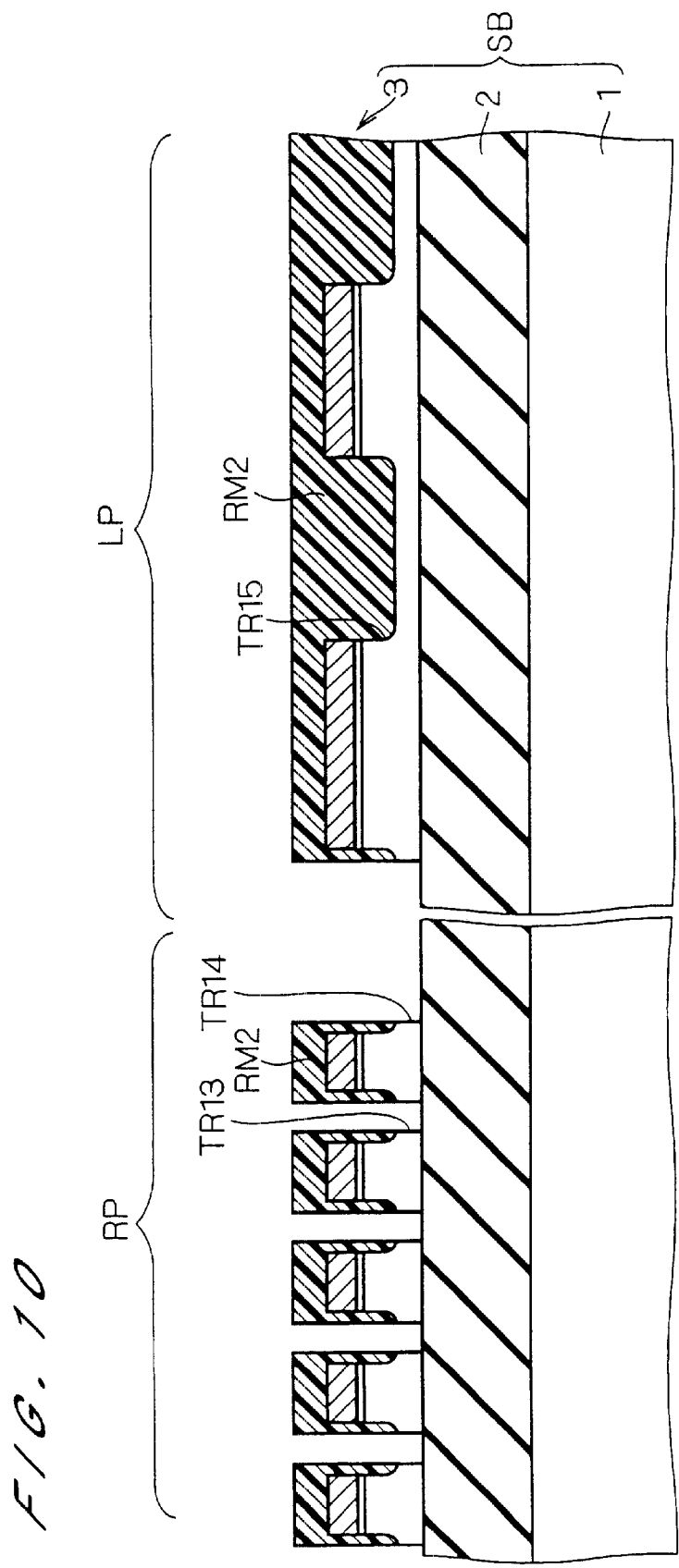
Figure 11:
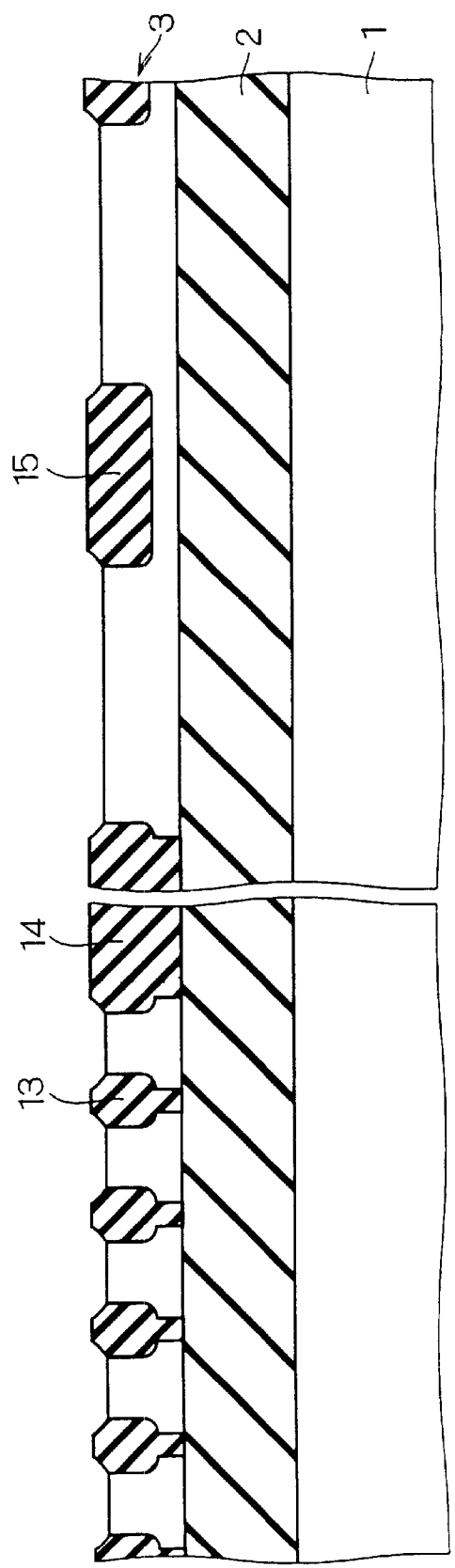

Next, in the step shown in FIG. 10, a resist mask RM2 which partially covers the trenches TR131 and TR141 and fully covers the trench TR15 is used to further etch parts of the trenches TR131 and TR141 which are not covered with the resist mask RM2, thereby forming trenches TR13 and TR14 extending through the SOI layer 3.

After the resist mask RM2 is removed, a silicon oxide film having a thickness of about 500 mn is formed on the entire top surface of a resultant structure to fill the trenches TR13, TR14 and TR15. A CMP (Chemical Mechanical Polishing) process is performed until the silicon nitride film SN is partway polished away. Then, the silicon nitride film SN and the silicon oxide film OX are removed. This provides the trench isolation oxide films 13 to 15, as shown in FIG. 11.

Thereafter, the existing steps of manufacturing a MOS transistor (including the existing salicide step), manufacturing an interlayer insulation film, manufacturing an interconnect layer, and manufacturing a spiral inductor are performed to provide the semiconductor device 200.

<B-3. Function and Effect>

As described above, the PG shield 102 has a plurality of multi-layer structures each comprising the SOI region 22 and the silicide film 32 and electrically isolated from each other by the trench isolation oxide films 13. The multi-layer structures have a relatively low resistance because of the presence of the silicide films 32 to reduce the electrostatically induced power dissipation. Further, the trench isolation oxide films 13 interrupt the path of the eddy current to avoid the occurrence of the electromagnetically induced power dissipation resulting from the eddy current.

The trench isolation oxide films 13 are formed using the common resist masks RM1 and RM2 in the steps of forming the trench isolation oxide film 14 at the boundary between the logic portion LP and the RF circuit portion RP and the trench isolation oxide film 15 for isolation between the MOS transistors Q21 and Q22 in the logic portion LP. The salicide films 32 are formed simultaneously with the salicide films GS and SS of the MOS transistors Q21 and Q22. Thus, no additional step is required to form the PG shield 102, and the manufacturing method is not complicated.

Another feature of this manufacturing method is that the upper edges of the trench isolation oxide films 13 have the same configuration as those of the trench isolation oxide films 14 and 15.

Further, since the PG shield 102 is formed in the SOI layer 3, no additional conductor layer is required to form the PG shield 102, and the device structure is not complicated.

Moreover, since the trench isolation oxide film 15 which is the partial isolation oxide film isolates the devices from each other in the logic portion LP, the potential of the channel region (body region) is fixed through the well region WR beneath the trench isolation oxide film 15. This prevents various problems resulting from the floating-substrate effect.

<B-4. Modification>

In the PG shield 102, the trench isolation oxide films 13 are shown as formed using the common resist masks RM1 and RM2 in the steps of forming the trench isolation oxide films 14 and 15. However, if slight complexity of the manufacturing steps is permitted, the trench isolation oxide films 13 may be of a simple cross-sectional configuration such as that of the trench isolation oxide films 11 of the semiconductor device 100 described with reference to FIG. 1.

<C. Third Preferred Embodiment>
<C-1. Device Construction>

Figure 12:
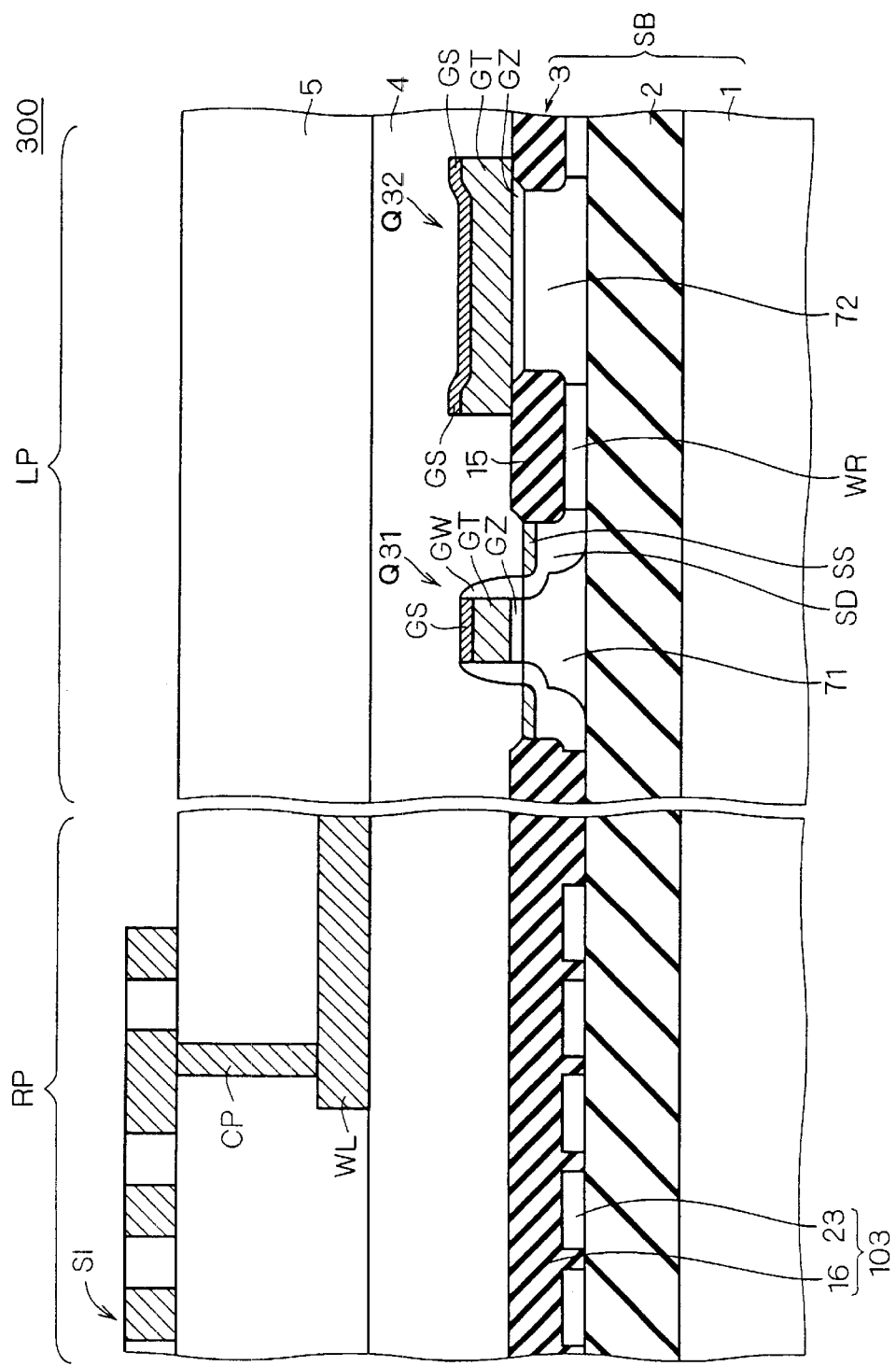
FIGS. 12 and 13 are cross-sectional views showing constructions of the semiconductor device according to a third preferred embodiment of the present invention.

FIG. 12 shows a construction of a semiconductor device 300 according to a third preferred embodiment of the present invention.

The semiconductor device 300 of FIG. 12 is similar to the semiconductor device 200 of FIG. 8 in comprising the RF circuit portion RP and the logic portion LP disposed on the SOI substrate SB.

In the RF circuit portion RP, a plurality of independent SOI regions 23 are formed on the buried oxide film 2 in corresponding relation to the region in which the spiral inductor SI (whose plan configuration is shown in FIG. 70) is provided, to constitute a PG shield 103 (shield layer). The PG shield 103 is entirely covered with a trench isolation oxide film 16.

The plan configuration of the PG shield 103 may be, for example, the configuration illustrated with reference to FIG. 2 or any one of the configurations illustrated with reference to FIGS. 3 through 7.

In the logic portion LP, the SOI layer 3 is divided into SOI regions 71 and 72 by the trench isolation oxide film 15 which is the partial isolation oxide film. MOS transistors Q31 and Q32 are formed in the SOI regions 71 and 72, respectively.

The MOS transistors Q31 and Q32 are common MOS transistors and similar in basic constituents to the MOS transistors Q11 and Q12 shown in FIG. 1. The constituents of the MOS transistors Q31 and Q32 similar to those of the MOS transistors Q11 and Q12 are designated by the same reference characters, and are not particularly described.

The constituents of the semiconductor device 300 similar to those of the semiconductor device 100 of FIG. 1 are designated by the same reference characters, and are not particularly described.

The SOI regions 23 are described with reference to FIG. 10 which illustrates the method of manufacturing the semiconductor device 200. In the RF circuit portion RP, part of the trench TR141 which is not covered with the resist mask RM2 is further etched to form the trench TR14 extending through the SOI layer 3. After the resist mask RM2 is removed, the silicon oxide film OX and the silicon nitride film SN are completely removed, and the SOI layer 3 is partially removed. This provides the SOI regions 23. In the above step, the silicon oxide film OX and the silicon nitride film SN in the logic portion LP are covered with a resist mask so as not to be removed.

After the SOI regions 23 are formed, the resist mask in the logic portion LP is removed, and a silicon oxide film is formed on the entire top surface of a resultant structure to fill the trench TR15 and trenches resulting from the formation of the SOI regions 23. A CMP process is performed until the silicon nitride film SN remaining in the logic portion LP is partway polished away. Then, the silicon nitride film SN and the silicon oxide film OX are removed. This provides the trench isolation oxide films 16 and 15.

The SOI regions 23 correspond to a base portion of the body region, and are equal in thickness to the well region WR beneath the trench isolation oxide film 15.

<C-2. Function and Effect>

As described above, the PG shield 103 comprises the plurality of independent SOI regions 23 covered with the trench isolation oxide film 16, to reduce the electrostatically induced power dissipation. Further, the trench isolation oxide film 16 interrupts the path of the eddy current to avoid the occurrence of the electromagnetically induced power dissipation resulting from the eddy current.

Further, since the PG shield 103 is formed by dividing the SOI layer 3, no additional conductor layer is required to form the PG shield 103, and the device structure is not complicated.

Moreover, since the trench isolation oxide film 15 which is the partial isolation oxide film isolates the devices from each other in the logic portion LP, the potential of the channel region (body region) is fixed through the well region WR beneath the trench isolation oxide film 15. This prevents various problems resulting from the floating-substrate effect.

<C-3. First Modification>

Figure 13:
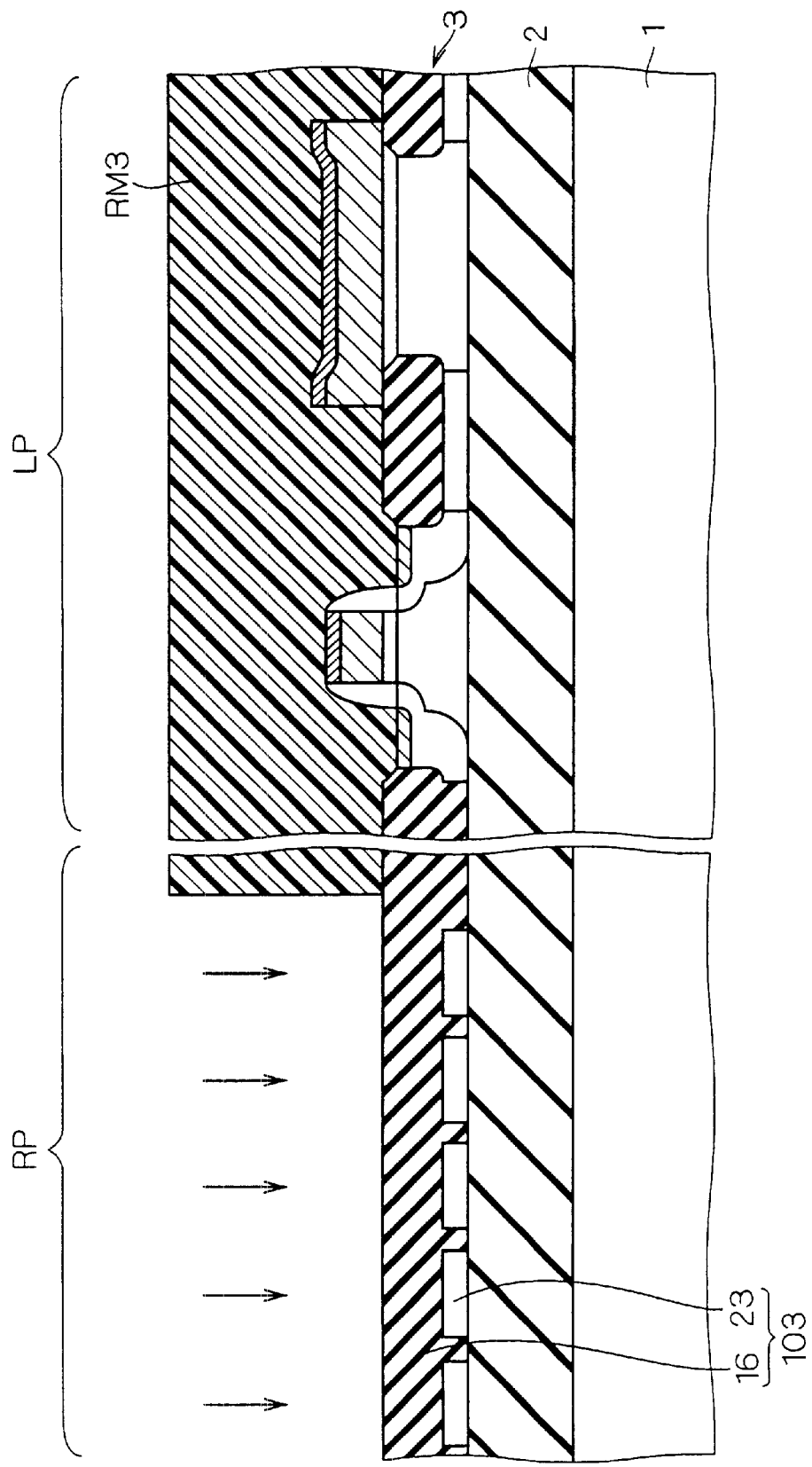

The above discussed PG shield 103 comprises the plurality of independent SOI regions 23. This uses the SOI regions 23 as a conductor since the SOI layer 3 subjected to a well implantation (or referred to as a channel implantation) process has a resistance lower than that of the silicon substrate 1. To further lower the resistance, the SOI regions 23 may be implanted with an impurity of a relatively high concentration. FIG. 13 shows an example of such an implantation step.

As illustrated in FIG. 13, the SOI substrate SB is prepared, with the elements previous to and including at least the trench isolation oxide film 16 formed (with the MOS transistors Q31 and Q32 formed in the illustration of FIG. 13). A resist mask RM3 is formed on the logic portion LP and part of the RF circuit portion RP which is not to be subjected to impurity implantation, and an impurity is implanted through the trench isolation oxide film 16 by an ion implantation process at a dose of $1\times10^{14}$ to $1\times10^{16}/cm^2$.

The impurity implantation is not limited to the above-mentioned process. For example, the impurity implantation may be performed after the formation of the PG shield 103 and before the formation of the trench isolation oxide film 16. Otherwise, the impurity implantation may be performed, with the SOI regions 23 exposed by the removal of part of the trench isolation oxide film 16 which overlies the PG shield 103.

<C-4. Second Modification>

Figure 14:
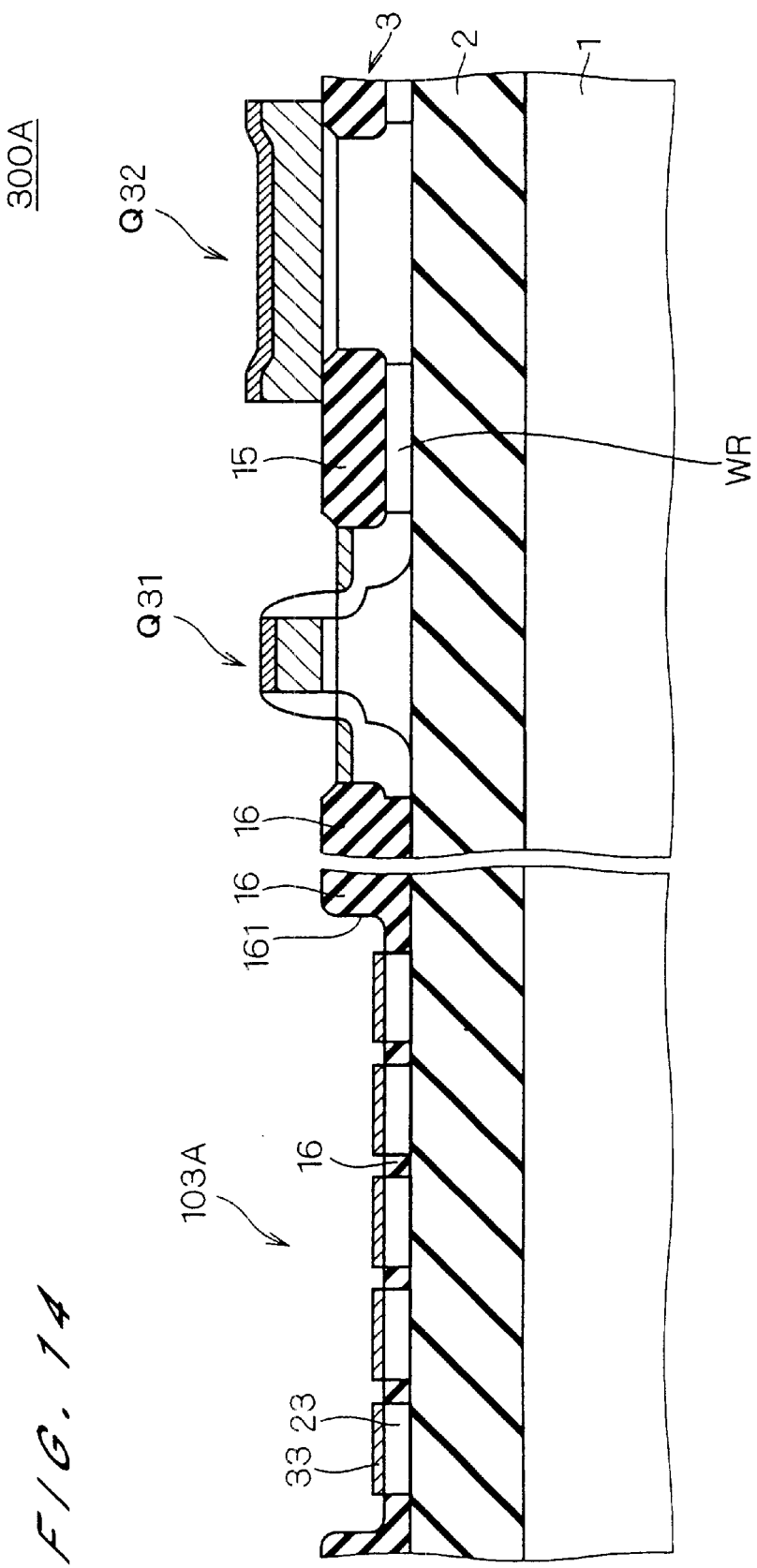
FIG. 14 is a cross-sectional view showing a construction of a modification of the semiconductor device according to the third preferred embodiment of the present invention.

With reference to FIG. 14, a PG shield 103A (shield layer) as in a semiconductor device 300A may be used which comprises a silicide film 33 formed on each of the SOI regions 23.

The PG shield 103A is manufactured by a method to be described below. After the PG shield 103 shown in FIG. 12 is formed, the PG shield 103 is once covered with the trench isolation oxide film 16. Then, part of the trench isolation oxide film 16 which overlies the PG shield 103 is removed to form an opening 161, thereby exposing the SOI regions 23. In the subsequent salicide step for the formation of the MOS transistors Q31 and Q32 in the logic portion LP, the silicide films 33 are formed on the exposed SOI regions 23, respectively, at the same time. The opening 161 of the trench isolation oxide film 16 is filled with an interlayer insulation film later.

The PG shield 103A which comprises the silicide films 33 on the respective SOI regions 23 has a resistance lower than that of the PG shield 103 to enhance the effect of preventing the electrostatically induced power dissipation.

<D. Fourth Preferred Embodiment>

<D-1. Device Construction>

Figure 15:
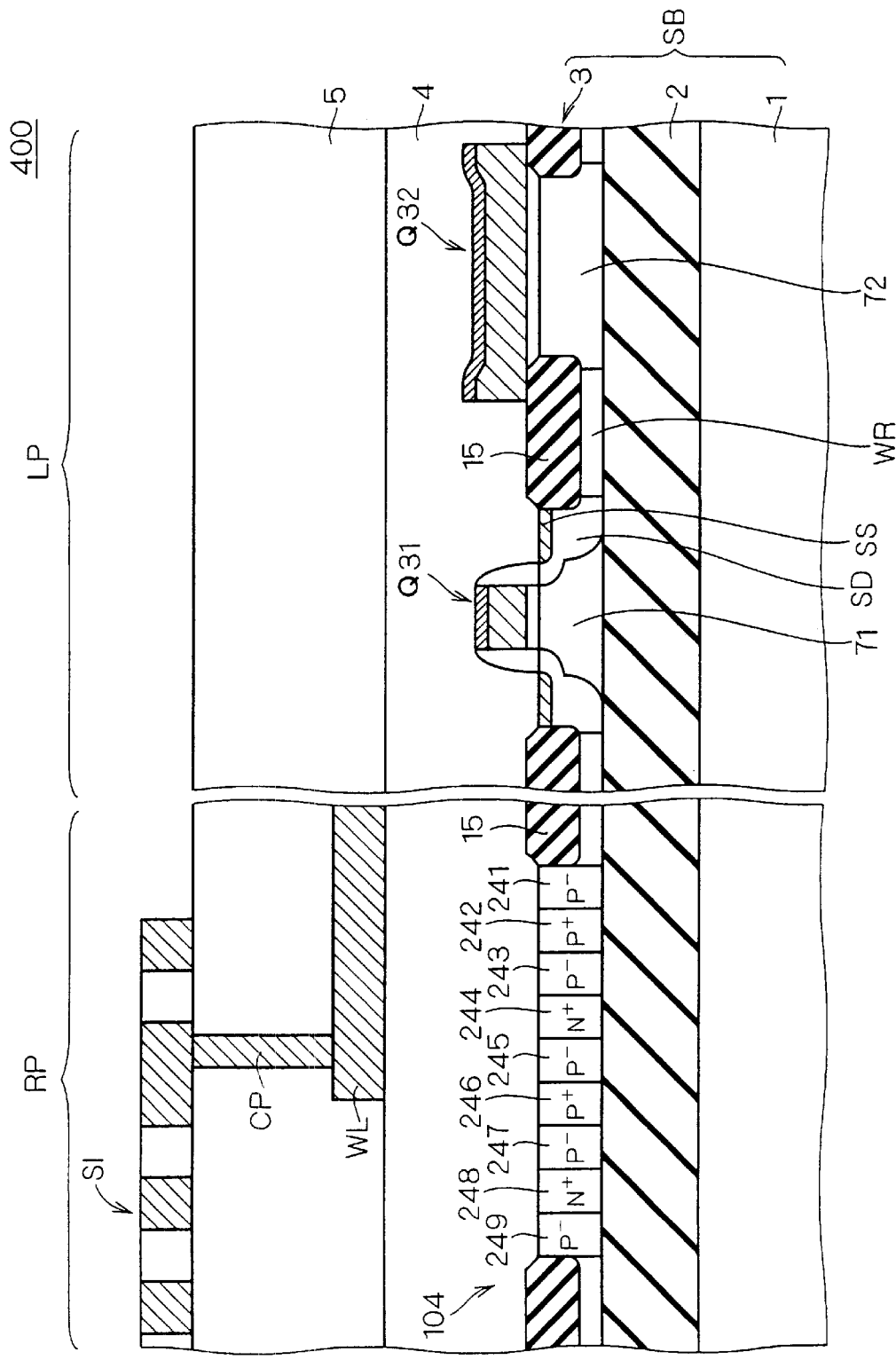
FIG. 15 is a cross-sectional view showing a construction of the semiconductor device according to a fourth preferred embodiment of the present invention.

FIG. 15 shows a construction of a semiconductor device 400 according to a fourth preferred embodiment of the present invention.

The semiconductor device 400 of FIG. 15 is similar to the semiconductor device 300 of FIG. 12 in comprising the RF circuit portion RP and the logic portion LP disposed on the SOI substrate SB.

In the RF circuit portion RP, a PG shield 104 (shield layer) comprising SOI regions 241 to 249 in intimately contacting relationship is formed in the SOI layer 3 in corresponding relation to the region in which the spiral inductor SI (whose plan configuration is shown in FIG. 70) is provided.

A trench isolation oxide film 15 which is the partial isolation oxide film is disposed between the RF circuit portion RP and the logic portion LP. In the logic portion LP, the SOI layer 3 is divided into the SOI regions 71 and 72 by another trench isolation oxide film 15. The MOS transistors Q31 and Q32 are formed in the SOI regions 71 and 72, respectively.

The constituents of the semiconductor device 400 similar to those of the semiconductor device 300 of FIG. 12 are designated by the same reference characters, and are not particularly described.

Adjacent ones of the SOI regions 241 to 249 constituting the PG shield 104 are different in impurity concentration or impurity conductivity type so that PN junctions interrupt the eddy current.

The SOI regions 241 to 249 shown in FIG. 15 are as follows: a P$^-$ region (containing a P type impurity of a low concentration), a P$^+$ region (containing a P type impurity of a high concentration), a P$^-$ region, an N$^+$ region (containing an N type impurity of a high concentration), a P$^-$ region, a P$^+$ region, a P$^-$ region, an N$^+$ region and a P$^-$ region, respectively.

Figure 16:
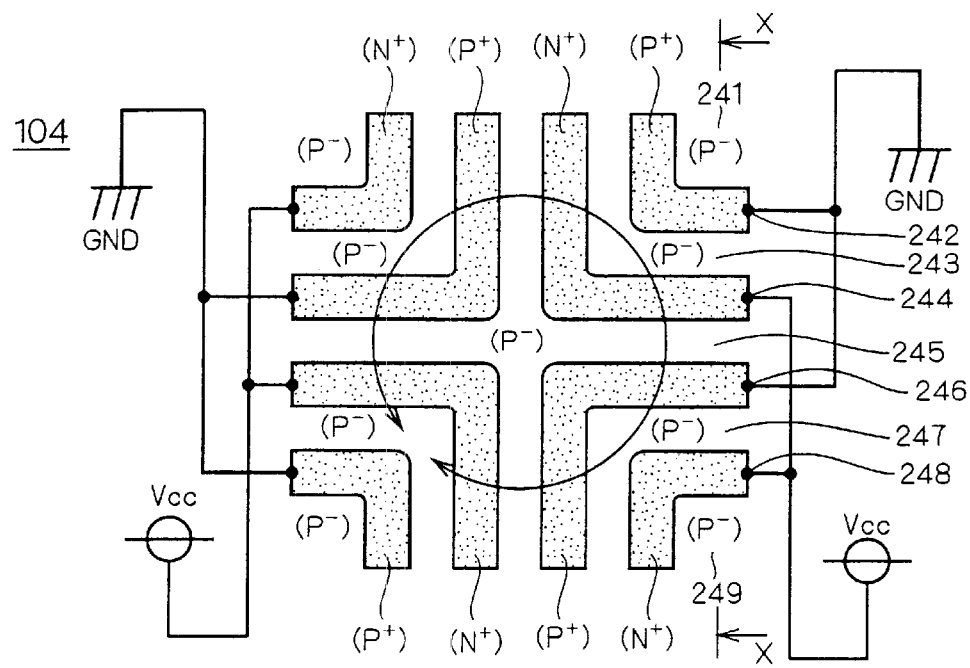
FIG. 16 shows a plan configuration of the PG shield of the semiconductor device according to the fourth preferred embodiment of the present invention.

FIG. 16 shows a plan configuration of the PG shield 104. The plan configuration of the PG shield 104 is similar to that of the PG shield 101 described with reference to FIG. 2, and is not particularly described. The PG shield 104 significantly differs from the PG shield 101 in that SOI regions are substituted for the trench isolation oxide films 11 of the PG shield 101 and in that the silicide films 31 are not provided. A cross-section taken along the line X—X of FIG. 16 corresponds to the cross-section of the PG shield 104 shown in FIG. 15.

Unlike the PG shield 101 in which all of the SOI regions are grounded, the PG shield 104 is designed such that some of the SOI regions are connected to a power supply potential (Vcc) for the purpose of applying a reverse bias to diodes formed by the PN junctions to interrupt the eddy current.

As shown in FIG. 16, for example, the SOI regions 242 and 246 are connected to the ground potential, and the SOI regions 244 and 248 are connected to the power supply potential. The SOI regions 241, 243, 245, 247 and 249 are grounded through their adjacent P$^+$ regions. The SOI regions 244 and 248 are connected to the power supply potential in the above description. Although containing the constituents connected to the power supply potential in this manner, the PG shield (perforated ground shield) shall be so called for the sake of expediency, even in other preferred embodiments of the present invention to be described later.

<D-2. Function and Effect>

The above described connections cause a reverse bias to be applied to the diodes formed by the SOI regions 242, 243, 244, the SOI regions 244, 245, 246, and the SOI regions 246, 247, 248, to prevent the diodes from being forward-biased by a counter electromotive force which generates the eddy current. This reduces the electrostatically induced power dissipation without the occurrence of the electromagnetically induced power dissipation resulting from the eddy current.

The PG shield 104 in which electrostatically induced current flows through the grounded P$^+$ regions (low-resistance regions) can, of course, reduce the electrostatically induced power dissipation. Further, since the PG shield 104 is formed in the SOI layer 3, no additional conductor layer is required to form the PG shield 104, and the device structure is not complicated.

Moreover, since the trench isolation oxide film 15 which is the partial isolation oxide film isolates the devices from each other in the logic portion LP, the potential of the channel region (body region) is fixed through the well region WR beneath the trench isolation oxide film 15. This prevents various problems resulting from the floating-substrate effect.

<D-3. First Modification>

Although the plan configuration of the PG shield 104 is similar to that of the PG shield 101 described with reference to FIG. 2 in the above description, any one of the configurations described with reference to FIGS. 3 through 7 may be employed, in which case the SOI regions are differently implanted with impurities.

In the configuration shown in FIG. 3, for example, assuming that the SOI region 21A at the uppermost right-hand position of FIG. 3 is a P$^+$ region, a region between the P$^+$ region and its adjacent SOI region 21A as viewed in the clockwise direction (a region shown as the trench isolation oxide film 11 in FIG. 3) is a P$^-$ region. The P$^-$ region is followed by an N$^+$ region, a P$^-$ region, a P$^+$ region and a P$^-$ region in the order named as viewed in the clockwise direction. The N$^+$ region is connected to the power supply potential and the P$^+$ region is grounded, whereby the diodes are reverse-biased.

In the configuration shown in FIG. 5, for example, assuming that the SOI region 21C at the uppermost right-hand position of FIG. 5 is a P$^+$ region, a region between the P$^+$ region and its adjacent SOI region 21C as viewed in the clockwise direction is a P$^-$ region. The P$^-$ region is followed by an N$^+$ region, a P$^-$ region, a P$^+$ region and a P$^-$ region in the order named as viewed in the clockwise direction. The N$^+$ region is connected to the power supply potential and the P$^+$ region is grounded, whereby the diodes are reverse-biased.

In the configuration shown in FIG. 6, for example, assuming that the SOI region 21D at the uppermost position is a P$^+$ region, a region between the P$^+$ region and its immediately underlying SOI region 21D is a P$^-$ region. The P$^-$ region is followed by an N$^+$ region, a P$^-$ region, a P$^+$ region and a P$^-$ region in the order named. The N$^+$ region is connected to the power supply potential and the P$^+$ region is grounded, whereby the diodes are reverse-biased.

In the configuration shown in FIG. 7, for example, assuming that the SOI region 21E is a P$^+$ region, a region between the P$^+$ region and the SOI region 21S is a P$^-$ region. The SOI region 21S is an N$^+$ region; a region between the SOI regions 21S and 21M is a P$^-$ region; the SOI region 21M is a P$^+$ region; a region between the SOI regions 21M and 21L is a P$^-$ region; and the SOI region 21L is an N$^+$ region. The N$^+$ regions are connected to the power supply potential and the P$^+$ region is grounded, whereby the diodes are reverse-biased.

The plan configurations of the PG shield shown in FIGS. 2–7 are only examples and the present invention is not restricted by the plan configuration of the PG shield.

<D-4. Second Modification>

In the PG shield 104 shown in FIG. 15, the SOI regions on the opposite (right and left) sides of a lightly doped region (P$^-$ region) are the P$^+$ and N$^+$ regions. Instead, the SOI regions on the opposite sides of the lightly doped region may be of the same conductivity type.

Figure 17:
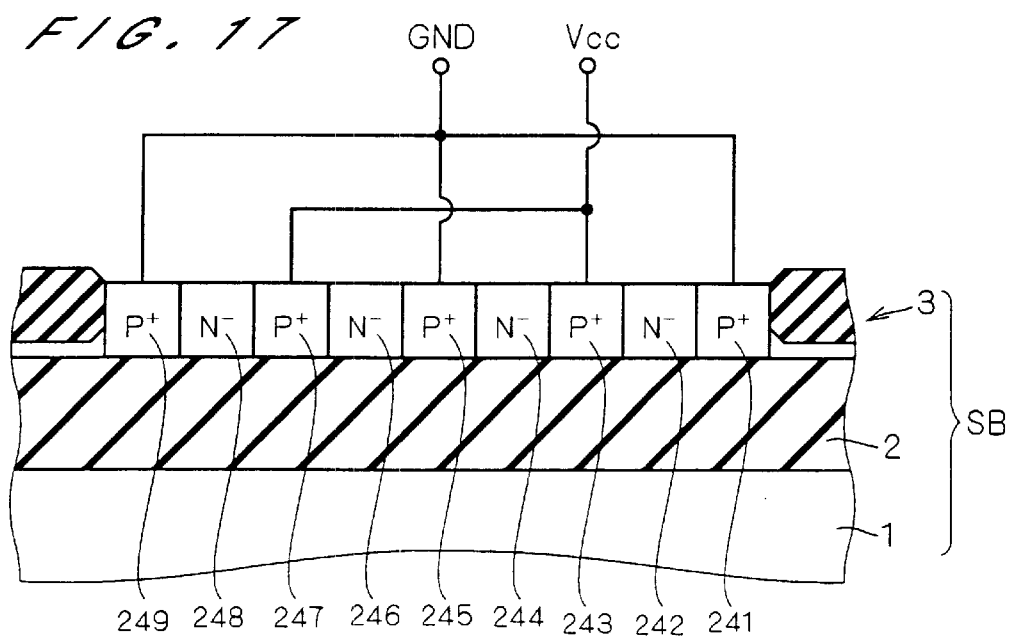
FIG. 17 is a cross-sectional view showing a construction of a modification of the semiconductor device according to the fourth preferred embodiment of the present invention.

More specifically, as shown in FIG. 17 which partially illustrates the PG shield 104, the SOI regions 242, 244, 246 and 248 may be N$^-$ regions, and the remaining SOI regions be P$^+$ regions.

The SOI regions 243 and 247 are connected to the power supply potential, and the SOI regions 241, 245 and 249 are grounded. This applies a reverse bias to a diode formed by the SOI regions 241 and 242, a diode formed by the SOI regions 248 and 249, a diode formed by the SOI regions 245 and 246, and a diode formed by the SOI regions 244 and 245, to prevent the diodes from being forward-biased by a counter electromotive force which generates the eddy current. This reduces the electrostatically induced power dissipation without the occurrence of the electromagnetically induced power dissipation resulting from the eddy current.

This modification requires only two types of SOI regions to reduce the number of times of alignment of the implantation masks in the implantation step and accordingly reduce the margin required for the alignment of the masks, thereby making the pattern of the SOI regions more microscopic.

Although the two types of SOI regions are $N^-$ and $P^+$ regions in the above description, $P^-$ and $N^+$ regions may be, of course, used instead.

<E. Fifth Preferred Embodiment>
<E-1. Device Construction>

Figure 18:
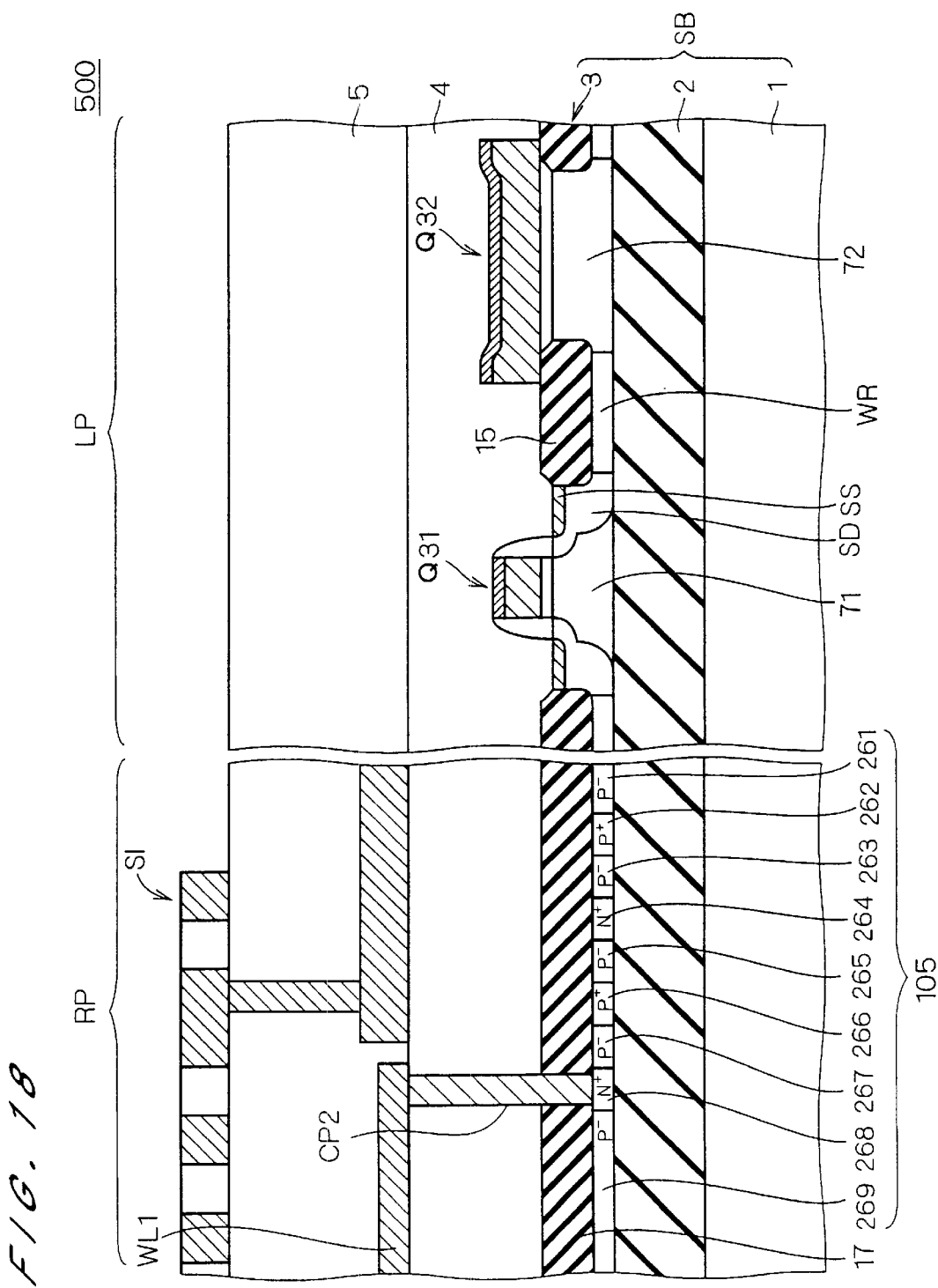
FIG. 18 is a cross-sectional view showing a construction of the semiconductor device according to a fifth preferred embodiment of the present invention.

FIG. 18 shows a construction of a semiconductor device 500 according to a fifth preferred embodiment of the present invention.

The semiconductor device 500 of FIG. 18 is similar to the semiconductor device 300 of FIG. 12 in comprising the RF circuit portion RP and the logic portion LP disposed on the SOI substrate SB.

In the RF circuit portion RP, a PG shield 105 (shield layer) comprising SOI regions 261 to 269 in intimately contacting relationship is formed in the SOI layer 3 in corresponding relation to the region in which the spiral inductor SI (whose plan configuration is shown in FIG. 70) is provided. The top surface of the PG shield 105 is covered with a trench isolation oxide film 17 which is the partial isolation oxide film.

The trench isolation oxide film 17 extends to the logic portion LP. In the logic portion LP, the SOI layer 3 is divided into the SOI regions 71 and 72 by the trench isolation oxide film 15. The MOS transistors Q31 and Q32 are formed in the SOI regions 71 and 72, respectively.

The constituents of the semiconductor device 500 similar to those of the semiconductor device 300 of FIG. 12 are designated by the same reference characters, and are not particularly described.

Adjacent ones of the SOI regions 261 to 269 constituting the PG shield 105 are different in impurity concentration or impurity conductivity type so that PN junctions interrupt the eddy current.

The SOI regions 261 to 269 shown in FIG. 18 are as follows: a $P^-$ region, a $P^-$ an $N^+$ region and a $P^-$ region, respectively. The SOI regions 261 to 269 of the PG shield 105 are similar in plan configuration, in connections to the power supply potential and the ground potential, and in operation to the SOI regions of the PG shield 104 described with reference to FIG. 15.

The connections to the power supply potential and the ground potential may be established, for example as shown in FIG. 18, such that a contact portion CP2 extending through the interlayer insulation film 4 and the trench isolation oxide film 17 to the SOI region 268 ($N^+$ region) is formed and connected to an interconnect line WL1 connected to the power supply potential or the ground potential.

<E-2. Function and Effect>

In the above described semiconductor device 500, as in the semiconductor device 400 described with reference to FIG. 15, the PG shield 105 interrupts the eddy current to avoid the occurrence of the electromagnetically induced power dissipation resulting from the eddy current.

The PG shield 105 in which electrostatically induced current flows through the grounded $P^+$ regions (low-resistance regions) can, of course, reduce the electrostatically induced power dissipation. Further, since the PG shield 105 is formed in the SO1 layer 3, no additional conductor layer is required to form the PG shield 105, and the device structure is not complicated.

The trench isolation oxide film 17 may be formed in the step of forming the trench isolation oxide film 15 in the logic portion LP at the same time. The SOI regions are easily implanted with impurities. This prevents the manufacturing steps from being complicated.

More specifically, after the formation of the trench isolation oxide films 15 and 17 in similar steps to those described with reference to FIGS. 9 through 11, P type and N type impurity ions are selectively implanted into the SOI layers underlying the trench isolation oxide film 17 from above the trench isolation oxide film 17, as in the step described with reference to FIG. 13, to form the PG shield 105.

Moreover, since the trench isolation oxide film 15 which is the partial isolation oxide film isolates the devices from each other in the logic portion LP, the potential of the channel region (body region) is fixed through the well region WR beneath the trench isolation oxide film 15. This prevents various problems resulting from the floating-substrate effect.

<F. Sixth Preferred Embodiment>

In the semiconductor device 500 of the fifth preferred embodiment, the top surface of the PG shield 105 is covered with the trench isolation oxide film 17 which is the partial isolation oxide film. Since the PG shield has an area at least equal to the area occupied by the spiral inductor SI, as viewed in plan, it is necessary to provide the trench isolation oxide film 17 over a wide area. with an oxide film and then removing an unnecessary part of the oxide film by a CMP process. However, the formation of the trench isolation oxide film over a wide area is prone to cause "dishing" that is a phenomenon in which the trench isolation oxide film is dished or recessed in a dish-like shape.

Figure 19:
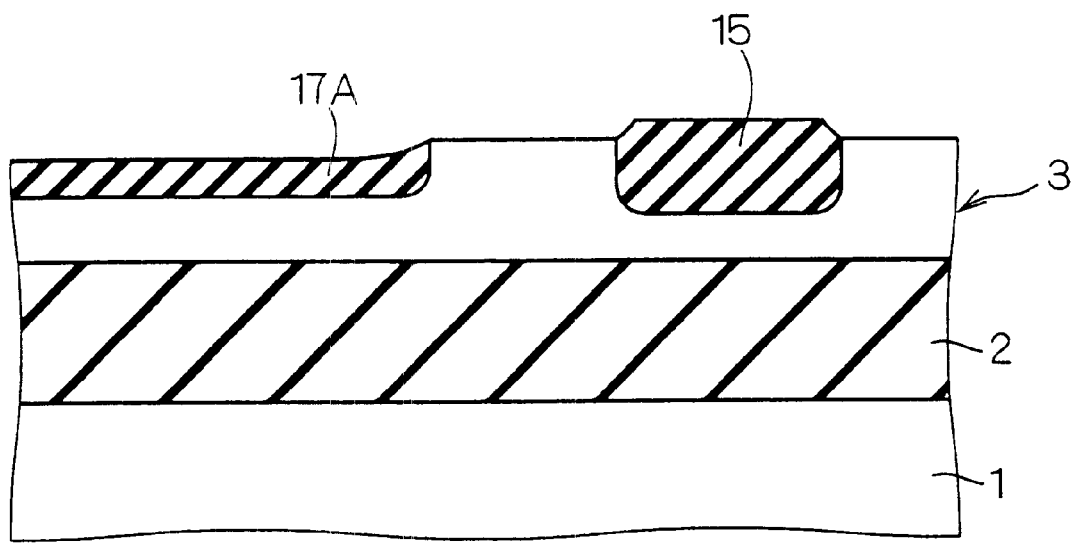
FIG. 19 illustrates dishing.

FIG. 19 shows the dishing. As shown in FIG. 19, the surface of a trench isolation oxide film 17A having a wide area is recessed in a dish-like shape, whereas the trench isolation oxide film 15 having a small area is formed normally.

The shape of an upper edge of the trench isolation oxide film which is "dished" is different from that of an upper edge of the normal trench isolation oxide film in that it might affect the characteristics of MOS transistors.

A sixth preferred embodiment of the present invention features a semiconductor device constructed to prevent the occurrence of such dishing.

<F-1. Device Construction>

Figure 20:
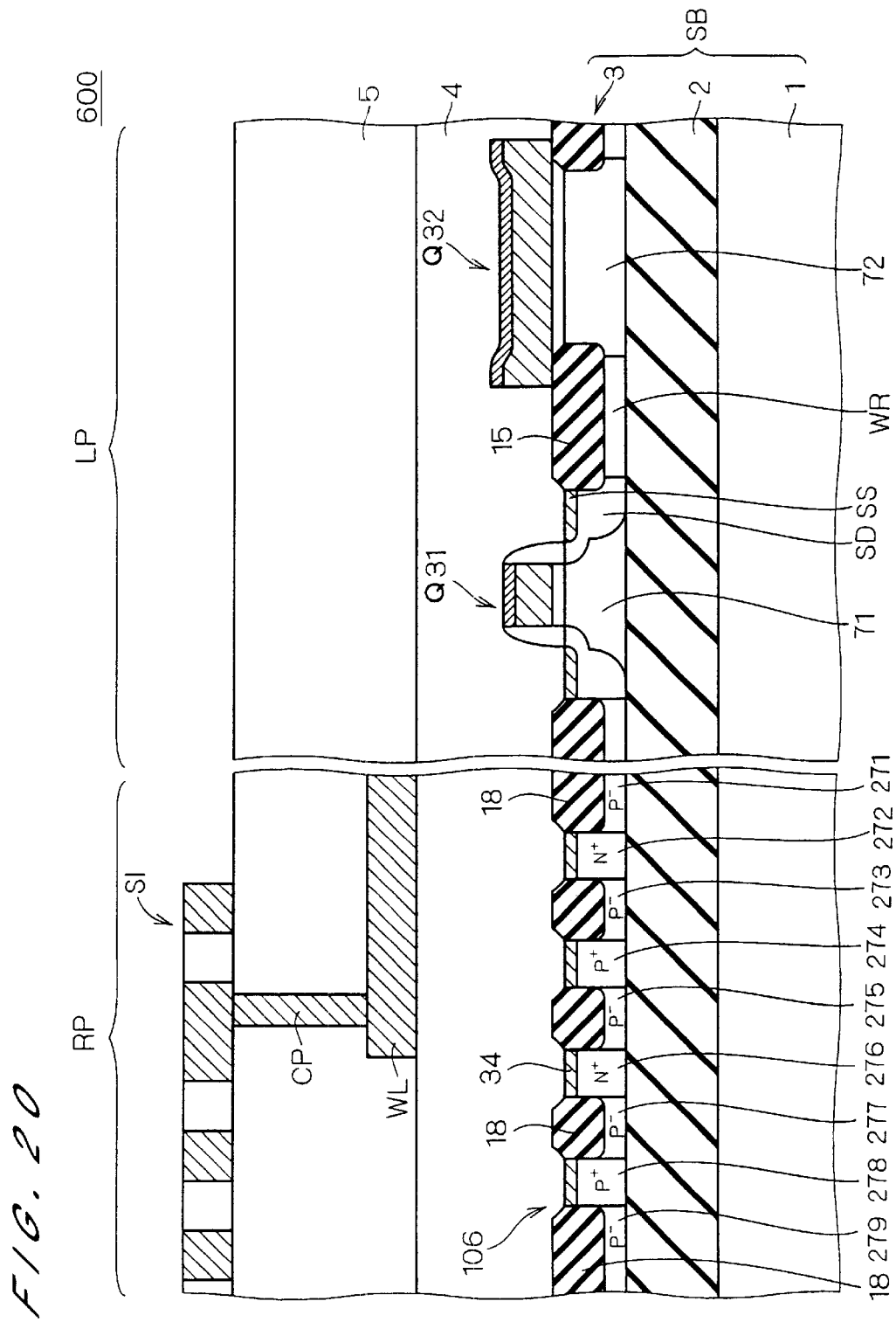
FIG. 20 is a cross-sectional view showing a construction of the semiconductor device according to a sixth preferred embodiment of the present invention.

FIG. 20 shows a construction of a semiconductor device 600 according to the sixth preferred embodiment of the present invention.

The semiconductor device 600 of FIG. 20 is similar to the semiconductor device 300 of FIG. 12 in comprising the RF circuit portion RP and the logic portion LP disposed on the SOI substrate SB.

In the RF circuit portion RP, a PG shield 106 (shield layer) comprising SOI regions 271 to 279 in intimately contacting relationship and silicide films 34 formed on the SOI regions 272, 274, 276 and 278 is formed in the SOI layer 3 in corresponding relation to the region in which the spiral inductor SI (whose plan configuration is shown in FIG. 70) is provided.

The SOI regions 271, 273, 275, 277 and 279 are thinner than the remaining SOI regions, and trench isolation oxide films 18 which are the partial isolation oxide film are formed on the SOI regions 271, 273, 275, 277 and 279. The trench isolation oxide film on the SOI region 271 extends to the logic portion LP.

In the logic portion LP, the SOI layer 3 is divided into the SOI regions 71 and 72 by the trench isolation oxide film 15. The MOS transistors Q31 and Q32 are formed in the SOI regions 71 and 72, respectively.

The constituents of the semiconductor device 600 similar to those of the semiconductor device 300 of FIG. 12 are designated by the same reference characters, and are not particularly described.

Adjacent ones of the SOI regions 271 to 279 constituting the PG shield 106 are different in impurity concentration or impurity conductivity type so that PN junctions interrupt the eddy current.

The SOI regions 271 to 279 shown in FIG. 20 are as follows: a P$^-$ region, an N$^+$ region, a P$^-$ region, a P$^+$ region, a P$^-$ region, an N$^+$ region, a P$^-$ region, a P$^+$ region and a P$^-$ region, respectively. The trench isolation oxide films 18 are formed on the respective P$^-$ regions.

Figure 21:
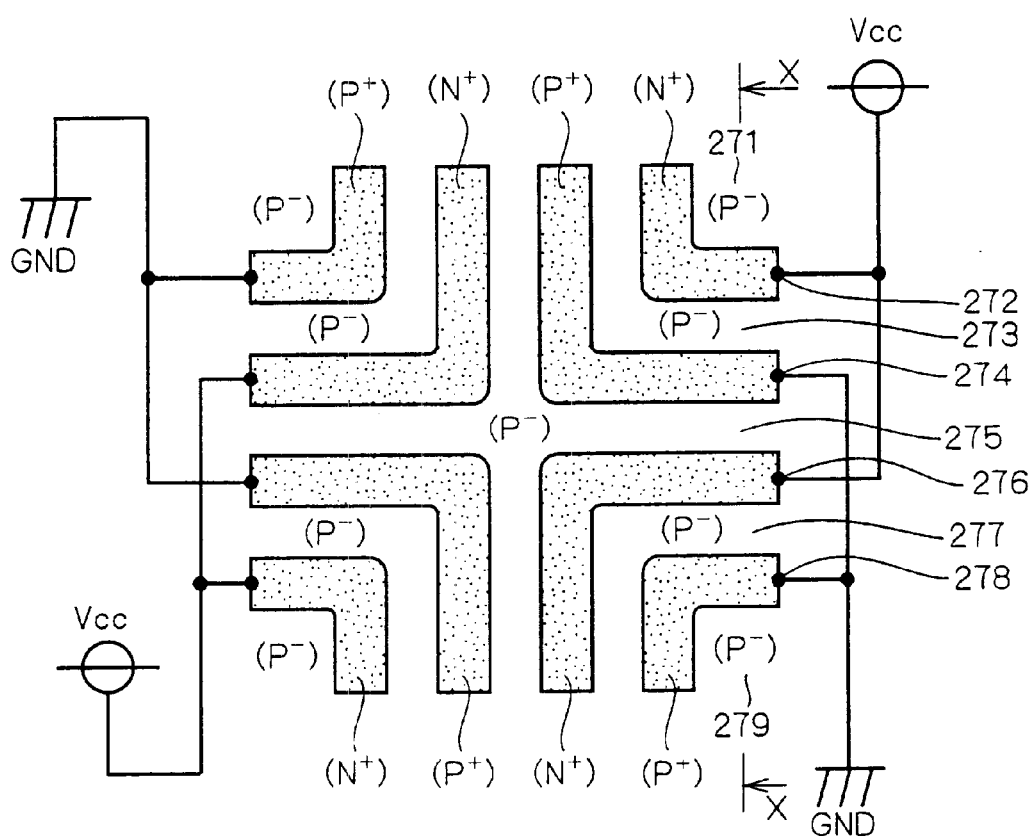
FIG. 21 shows a plan configuration of the PG shield of the semiconductor device according to the sixth preferred embodiment of the present invention.

FIG. 21 shows a plan configuration of the PG shield 106. The plan configuration of the PG shield 106 is similar to that of the PG shield 101 described with reference to FIG. 2, and is not particularly described. A cross-section taken along the line X—X of FIG. 21 corresponds to the cross-section of the PG shield 106 shown in FIG. 20.

With reference to FIG. 21, a reverse bias is applied to diodes formed by the PN junctions to interrupt the eddy current. Thus, the SOI regions 272 and 276 are connected to the power supply potential (Vcc), and the SOI regions 274 and 278 are grounded.

<F-2. Function and Effect>

The above described semiconductor device 600, in which the trench isolation oxide films 18 having a small area are formed in the region where the PG shield 106 is formed, can prevent the occurrence of dishing.

Like the semiconductor device 400 described with reference to FIG. 15, the semiconductor device 600 has the PG shield 106 which can reduce the electromagnetically induced power dissipation resulting from the eddy current.

The PG shield 106 in which electrostatically induced current flows through the grounded P$^+$ regions (high-resistance regions) can, of course, reduce the electrostatically induced power dissipation. Further, since the PG shield 106 is formed in the SOI layer 3, no additional conductor layer is required to form the PG shield 106, and the device structure is not complicated.

The trench isolation oxide films 18 may be formed in the step of forming the trench isolation oxide film 15 in the logic portion LP at the same time. The silicide films 34 are easily formed and the SOI regions are easily implanted with impurities. This prevents the manufacturing steps from being complicated.

More specifically, after the formation of the trench isolation oxide films 15 and 18 in similar steps to those described with reference to FIGS. 9 through 11, the silicide films 34 are formed on the exposed SOI regions at the same time in the salicide step for the formation of the transistors Q31 and Q32 in the logic portion LP. In the region where the PG shield 106 is formed, P type and N type impurity ions are selectively implanted to form the PG shield 106.

Moreover, since the trench isolation oxide film 15 which is the partial isolation oxide film isolates the devices from each other in the logic portion LP, the potential of the channel region (body region) is fixed through the well region WR beneath the trench isolation oxide film 15. This prevents various problems resulting from the floating-substrate effect.

The plan configuration of the PG shield explained above is only an example and the present invention is not restricted by the plan configuration of the PG shield.

<F-3. Modification>

In the PG shield 106 of the semiconductor device 600 shown in FIG. 20, the SOI regions on the opposite (right and left) sides of a lightly doped region (P$^-$ region) are the P$^+$ and N$^+$ regions. Instead, the SOI regions on the opposite sides of the lightly doped region may be of the same conductivity type.

Figure 22:
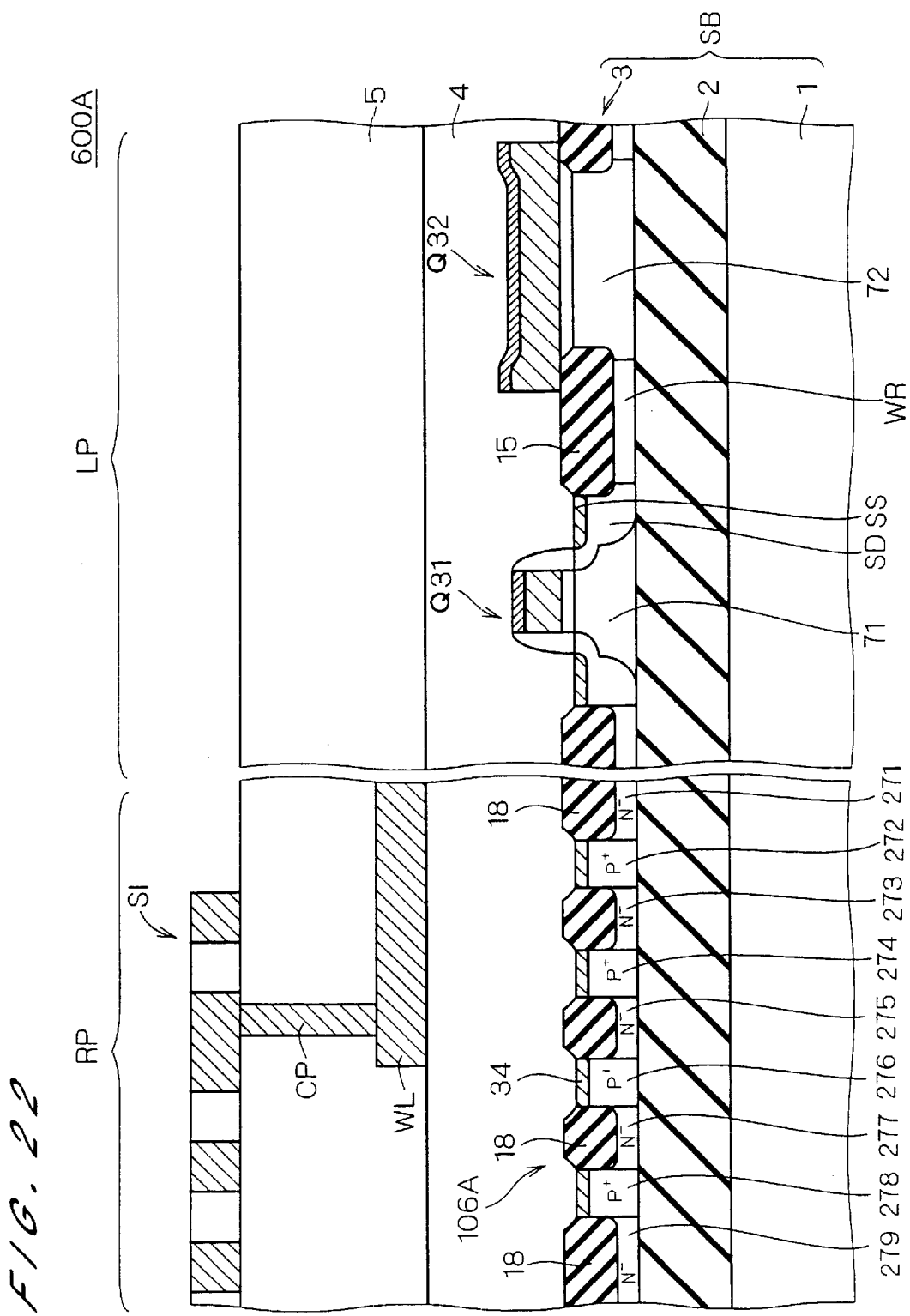
FIG. 22 is a cross-sectional view showing a construction of a modification of the semiconductor device according to the sixth preferred embodiment of the present invention.

FIG. 22 shows a semiconductor device 600A which is a modification of the semiconductor device 600. In a PG shield 106A (shield layer) shown in FIG. 22, the SOI regions 271, 273, 275, 277 and 279 are N$^-$ regions, and the remaining SOI regions are P$^+$ regions.

Figure 23:
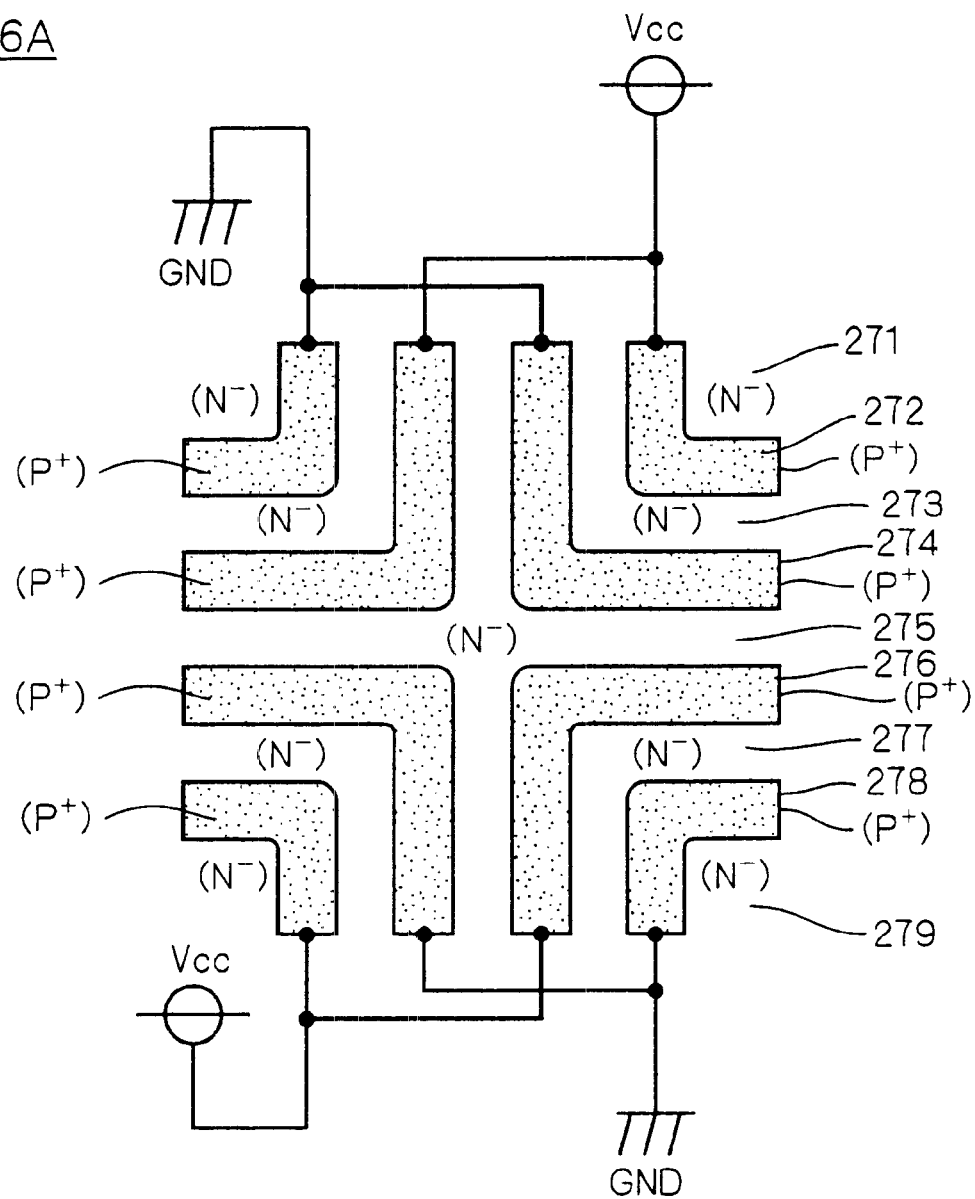
FIG. 23 shows a plan configuration of the PG shield of the modification of the semiconductor device according to the sixth preferred embodiment of the present invention.

FIG. 23 shows a plan configuration of the PG shield 106A. The plan configuration of the PG shield 106A is similar to that of the PG shield 101 described with reference to FIG. 2, and is not particularly described. A cross-section taken along the line X—X of FIG. 23 corresponds to the cross-section of the PG shield 106A shown in FIG. 22.

With reference to FIG. 23, a reverse bias is applied to diodes formed by the PN junctions to interrupt the eddy current. Thus, the SOI regions 272 and 276 are connected to the power supply potential (Vcc), and the SOI regions 274 and 278 are grounded.

The above described connections cause a reverse bias to be applied to a diode formed by the SOI regions 273 and 274, a diode formed by the SOI regions 274 and 275, and a diode formed by the SOI regions 277 and 278, to prevent the diodes from being forward-biased by a counter electromotive force which generates the eddy current. This reduces the electrostatically induced power dissipation without the occurrence of the electromagnetically induced power dissipation resulting from the eddy current.

This modification requires only two types of SOI regions to reduce the number of times of alignment of the implantation masks in the implantation step and accordingly reduce the margin required for the alignment of the masks, thereby making the pattern of the SOI regions more microscopic.

Although the two types of SOI regions are N$^-$ and P$^+$ regions in the above description, P$^-$ and N$^+$ regions may be, of course, used instead.

<G. Seventh Preferred Embodiment>

Although the construction for preventing the dishing of the trench isolation oxide film in the region where the PG shield is formed is illustrated in the sixth preferred embodiment, a construction according to a seventh preferred embodiment of the present invention to be described below may be employed instead.

<G-1. Device Construction>

Figure 24:
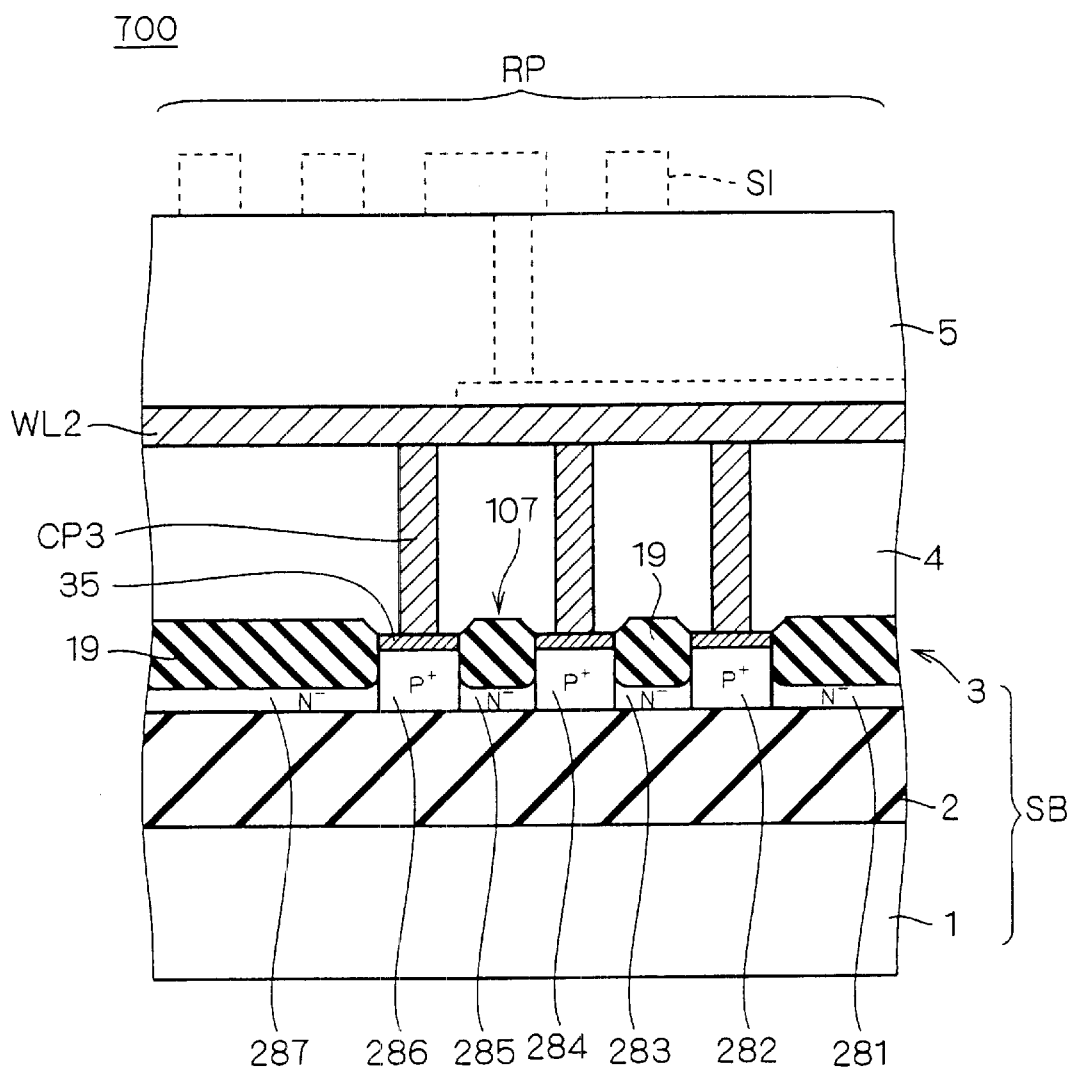
FIG. 24 is a cross-sectional view showing a construction of the semiconductor device according to a seventh preferred embodiment of the present invention.

FIG. 24 shows a construction of a semiconductor device 700 according to the seventh preferred embodiment of the present invention. For purposes of simplification, only the construction of the RF circuit portion RP is shown in FIG. 24.

In the RF circuit portion RP, as shown in FIG. 24, a PG shield 107 (shield layer) comprising SOI regions 281 to 287 in intimately contacting relationship and silicide films 35 formed on the SOI regions 282, 284 and 286 is formed in the SOI layer 3 in corresponding relation to the region in which the spiral inductor SI (whose plan configuration is shown in FIG. 70) is provided.

The SOI regions 281, 283, 285 and 287 are thinner than the remaining SOI regions, and trench isolation oxide films 19 which are the partial isolation oxide film are formed on the SOI regions 281, 283, 285 and 287. The trench isolation oxide films 19 on the SOI regions 281 and 287 are wider than the remaining trench isolation oxide films 19.

Contact portions CP3 extending through the interlayer insulation film 4 are connected to the silicide films 35 on the SOI regions 282, 284 and 286, and are also connected to an interconnect line WL2 disposed on the interlayer insulation film 4 and connected to the ground.

The constituents of the semiconductor device 700 similar to those of the semiconductor device 300 of FIG. 12 are designated by the same reference characters, and are not particularly described.

The SOI regions 281 to 287 constituting the PG shield 107 are as follows: the SOI regions 282, 284 and 286 are P$^+$ regions and the SOI regions 281, 283, 285 and 287 are N$^-$ regions, so that PN junctions interrupt the eddy current.

Figure 25:
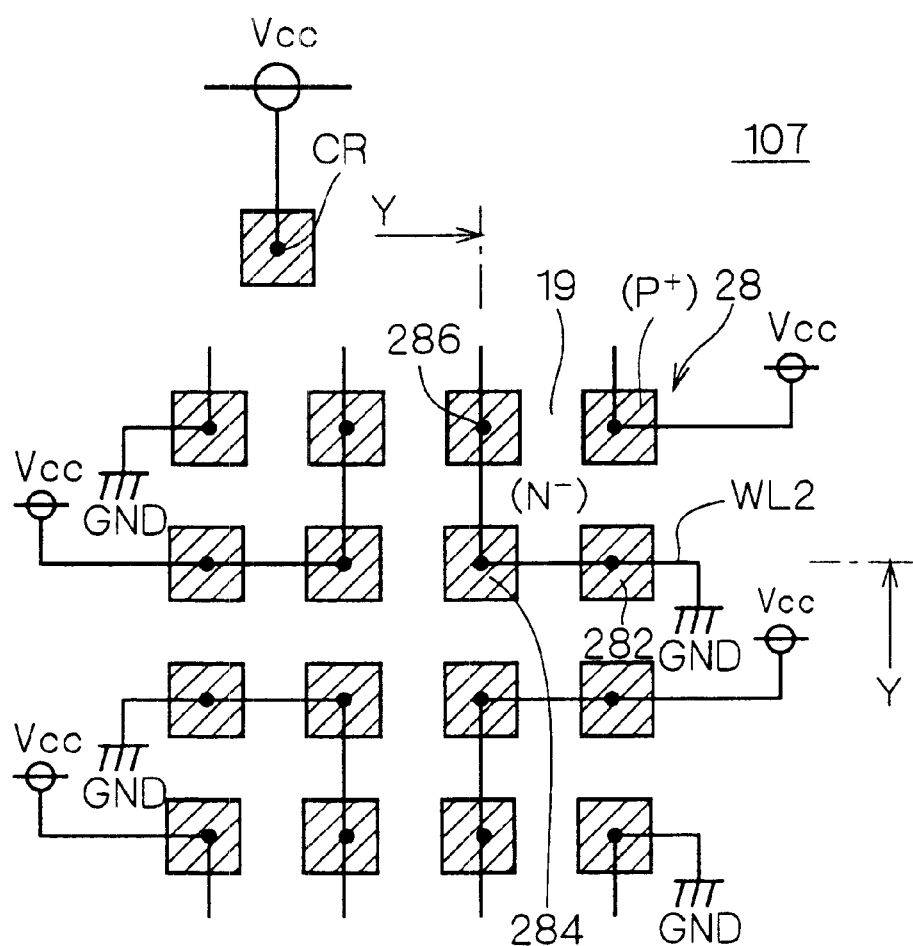
FIG. 25 shows a plan configuration of the PG shield of the semiconductor device according to the seventh preferred embodiment of the present invention.

FIG. 25 shows a plan configuration of the PG shield 107. The PG shield 107 in plan configuration includes rectangular SOI regions 28 (generic designation of the SOI regions 282, 284 and 286) with the respective silicide films which are arranged in a matrix in spaced apart relationship, with the trench isolation oxide films 19 therebetween.

A cross-section taken along the line Y—Y of FIG. 25 corresponds to the cross-section of the PG shield 107 shown in FIG. 24. The interconnect line WL2 is provided in L-shaped configuration so as to run along over the SOI regions 282, 284 and 286 arranged in discretely spaced-apart relationship.

Interconnect lines are also provided over other SOI regions 28 having the respective silicide films. The paths of the interconnect lines are of the above-mentioned L-shaped configuration except over the SOI regions 28 positioned at the four corners. The ground potential and the power supply potential are alternately applied to the interconnect lines.

A contact region CR for connecting the lightly doped regions to the power supply potential is disposed in a position distant from the PG shield 107.

<G-2. Function and Effect>

The above described connections cause a reverse bias to be applied to all of the diodes each comprised of a lightly-doped SOI region and a heavily-doped SOI region, to prevent the diodes from being forward-biased by a counter electromotive force which generates the eddy current. This reduces the electrostatically induced power dissipation without the occurrence of the electromagnetically induced power dissipation resulting from the eddy current.

The PG shield 107 in which electrostatically induced current flows through the grounded P$^+$ regions (high-resistance regions) can, of course, reduce the electrostatically induced power dissipation. Further, since the PG shield 107 is formed in the SOI layer 3, no additional conductor layer is required to form the PG shield 107 although the step of forming the interconnect line WL2 is required, and the device structure is not complicated.

<G-3. First Modification>

Figure 26:
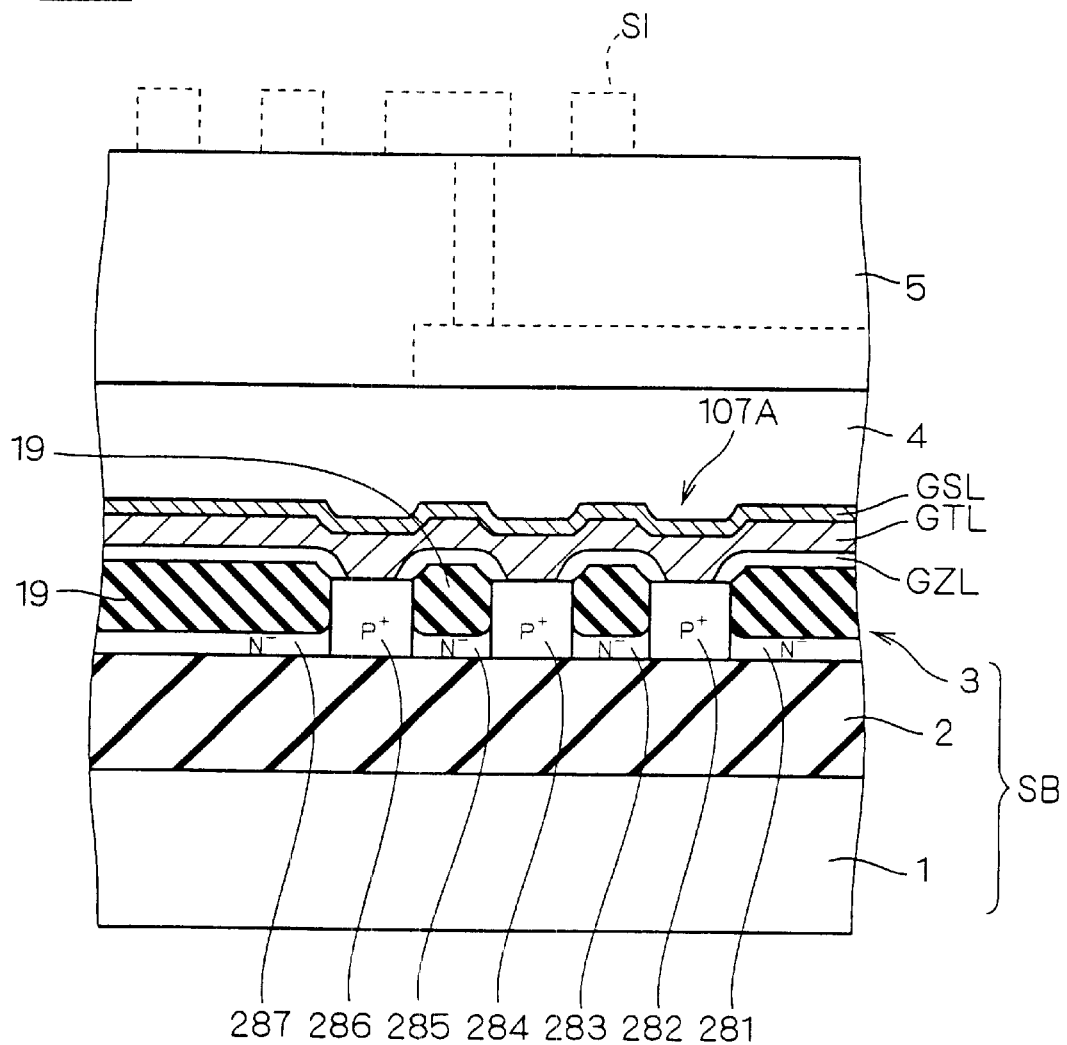
FIGS. 26 through 28 are cross-sectional views showing constructions of modifications of the semiconductor device according to the seventh preferred embodiment of the present invention.

Although the interconnect line WL2 establishes electric connection between the SOI regions of the PG shield 107 in the above-mentioned semiconductor device 700, a gate interconnect line in a semiconductor device 700A shown in FIG. 26 may be used in place of the interconnect line WL2.

In a PG shield 107A (shield layer) of the semiconductor device 700A shown in FIG. 26, the silicide films are not formed on the SOI regions 282, 284 and 286, and a continuous gate interconnect line GTL formed in the step of forming the gate electrodes of the MOS transistors is in direct contact with the SOI regions 282, 284 and 286.

Insulation films GZL formed in the step of forming the gate insulation films of the MOS transistors are disposed on the trench isolation oxide films 19. A silicide film GSL formed in the step of forming the silicide films of the MOS transistors is disposed on the gate interconnect line GTL.

The gate interconnect line GTL has an L-shaped plan configuration similar to that of the interconnect line WL2 described with reference to FIG. 25.

Such a construction simplifies the steps of manufacturing an interconnect line for electric connection between the SOI region.

<G-4. Second Modification>

In the semiconductor device 700, the eddy current is interrupted by the PN junctions between the SOI regions covered with the trench isolation oxide films 19 which are the partial isolation oxide film and the remaining SOI regions. In place of the trench isolation oxide films 19, complete isolation oxide films may be used to completely electrically isolate the SOI regions from each other as in semiconductor devices 700B and 700C shown in FIGS. 27 and 28.

Figure 27:
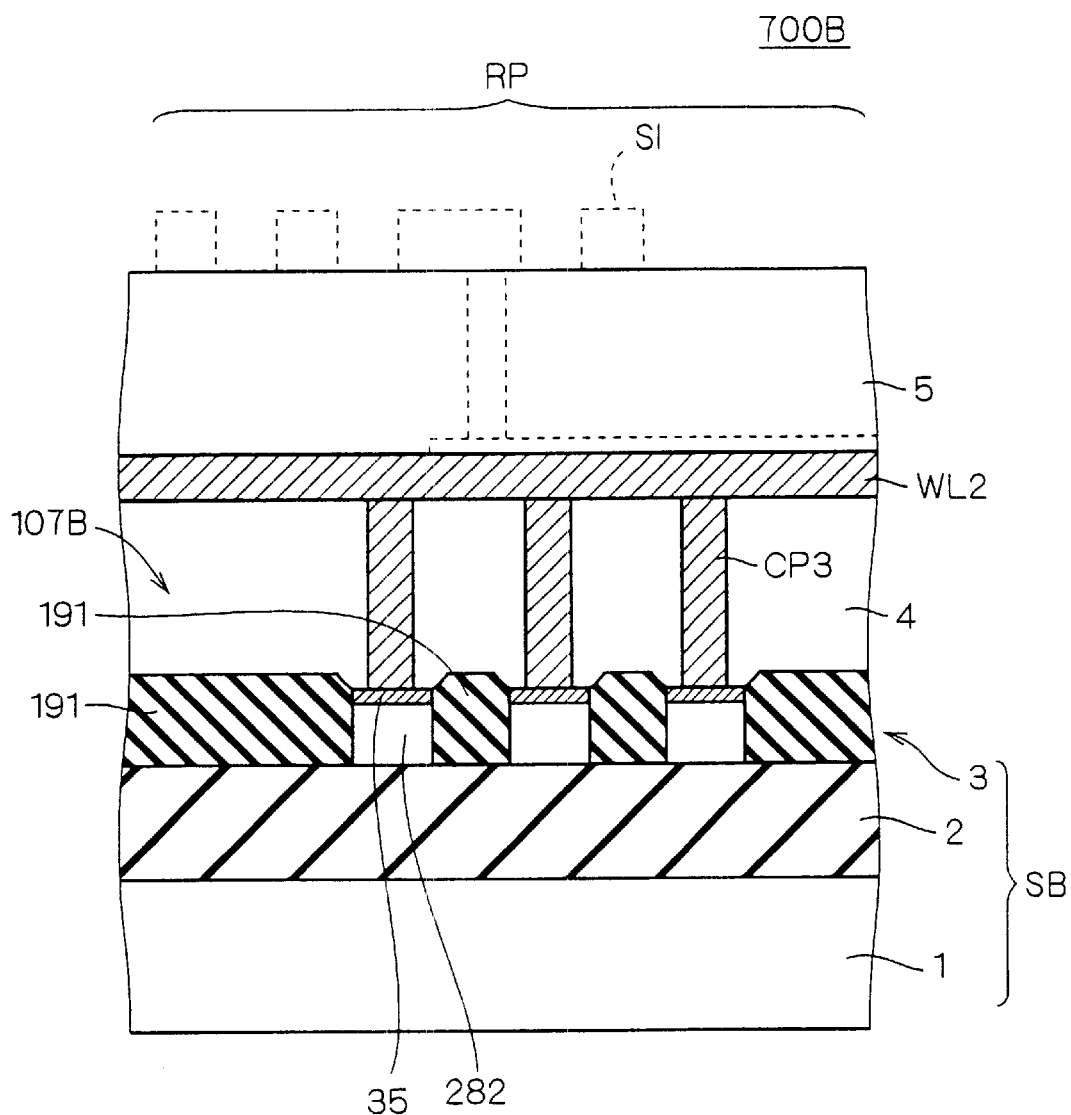

A PG shield 107B (shield layer) of the semiconductor device 700B shown in FIG. 27 has trench isolation oxide films 191 which are the complete isolation oxide film providing complete electric isolation between the SOI regions.

Figure 28:
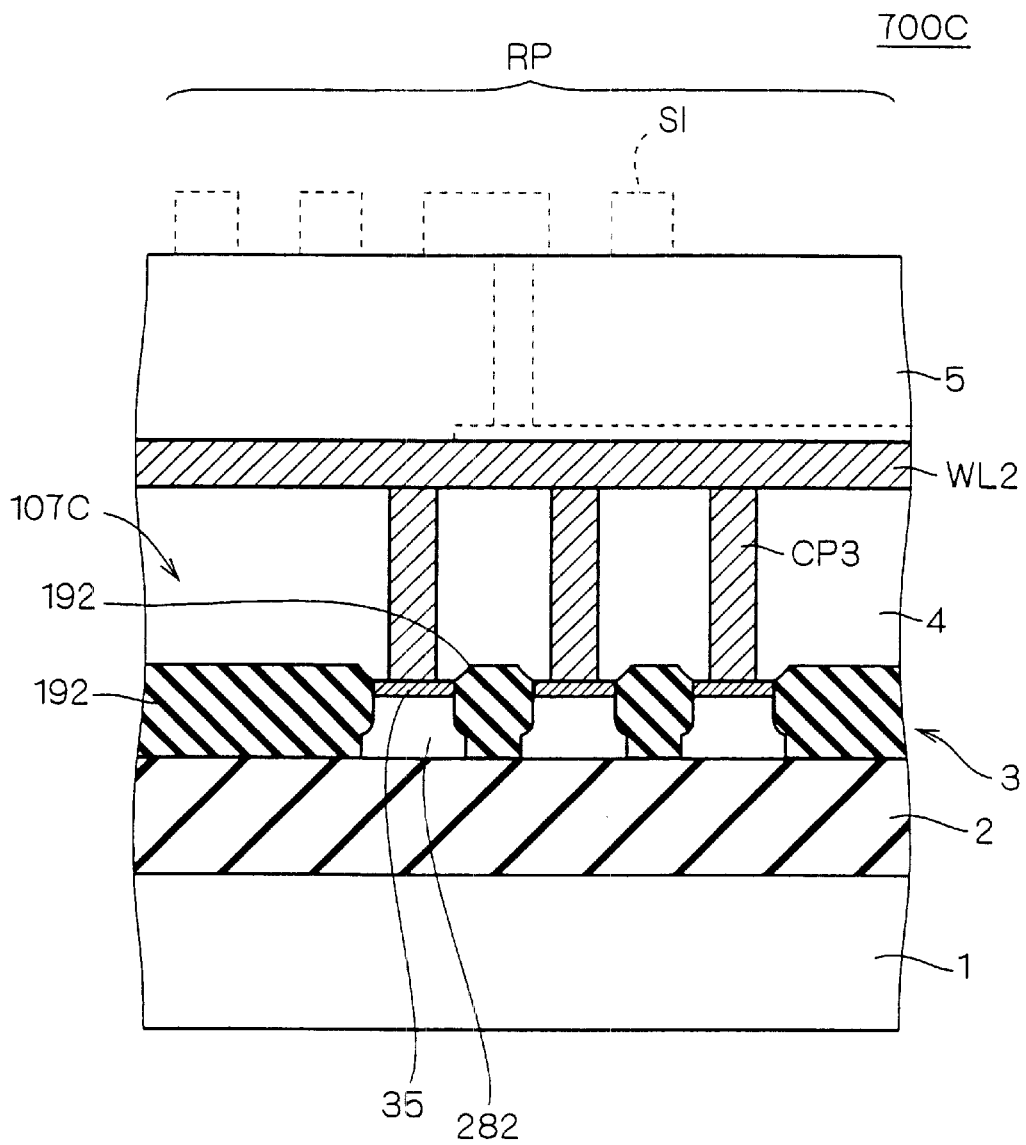

A PG shield 107C (shield layer) of the semiconductor device 700C shown in FIG. 28 has trench isolation oxide films 192 which are the complete isolation oxide film providing complete electric isolation between the SOI regions.

The PG shields 107B and 107C are similar to each other in providing complete isolation between the SOI regions. The trench isolation oxide films 192, however, may be formed using a common resist mask in the step of providing partial isolation between the MOS transistors in the logic portion not shown. This simplifies the manufacturing method without the need for additional steps.

<H. Eighth Preferred Embodiment>

<H-1. Device Construction>

Figure 29:
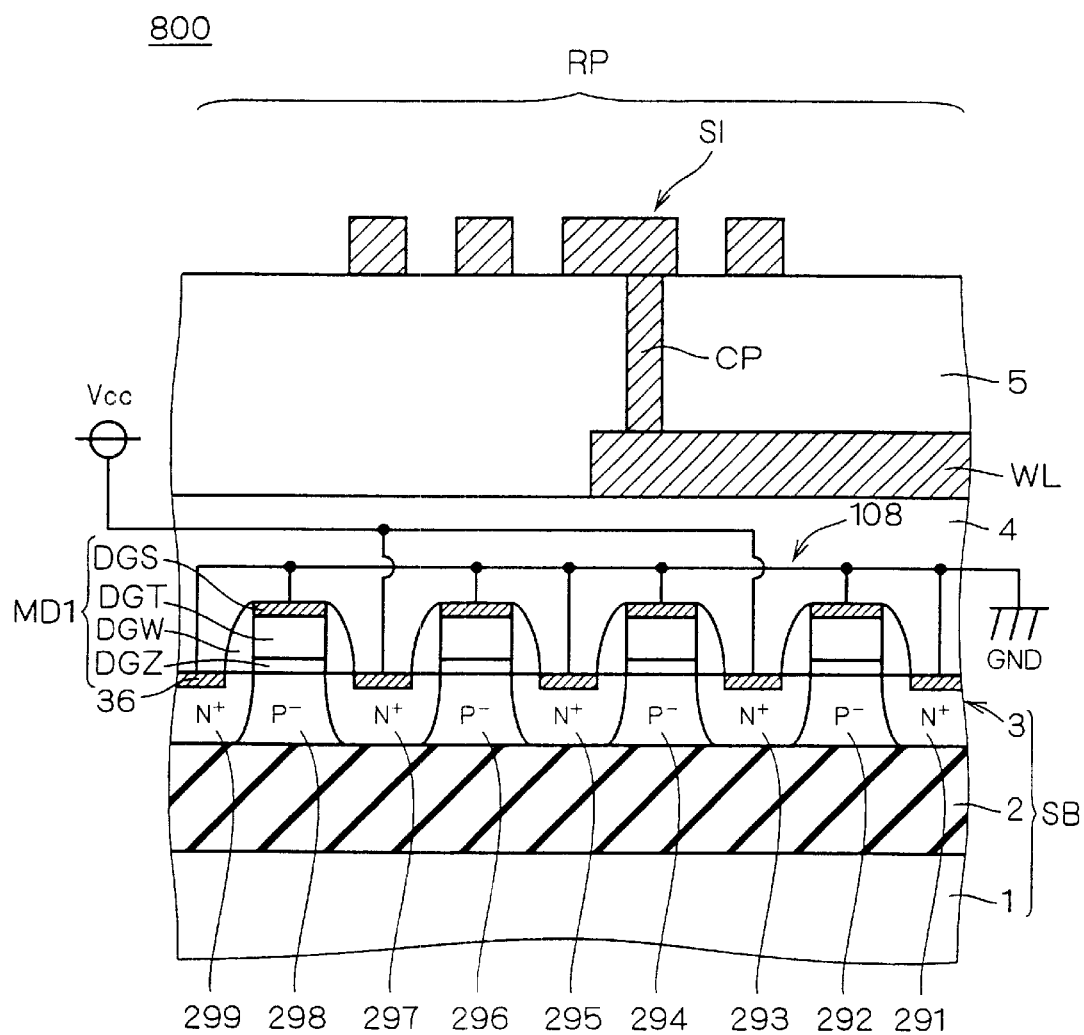
FIG. 29 is a cross-sectional view showing a construction of the semiconductor device according to an eighth preferred embodiment of the present invention.

FIG. 29 shows a construction of a semiconductor device 800 according to an eighth preferred embodiment of the present invention. For purposes of simplification, only the construction of the RF circuit portion RP of the semiconductor device 800 is shown in FIG. 29.

In the RF circuit portion RP, as shown in FIG. 29, a PG shield 108 (shield layer) comprising SOI regions 291 to 299 in intimately contacting relationship and silicide films 36 formed on the SOI regions 291, 293, 295, 297 and 299 is formed in the SOI layer 3 in corresponding relation to the region in which the spiral inductor SI (whose plan configuration is shown in FIG. 70) is provided.

A dummy gate electrode MD1 similar in cross-sectional structure to the gate electrodes of the MOS transistors is disposed on each of the SOI regions 292, 294, 296 and 298. The dummy gate electrode MD1 is similar to the MOS transistors not shown in having a gate insulation film DGZ, a gate electrode DGT, a silicide film DGS and sidewall insulation films DGW.

The silicide films 36 are disposed on the SOI regions 291, 293, 295, 297 and 299 outside the sidewall insulation films DGW of the dummy gate electrodes MD1.

The SOI regions 291, 293, 295, 297 and 299 are N$^+$ regions, and the SOI regions 292, 294, 296 and 298 are P$^-$ regions. The silicide films 36 on the SOI regions 293 and 297 are connected to the power supply potential (Vcc), and the silicide films 36 on the SOI regions 291, 295 and 299 and the silicide films DGS on the dummy gate electrodes MD1 are grounded.

The constituents of the semiconductor device 800 similar to those of the semiconductor device 300 of FIG. 12 are designated by the same reference characters, and are not particularly described.

Figure 30:
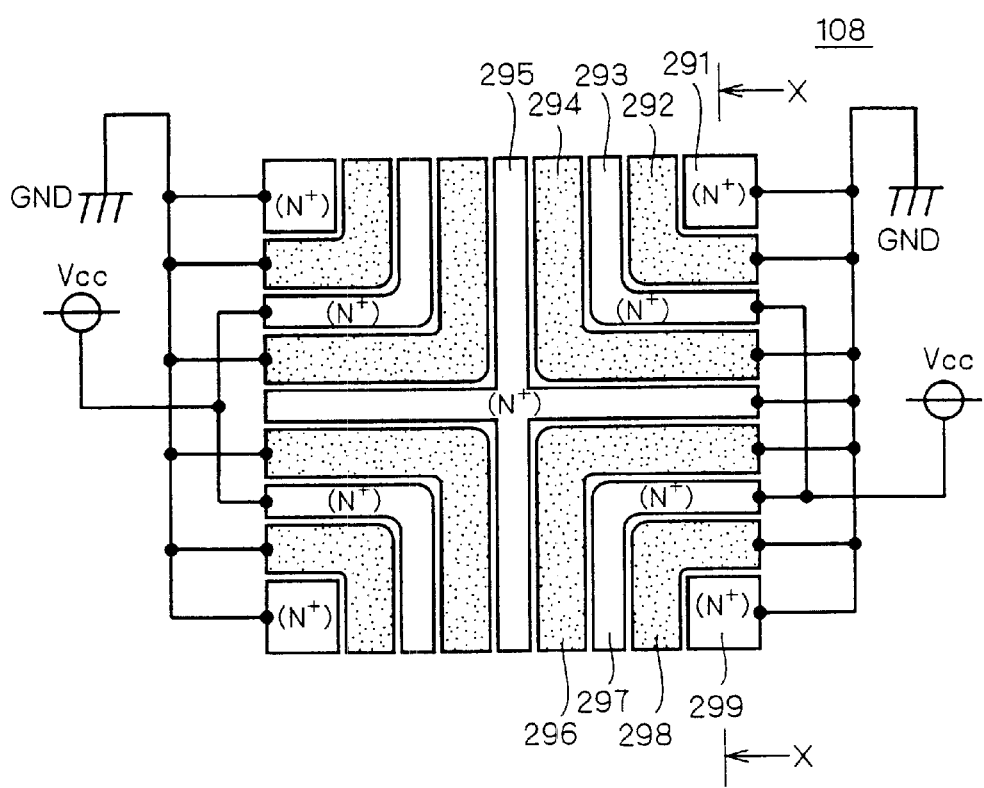
FIG. 30 shows a plan configuration of the PG shield of the semiconductor device according to the eighth preferred embodiment of the present invention.

FIG. 30 shows a plan configuration of the PG shield 108. The plan configuration of the PG shield 108 is similar to that of the PG shield 101 described with reference to FIG. 2, and is not particularly described. The PG shield 108 significantly differs from the PG shield 101 in that the dummy gate electrodes MD1 are substituted for the trench isolation oxide films 11 of the PG shield 101. A cross-section taken along the line X—X of FIG. 30 corresponds to the cross-section of the PG shield 108 shown in FIG. 29.

In the PG shield 108, a reverse bias is applied to diodes formed by PN junctions to interrupt the eddy current. Thus, the SOI regions 293 and 297 are connected to the power supply potential, and the SOI regions 291, 295 and 299 are grounded.

Although the P$^-$ region underlying the gate electrode DGT of the dummy gate electrode MD1 and the N$^+$ regions on the opposite side of the P$^-$ region make up the form of a so-called N-channel MOS transistor, it is needless to say that the conductivity types may be interchanged to make up the form of a P-channel MOS transistor, in which case the interconnections to the power supply potential and to the ground potential shown in FIG. 30 are also interchanged.

<H2. Function and Effect>

A reverse bias is applied to a diode formed by the SOI regions 292 and 293, a diode formed by the SOI regions 293 and 294, a diode formed by the SOI regions 296 and 297 and a diode formed by the SOI regions 297 and 298, to prevent the diodes from being forward-biased by a counter electromotive force which generates the eddy current. This reduces the electrostatically induced power dissipation without the occurrence of the electromagnetically induced power dissipation resulting from the eddy current.

The PG shield 108 is divided into a first PG shield including the SOI regions 291 to 299 and the silicide films 36 which are formed in the SOI layer 3, and a second PG shield including the dummy gate electrodes MD1. The first and second PG shields, if assumed to be respective resistive elements, are connected in parallel between a parasitic capacitor and the ground potential. This further reduces the resistance of the PG shield.

The plan configuration of the PG shield explained above is only an example and the present invention is not restricted by the plan configuration of the PG shield.

<H3. Modification>

In the PG shield 108 of the above-mentioned semiconductor device 800, the P$^-$ region underlying the gate electrode DGT and the N$^+$ regions on the opposite side of the P$^-$ region make up the form of the N-channel MOS transistor.

In this case, since connecting the power supply potential to the gate electrode DGT causes the P$^-$ region and the N$^+$ regions to operate as a MOS transistor, the gate electrode DGT is connected to the ground potential. However, the dummy gate electrode MD1 is not for use as the gate electrode of the MOS transistor. Thus, the impurity pattern of the SOI regions in the SOI layer 3 is not limited to this.

Figure 31:
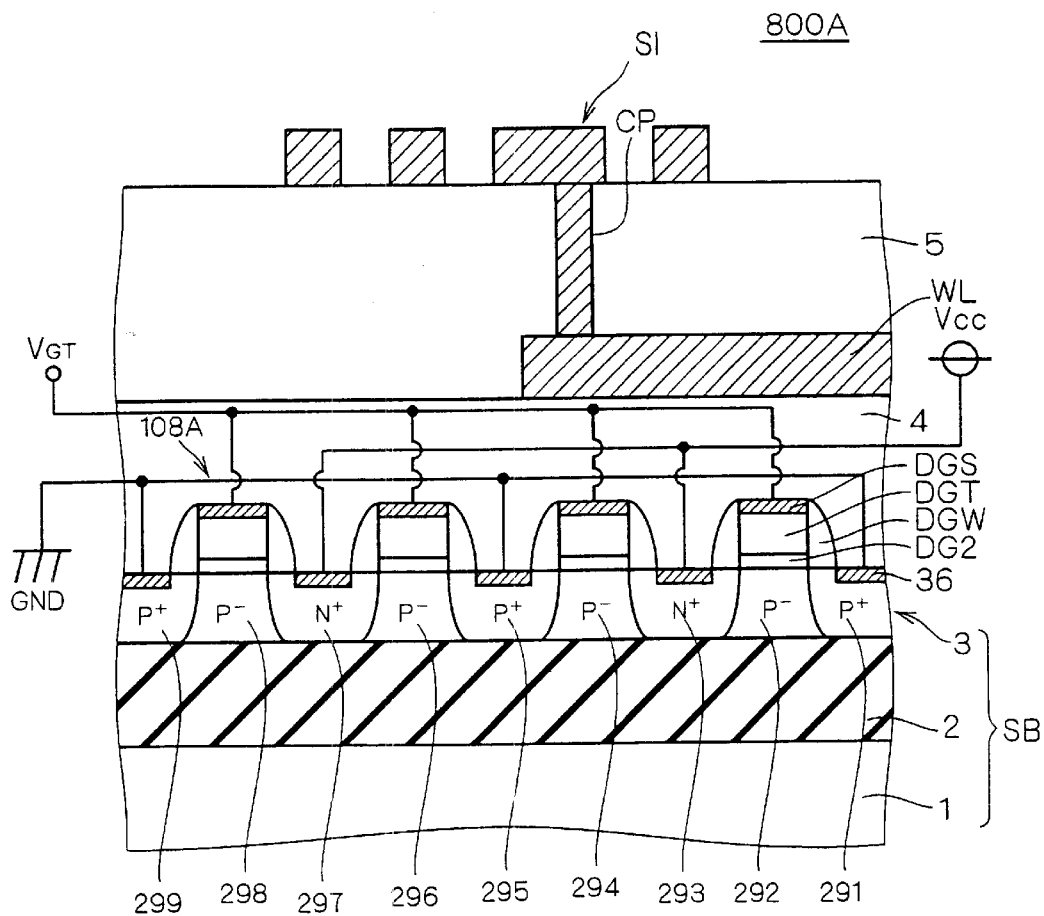
FIG. 31 is a cross-sectional view showing a construction of a modification of the semiconductor device according to the eighth preferred embodiment of the present invention.

For example, a PG shield 108A (shield layer) of a semiconductor device 800A shown in FIG. 31 may be used in which the SOI regions 291, 295 and 299 are P$^+$ regions, the SOI regions 292, 294, 296 and 298 are P$^-$ regions, and the SOI regions 293 and 297 are N$^+$ regions.

Then, the SOI regions 293 and 297 are connected to the power supply potential (Vcc), and the SOI regions 291, 295 and 299 are grounded, whereas the silicide films DGS of the dummy gate electrodes MD1 are connected to a gate potential $V_{GT}$.

The above described connections cause a reverse bias to be applied to the diodes formed by the PN junctions, to prevent the diodes from being forward-biased by a counter electromotive force which generates the eddy current, thereby interrupting the eddy current. Additionally, the above described connections prevent the function as a MOS transistor even upon application of the gate potential $V_{GT}$ to the gate electrode DGT of the dummy gate electrode MD1, to provide increased flexibility in selecting the potential of the gate electrode DGT of the dummy gate electrode MD1.

Figure 32:
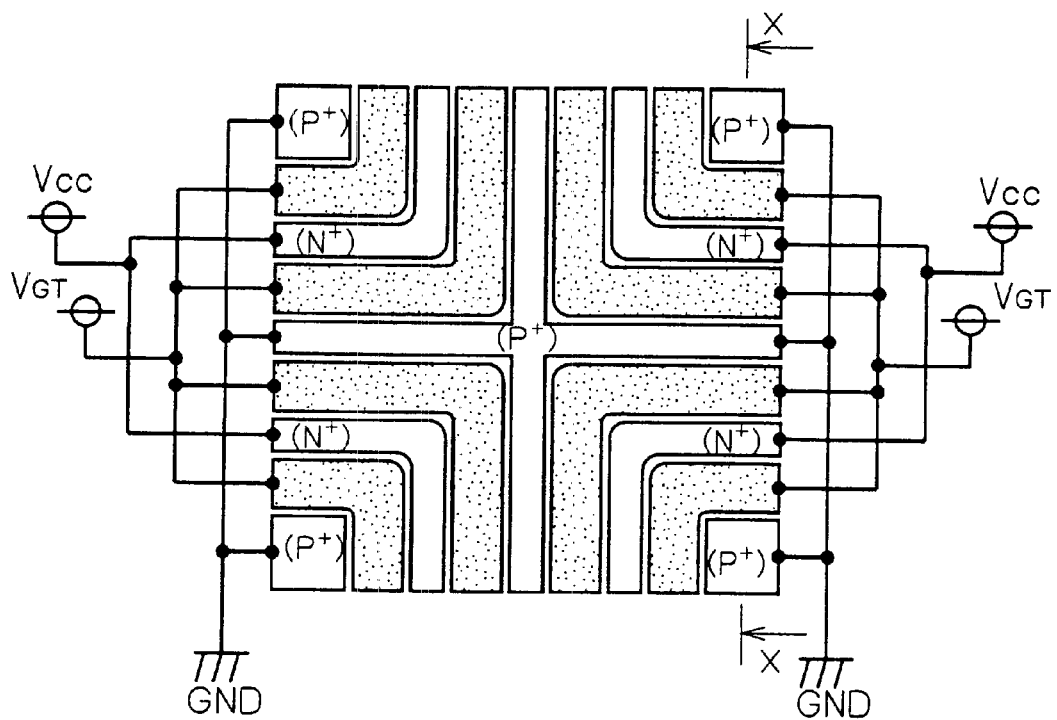
FIG. 32 shows a plan configuration of the PG shield of the modification of the semiconductor device according to the eighth preferred embodiment of the present invention.

FIG. 32 shows a plan configuration of the PG shield 108A. The plan configuration of the PG shield 108A is similar to that of the PG shield 101 described with reference to FIG. 2, and is not particularly described. The potential arrangement described with reference to FIG. 31 is not again discussed. A cross-section taken along the line X—X of FIG. 32 corresponds to the cross-section of the PG shield 108A shown in FIG. 31.

<I. Ninth Preferred Embodiment>

<I-1. Device Construction>

Figure 33:
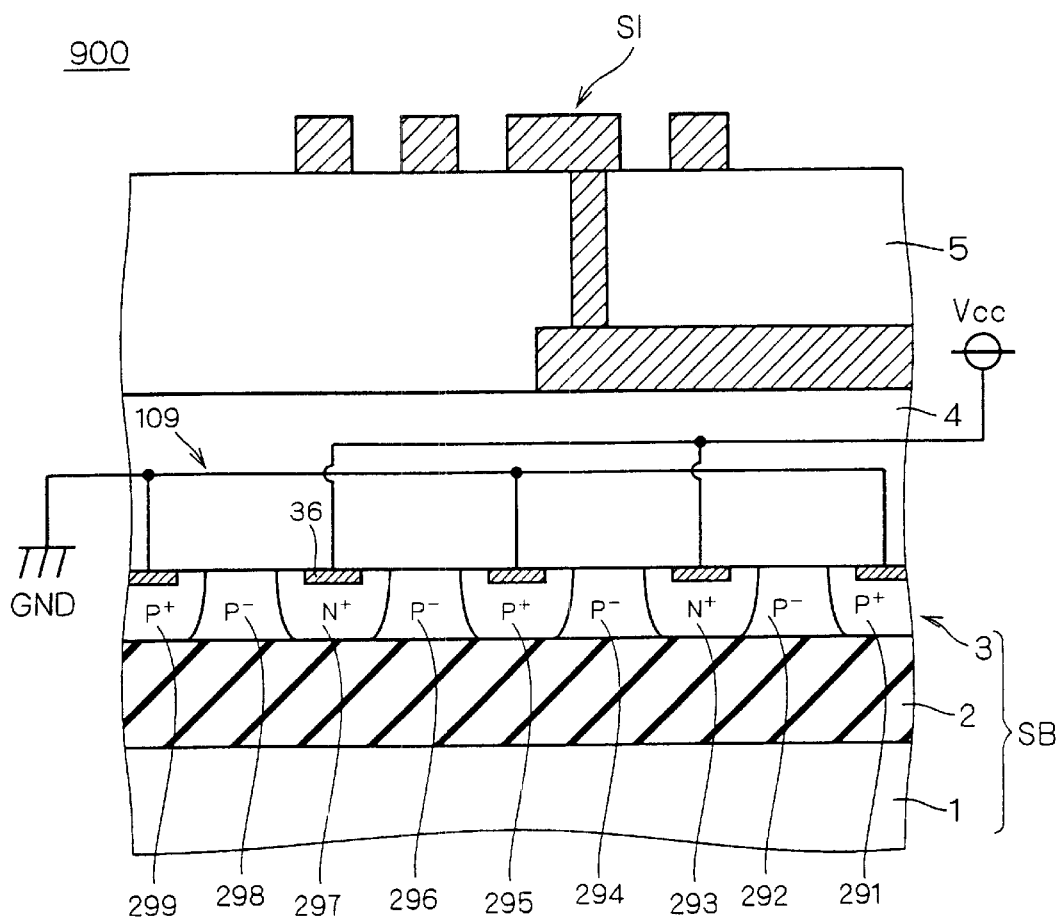
FIG. 33 is a cross-sectional view showing a construction of the semiconductor device according to a ninth preferred embodiment of the present invention.

FIG. 33 shows a construction of a semiconductor device 900 according to a ninth preferred embodiment of the present invention. For purposes of simplification, only the construction of the RF circuit portion RP of the semiconductor device 900 is shown in FIG. 33.

In the RF circuit portion RP, as shown in FIG. 33, a PG shield 109 (shield layer) comprising the SOI regions 291 to 299 in intimately contacting relationship and the silicide films 36 selectively formed on the SOI regions 291, 293, 295, 297 and 299 is formed in the SOI layer 3 in corresponding relation to the region in which the spiral inductor SI (whose plan configuration is shown in FIG. 70) is provided.

The SOI regions 291, 295 and 299 are P$^+$ regions, the SOI regions 292, 294, 296 and 298 are P$^-$ regions, and the SOI regions 293 and 297 are N$^+$ regions. The SOI regions 293 and 297 are connected through the silicide films 36 to the power supply potential (Vcc), and the SOI regions 291, 295 and 299 are grounded through the silicide films 36.

In the PG shield 109, a reverse bias is applied to the diodes formed by the PN junctions to interrupt the eddy current. Thus, the SOI regions 293 and 297 are connected to the power supply potential, and the SOI regions 291, 295 and 299 are grounded.

Figure 35:
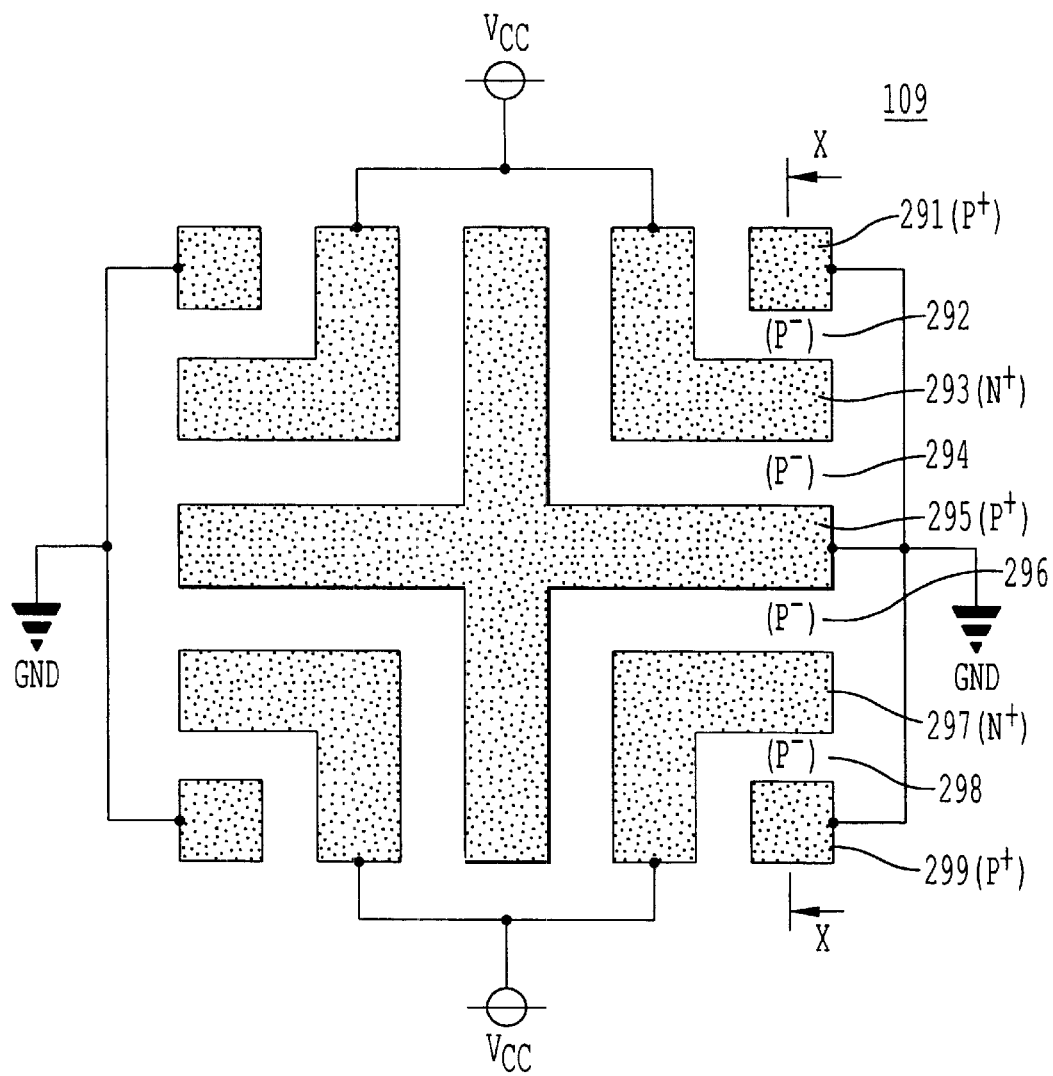
FIG. 35 shows a plan configuration of the PG shield of the semiconductor device according to the ninth preferred embodiment of the present invention.

FIG. 35 shows a plan configuration of the PG shield 109. The plan configuration of the PG shield 109 is similar to that of the PG shield 101 described with reference to FIG. 2, and is not particularly described. The PG shield 109 significantly differs from the PG shield 101 in that the silicide films 36 are substituted for the trench isolation oxide films 11 of the PG shield 101. A cross-section taken along the line X—X of FIG. 35 corresponds to the cross-section of the PG shield 109 shown in FIG. 33.

The constituents of the semiconductor device 900 similar to those of the semiconductor device 800A of FIG. 31 are designated by the same reference characters, and are not particularly described.

<I-2. Manufacturing Method>

A method of forming the PG shield 109 will be discussed briefly. First, a P type impurity (or an N type impurity) of a relatively low concentration is implanted into the SOI layer 3 to form a P$^-$ layer (or an N$^-$ layer). Next, using a resist mask, a P type impurity of a relatively high concentration is implanted to selectively form the SOI regions 291, 295 and 299 which are the P$^+$ regions, and an N type impurity of a relatively high concentration is implanted to selectively form the SOI regions 293 and 297 which are the N$^+$ regions. Then, regions which are implanted with neither of the P type and N type impurities of the high concentration remain as the P$^-$ regions.

Figure 34:
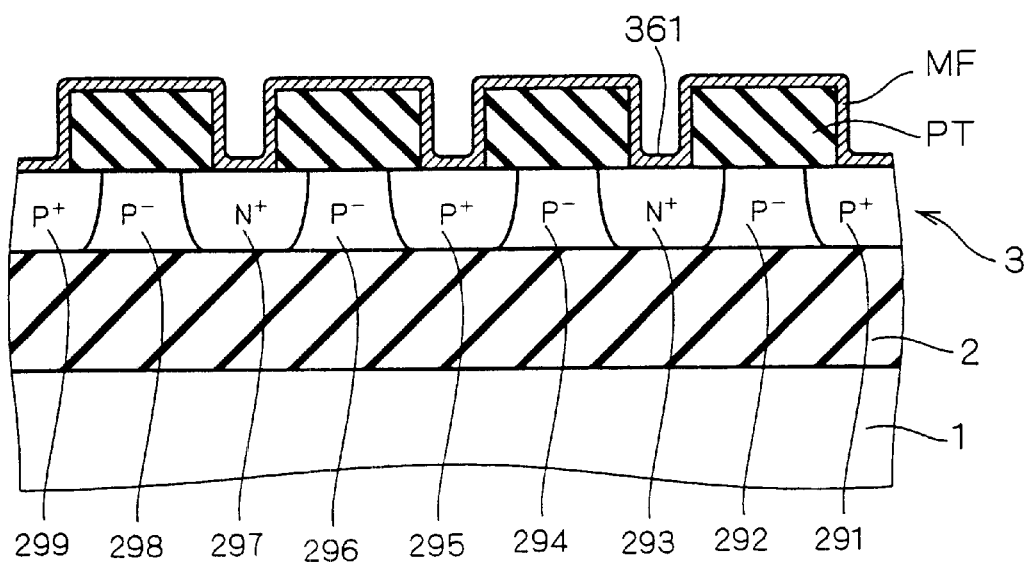
FIG. 34 is a cross-sectional view showing a manufacturing step of the semiconductor device according to the ninth preferred embodiment of the present invention.

As illustrated in FIG. 34, a silicide protection film PT is formed to cover each of the SOI regions 292, 294, 296 and 298 which are the P$^-$ regions.

The silicide protection film is an insulation film, such as a silicon oxide film, for covering the source/drain regions of a MOS transistor at which silicidation is not desired to prevent the formation of a silicide film.

Then, a metal film MF, such as a cobalt or titanium film, is formed on the entire top surface of a resultant structure so as to cover the SOI regions 291, 293, 295, 297 and 299. The metal film MF is silicided to form a silicide film 361. Parts of the metal film MF which are not silicided on the silicide protection films PT are removed. This provides the selectively formed silicide films 36.

The silicide protection films PT are formed in partial engagement with upper parts of the SOI regions on the opposite sides of each of the P$^-$ regions, to reliably prevent the silicide films 36 from being formed on the SOI regions on the opposite sides of each the P$^-$ regions.

<I-3. Function and Effect>

In the PG shield 104 of the semiconductor device 400 described with reference to FIG. 35, the SOI regions are similarly in intimately contacting relationship, but no silicide film is formed on the SOI regions since the silicide film formed continuously on the SOI regions prevents diodes from being formed by PN junctions. However, complete absence of the silicide film sometimes makes it difficult to reduce the resistance of the SOI regions. In the PG shield 109, the silicide films are formed, although discretely spaced, to reduce the resistance of the SOI regions.

The plan configuration of the PG shield explained above is only an example and the present invention is not restricted by the plan configuration of the PG shield.

<I-4. Modification>

Figure 36:
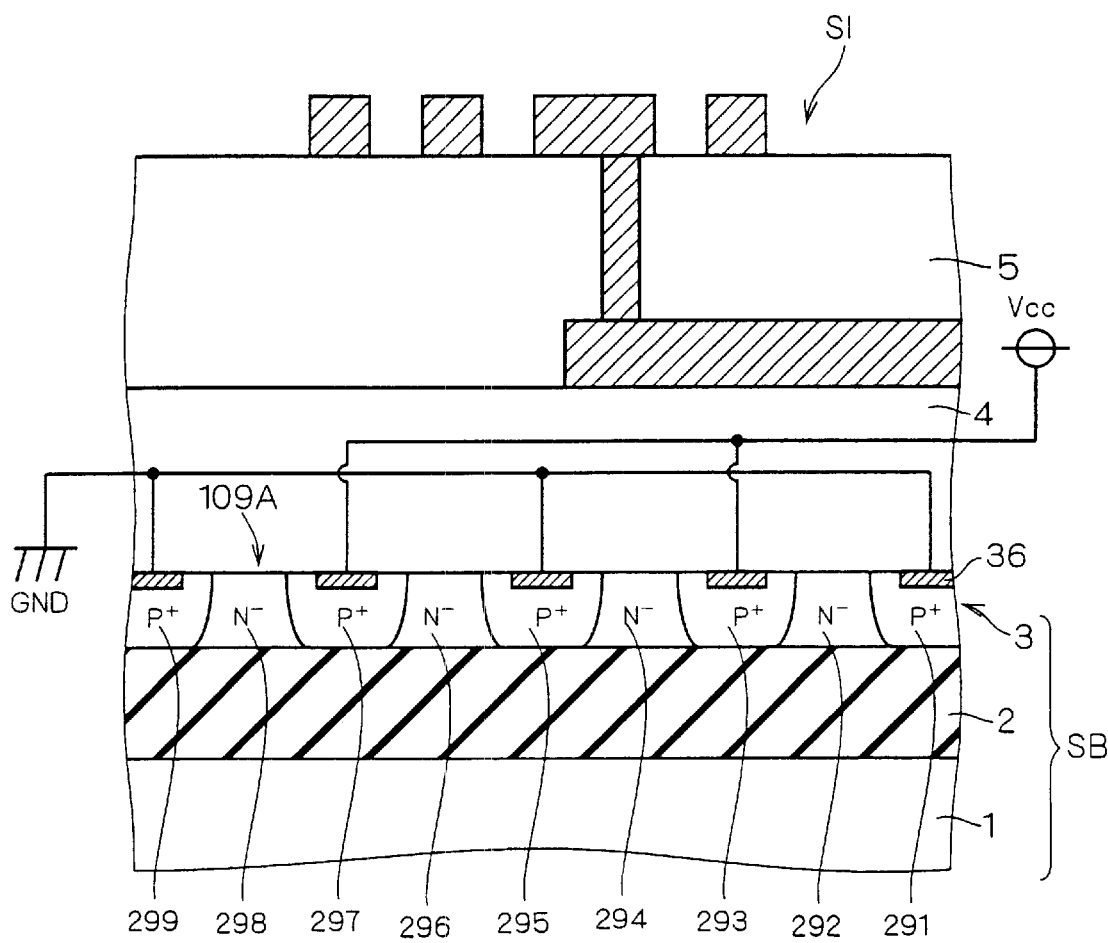
FIG. 36 is a cross-sectional view showing a construction of a modification of the semiconductor device according to the ninth preferred embodiment of the present invention.

In the PG shield 109 of the above described semiconductor device 900, the SOI regions on the opposite (right and left) sides of each P$^-$ region are different in conductivity type from each other. Instead, a PG shield 109A (shield layer) of a semiconductor device 900A as shown in FIG. 36 may be used in which the SOI regions on the opposite sides of the lightly doped region are of the same conductivity type.

More specifically, in the PG shield 109A, the SOI regions 292, 294, 296 and 298 are N$^-$ regions, and the SOI regions 291, 293, 295, 297 and 299 are P$^+$ regions.

The SOI regions 291, 295 and 299 are grounded through the silicide films 36, and the SOI regions 293 and 297 are connected to the power supply potential (Vcc) through the silicide films 36.

The above described arrangement causes a reverse bias to be applied to the diodes formed by the PN junctions, to prevent the diodes from being forward-biased by a counter electromotive force which generates the eddy current. This reduces the electrostatically induced power dissipation without the occurrence of the electromagnetically induced power dissipation resulting from the eddy current.

This modification requires only two types of SOI regions to reduce the number of times of alignment of the implantation masks in the implantation step and accordingly reduce the margin required for the alignment of the masks, thereby making the pattern of the SOI regions more microscopic.

Although the two types of SOI regions are N$^-$ and P$^+$ regions in the above description, P$^-$ and N$^+$ regions may be, of course, used instead.

<J. Tenth Preferred Embodiment>
<J-1. Device Construction>

Figure 37:
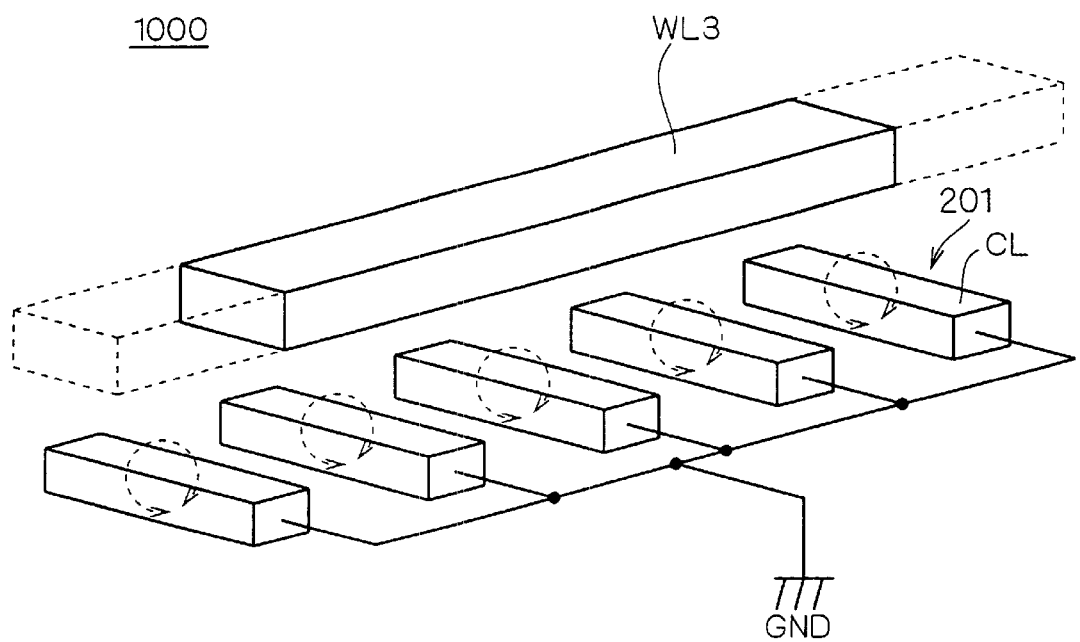
FIG. 37 is a perspective view showing a construction of the semiconductor device according to a tenth preferred embodiment of the present invention.

FIG. 37 shows a construction of a semiconductor device 1000 according to a tenth preferred embodiment of the present invention.

The above described first to ninth preferred embodiments of the present invention illustrate the PG shield constructions for preventing the electrostatically induced power dissipation caused by the spiral inductor and also preventing the electromagnetically induced power dissipation resulting from the eddy current in the PG shield. However, the electrostatically induced power dissipation is caused not only by the spiral inductor but also in linear conductor lines such as metal interconnect lines or in curved conductor lines. In other words, not only inductance elements but also structures having an inductance encounter the same problem. The present invention is applicable to inductance elements other than the spiral inductor and to structures having an inductance. As an example, the present invention is applied to a structure for preventing the electrostatically induced power dissipation caused by the inductance of a linear interconnect line.

The semiconductor device 1000 shown in FIG. 37 comprises a PG shield 201 (shield layer) which includes independent conductor layers CL arranged under and longitudinally of an interconnect line WL3 and grounded to prevent the electrostatically induced power dissipation from being caused by the interconnect line WL3.

Figure 38:
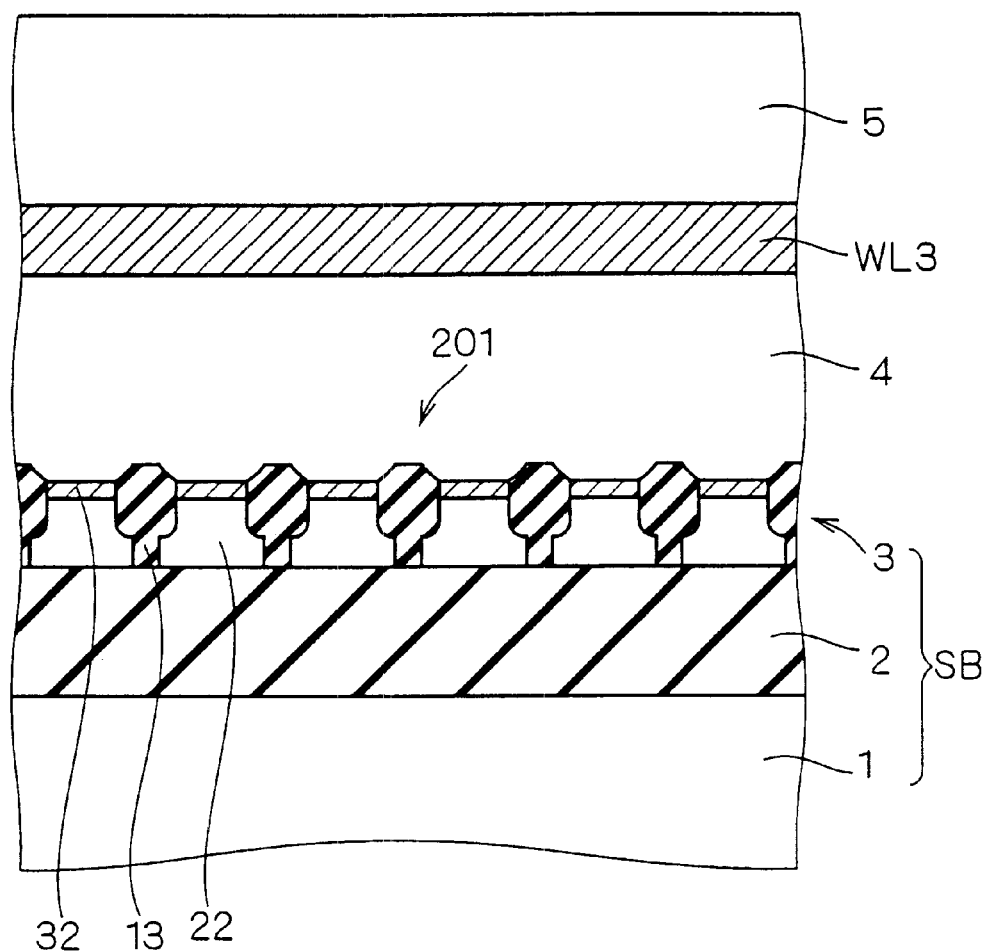
FIG. 38 is a cross-sectional view showing the construction of the semiconductor device according to the tenth preferred embodiment of the present invention.

FIG. 38 shows an example of the cross-sectional configuration of the semiconductor device 1000. Only the RF circuit portion RP of the semiconductor device 1000 is shown FIG. 38 if the semiconductor device 90 described with reference to FIG. 68 is taken as an example.

Referring to FIG. 38, the SOI substrate SB includes the silicon substrate 1, the buried oxide film 2 disposed on the silicon substrate 1, and the SOI layer 3 disposed on the buried oxide film 2. In the SOI substrate SB, a region in the SOI layer 3 corresponding to a region in which the interconnect line WL3 is provided is divided into the plurality of SOI regions 22 by the plurality of trench isolation oxide films 13. The trench isolation oxide films 13 are formed by filling trenches extending from the surface of the SOI layer 3 to the surface of the buried oxide film 2 with a silicon oxide film, and completely electrically isolate the SOI regions 22 from each other.

The silicide film 32 is disposed on each of the SOI regions 22. The plurality of trench isolation oxide films 13, the SOI regions 22 and the silicide films 32 constitute the PG shield 201. Multi-layer films each comprised of one of the SOI regions 22 and a corresponding one of the silicide films 32 correspond to the respective conductor layers CL.

The SOI regions 22 and the silicide films 32 have a rectangular plan configuration extending along the width of the interconnect line WL3 so as to be reliably positioned under the width of the interconnect line WL3 as shown in FIG. 37.

Although the spiral inductor generates the eddy current in the PG shield within a plane parallel to the main surface of the semiconductor substrate, the linear interconnect line WL3 generates eddy current within planes perpendicular to the semiconductor substrate as indicated by the dotted line arrows of FIG. 37. Therefore, the thickness of the conductor layers CL is preferably smaller, and is made at least less than the transverse dimension (or width) of the conductor layers CL.

The longitudinal dimension (or length) of the conductor layers CL and the spacing between the conductor layers CL are set at about 1 to 3 $\mu$ml.

The cross-sectional configuration of the PG shield 201 shown in FIG. 38 is cited merely by way of example and without limitation.

J-2. Function and Effect>

As described above, the semiconductor device 1000 comprises the PG shield 201 including the independent conductor layers CL arranged under and longitudinally of the interconnect line WL3 to prevent the electrostatically induced power dissipation from being caused by the interconnect line WL3.

Further, since the PG shield 201 is formed in the SOI layer 3, no additional conductor layer is required to form the PG shield 201, and the device structure is not complicated.

<J-3. Modification>

To prevent the eddy current from being generated in the conductor layers CL within the planes perpendicular to the semiconductor substrate, it is effective to provide the conductor layers CL in the form of a multi-layer film comprised of a conductor film and an insulation film.

Figure 39:
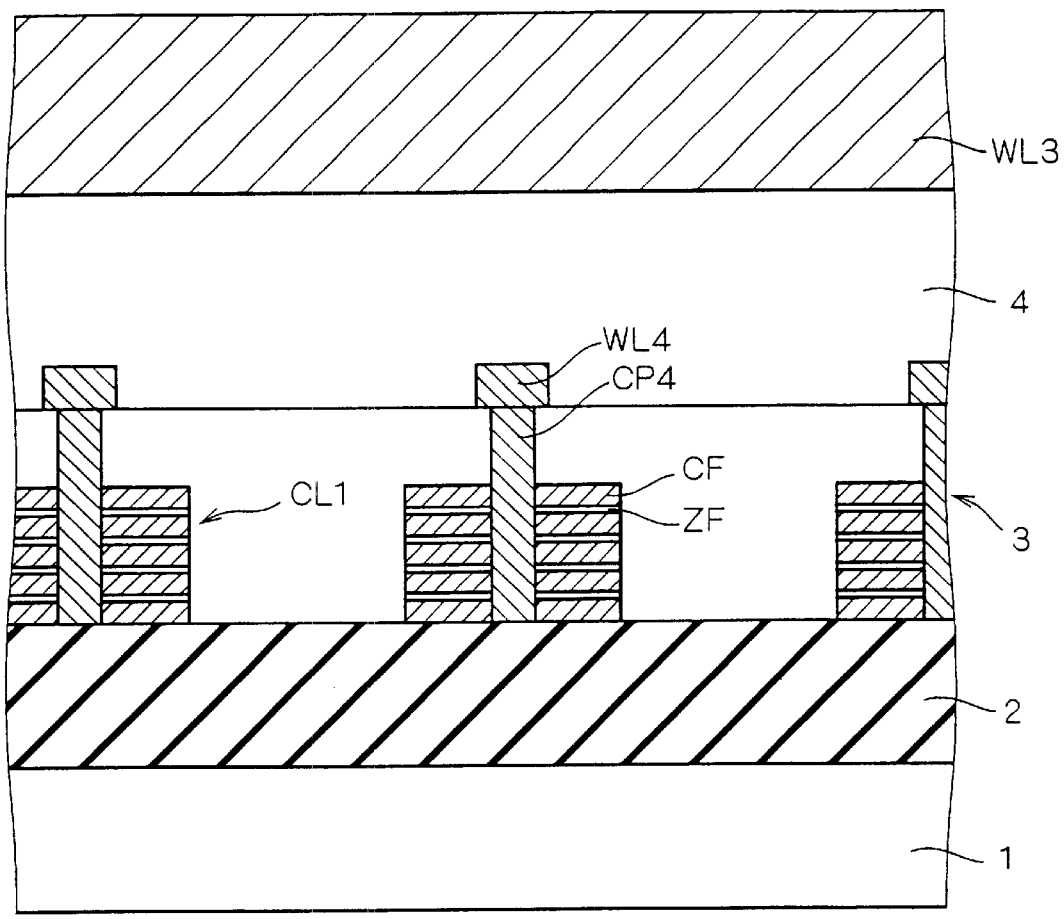
FIG. 39 is a cross-sectional view showing a construction of a modification of the semiconductor device according to the tenth preferred embodiment of the present invention.

More specifically, a semiconductor device 1001 as shown in FIG. 39 has conductor layers CL1 each in the form of a multi-layer film comprised of alternating conductor films CF and insulation films ZF in the SOI layer 3.

Electric connection between the conductor films CF are established by a contact portion CP4 extending through the SOI layer 3 and each of the conductor layers CL1. The contact portion CP4 is connected to an interconnect line WL4 formed on the SOI layer 3 connected to the ground potential.

The above described arrangement allows the insulation films ZF to interrupt the eddy current generated in the conductor layers CL1 within the planes perpendicular to the semiconductor substrate, to avoid the electromagnetically induced power dissipation resulting from the eddy current.

The multi-layer film may be replaced with a superlattice film comprised of alternating conductors and insulators of superlattice structures.

<K. Eleventh Preferred Embodiment>

The above described first to tenth preferred embodiments of the present invention illustrate the PG shield constructions in the semiconductor device formed on the SOI substrate for preventing the electrostatically induced power dissipation caused by the spiral inductor or the interconnect line and also preventing the electromagnetically induced power dissipation resulting from the eddy current in the PG shield. The present invention is applicable not only to the SOI substrate but also to a silicon substrate known as a bulk substrate.

<K-1. Device Construction>

Figure 40:
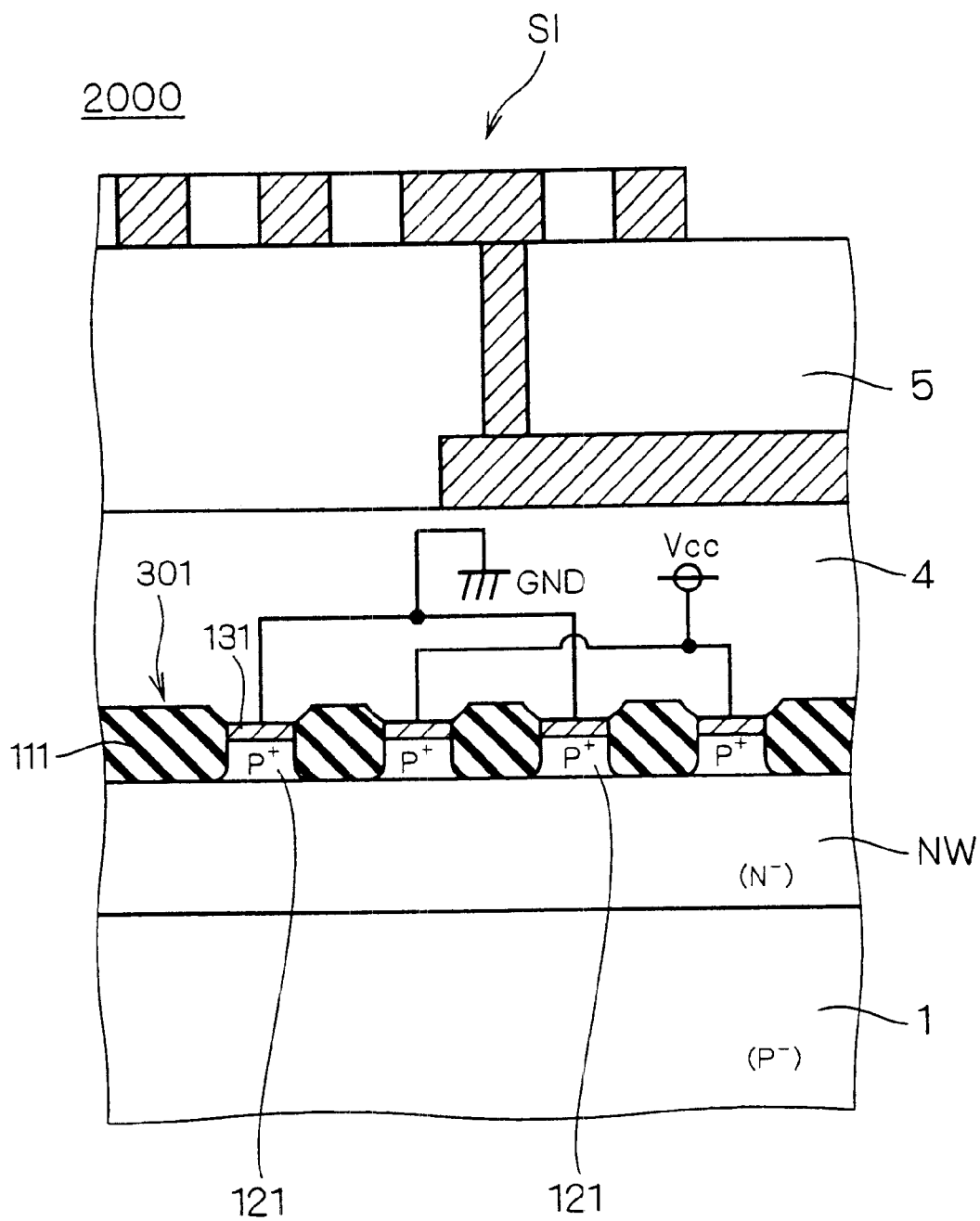
FIG. 40 is a cross-sectional view showing a construction of the semiconductor device according to an eleventh preferred embodiment of the present invention.

FIG. 40 shows a construction of a semiconductor device 2000 according to an eleventh preferred embodiment of the present invention. Only the RF circuit portion RP of the semiconductor device 2000 is shown FIG. 40 if the semiconductor device 90 described with reference to FIG. 68 is taken as an example.

Referring to FIG. 40, a region in the P type silicon substrate 1 corresponding to the region in which the spiral inductor SI (whose plan configuration is shown in FIG. 70) is provided is divided into a plurality of doped regions 121 which are implanted with a P type impurity of a relatively high concentration ($P^+$) by a plurality of trench isolation oxide films 111. The trench isolation oxide films 111 are formed by filling trenches extending from the surface of the silicon substrate 1 to a predetermined depth with a silicon oxide film.

A well region NW implanted with an N type impurity of a relative low concentration ($N^-$) underlies the doped regions 121.

A silicide film 131 is disposed on each of the doped regions 121. The plurality of trench isolation oxide films 111, the doped regions 121 and the silicide films 131 constitute a PG shield 301 (shield layer).

The constituents of the semiconductor device 2000 similar to those of the semiconductor device 100 of FIG. 1 are designated by the same reference characters, and are not particularly described.

The cross-sectional configuration shown in FIG. 40 is cited merely by way of example and without limitation. The various PG shield constructions described in the first to tenth preferred embodiments may be applied to the semiconductor device 2000.

<K-2. Function and Effect>

As described above, the lightly-doped well region is formed in the substrate, and the PG shield is formed on the lightly-doped well region. The lightly-doped well region having a high resistance serves as a substitute for the buried oxide film to provide electric isolation between the doped regions 121. Therefore, the PG shield capable of preventing the electrostatically induced power dissipation without the occurrence of the electromagnetically induced power dissipation resulting from the eddy current is provided also in the bulk substrate.

<L. Twelfth Preferred Embodiment>

The above described first to eleventh preferred embodiments of the present invention illustrate the various PG shield constructions for preventing the electrostatically induced power dissipation caused by the spiral inductor or the interconnect line and also preventing the electromagnetically induced power dissipation resulting from the eddy current in the PG shield. There is a likelihood that the electromagnetically induced power dissipation caused by the spiral inductor or the interconnect line occurs in the semiconductor substrate under the PG shield. A construction for preventing the electromagnetically induced power dissipation in the semiconductor substrate will be described.

<L-1. Device Construction>

Figure 41:
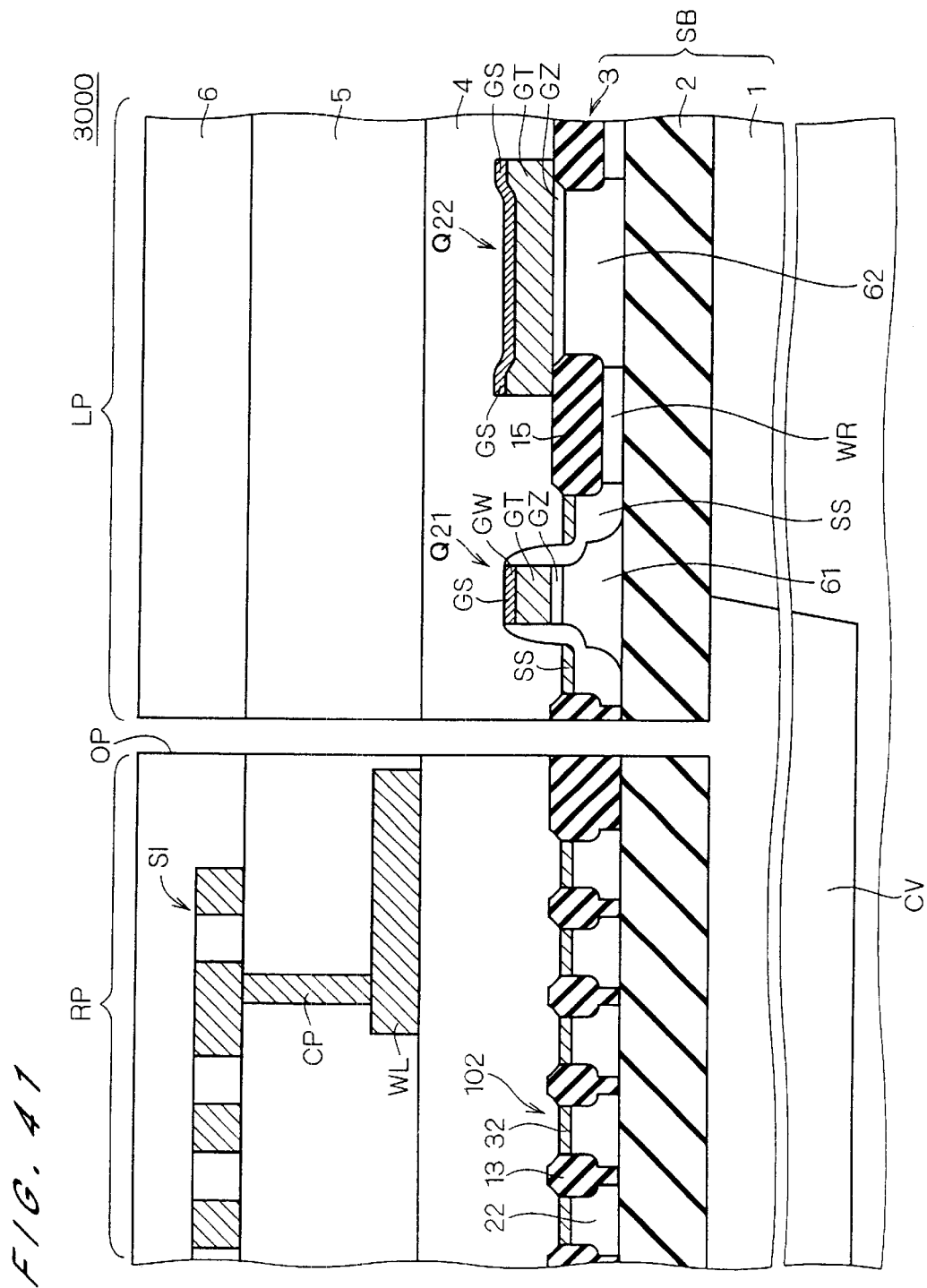
FIG. 41 is a cross-sectional view showing a construction of the semiconductor device according to a twelfth preferred embodiment of the present invention.

FIG. 41 shows a construction of a semiconductor device 3000 according to a twelfth preferred embodiment of the present invention.

The semiconductor device 3000 comprises the RF circuit portion RP and the logic portion LP, as shown in FIG. 41, which correspond to parts of the RF circuit portion 91 and the logic portion 92 of, by way of example, the semiconductor device 90 illustrated with reference to FIG. 68.

Referring to FIG. 41, the RF circuit portion RP and the logic portion LP are disposed on the SOI substrate SB including the silicon substrate 1, the buried oxide film 2 disposed on the silicon substrate 1, and the SOI layer 3 disposed on the buried oxide film 2.

In the RF circuit portion RP, a region in the SOI layer 3 corresponding to the region in which the spiral inductor SI (whose plan configuration is shown in FIG. 70) is provided is divided into the plurality of SOI regions 22 by the plurality of trench isolation oxide films 13. The silicide film 32 is disposed on each of the SOI regions 22. The plurality of trench isolation oxide films 13, the SOI regions 22 and the silicide films 32 constitute the PG shield 102.

A cavity CV is provided in the silicon substrate 1 under the PG shield 102.

The cavity CV has a depth (a maximum of about 100 $\mu$m) approximately equal to the length, as viewed in plan, of the spiral inductor SI, and extends to contain at least the region in which the spiral inductor SI is formed, as viewed in plan.

An opening OP is provided which extends through the buried oxide film 2, the SOI layer 3, the interlayer insulation films 4, 5 and the insulation film 6 covering the spiral inductor SI to reach the cavity CV.

The constituents of the semiconductor device 3000 similar to those of the semiconductor device 200 of FIG. 8 are designated by the same reference characters, and are not particularly described.

As an example, a method of forming the cavity CV comprises: forming on the SOI substrate SB a structure having the elements previous to and including the insulation film 6 except the cavity CV; forming the opening OP extending to the silicon substrate 1; and introducing, for example, a 20% solution of KOH (potassium hydroxide) into the opening OP to etch the silicon substrate 1. The opening OP is ultimately filled with an insulation film or the like.

The etching solution is not limited to the KOH solution, but may be other solutions which dissolve only the silicon substrate. For example, a strongly alkaline solution such as NaOH may be used. Such solutions require attention to be given to potassium (K) or sodium (Na) contamination, but are easy to treat since they are simple materials. Organic materials may also be used such as an aqueous solution of catechol ($C_6H_6O_2$) or TMAH (tetramethyl ammonium hydroxide or $N(CH_3)_4OH$). Selection between the solutions should be made in accordance with the entire organization of a semiconductor factory in which devices are manufactured. The etching solution such as the KOH solution has different etch rates depending on temperature. The 20% solution of KOH has an etch rate of 100 nm/min at 50° C.

The cavity CV may be formed when no elements are formed on the SOI substrate SB or after the step of forming the PG shield 102. In principle, the cavity CV may be formed in any manufacturing step.

<L-2. Function and Effect>

As described above, the semiconductor device 3000 comprises the cavity CV in the silicon substrate 1 under the PG shield 102. Therefore, the PG shield 102 can prevent the electrostatically induced power dissipation from being caused by the spiral inductor, without the occurrence of the electromagnetically induced power dissipation resulting from the eddy current generated in the PG shield 102. Additionally, the semiconductor device 3000 can prevent the eddy current from being generated in the silicon substrate 1 by the spiral inductor SI to reduce the electromagnetically induced power dissipation.

Although the PG shield 102 is employed in the above described semiconductor device 3000, the configuration of the PG shield is not limited to this. It is needless to say that the various PG shields described in the first to ninth preferred embodiments are also applicable.

<M. Thirteenth Preferred Embodiment>

The above described twelfth preferred embodiment illustrates the construction of the semiconductor device which comprises the cavity CV in the silicon substrate 1 to reduce the electromagnetically induced power dissipation in the silicon substrate 1. The construction for reducing the electromagnetically induced power dissipation in the silicon substrate 1 is not limited to that of the twelfth preferred embodiment. A porous layer may be provided in the silicon substrate 1 to interrupt the path of the eddy current.

The term "porous layer," as used in this specification, means not only a layer having a multiplicity of holes but also a layer having a multiplicity of trenches.

<M-1. Device Construction>

Figure 42:
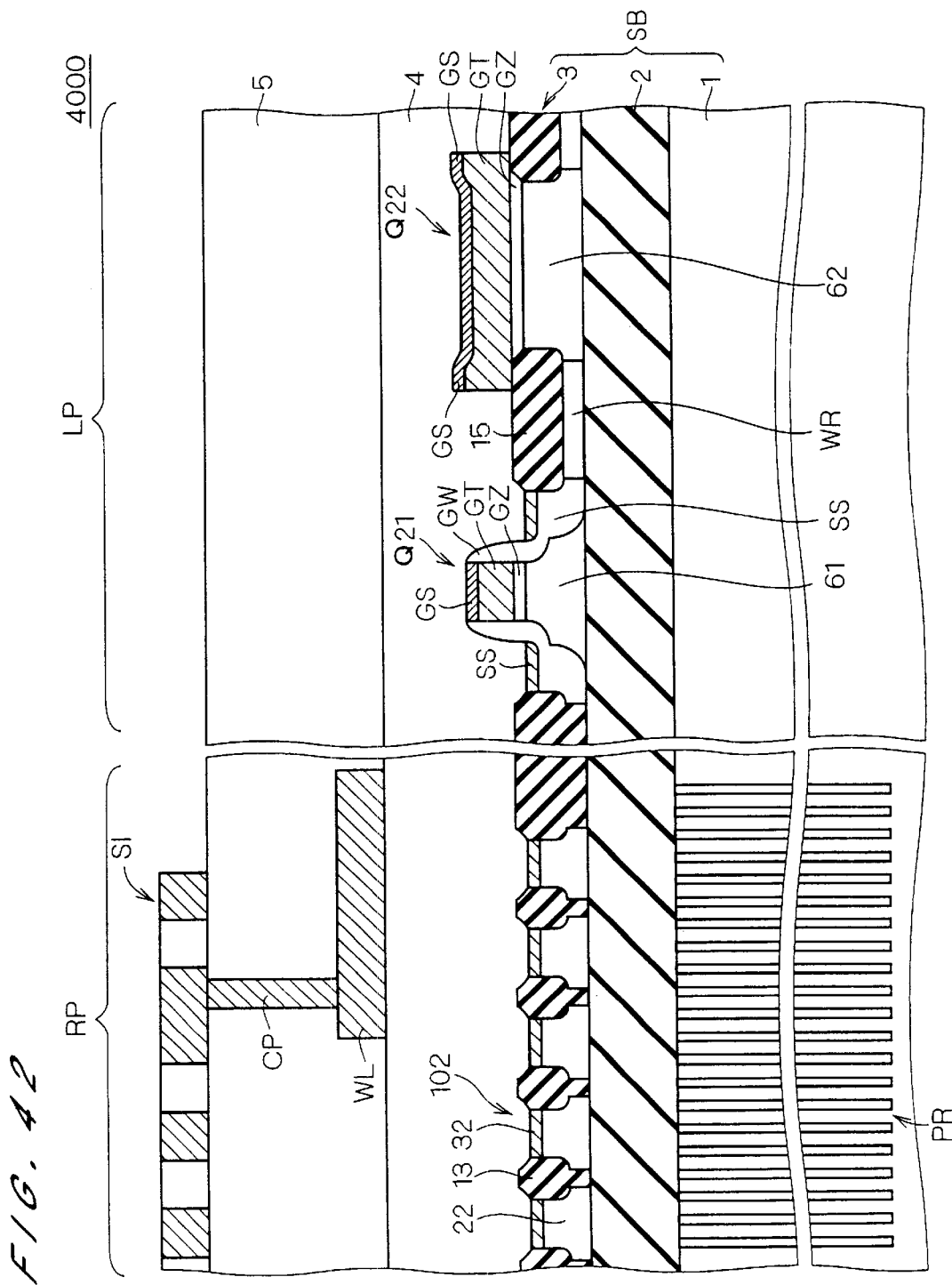
FIG. 42 is a cross-sectional view showing a construction of the semiconductor device according to a thirteenth preferred embodiment of the present invention.

FIG. 42 shows a construction of a semiconductor device 4000 according to a thirteenth preferred embodiment of the present invention.

The constituents provided above the buried oxide film 2 of FIG. 42 are similar to those in the semiconductor device 200 described with reference to FIG. 8. The constituents of the semiconductor device 4000 similar to those of the semiconductor device 200 of FIG. 8 are designated by the same reference characters, and are not particularly described.

Referring to FIG. 42, a porous layer PR is provided in the silicon substrate 1 under the PG shield 102.

The porous layer PR includes a plurality of trenches or holes formed by etching and extending from the surface of the silicon substrate 1 to the interior thereof or a plurality of holes formed by an anodization process. The trenches or holes are filled with near-vacuum or insulator.

This interrupts the path of the eddy current generated by the spiral inductor SI to reduce the electromagnetically induced power dissipation in the silicon substrate 1.

The plan configuration of the porous layer PR may be such that, when the holes are used, the holes are arranged regularly or irregularly throughout a predetermined region and, when the trenches are used, the trenches extending in at least one direction are arranged in parallel, thereby to interrupt the eddy current.

Although the PG shield 102 is employed in the above described semiconductor device 4000, the configuration of the PG shield is not limited to this. It is needless to say that the various PG shields described in the first to ninth preferred embodiments are also applicable.

<M-2. Manufacturing Method>

With reference to FIGS. 43 through 53, description will be given on a method of forming the SOI substrate SB having the porous layer PR.

<M-2-1. Etching Process>

A method of forming the porous layer PR by etching will be described with reference to FIGS. 43 through 46. For the purpose of clarity, the porous layer formed by etching is referred to hereinafter as a porous layer PR1, and the porous layer formed by the anodization process is referred to hereinafter as a porous layer PR2.

Figure 43:
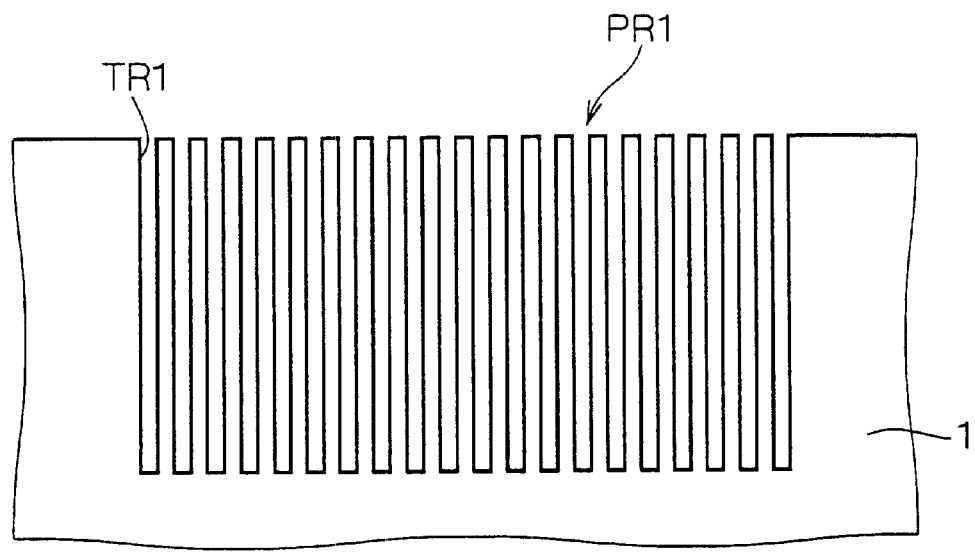
FIGS. 43 through 46 are cross-sectional views showing manufacturing steps of the semiconductor device according to the thirteenth preferred embodiment of the present invention.

First, as shown in FIG. 43, the silicon substrate 1 is prepared, and a plurality of trenches TR1 (or a plurality of holes) extending from the surface of the silicon substrate 1 to the interior thereof are formed by etching to form the porous layer PR1. The plurality of trenches (or holes) TR1 are disposed throughout a region underlying at least the PG shield 102, and have a width or a diameter ranging from about 10 nm to about 50 nm. The porous layer PR1 has a thickness ranging from about 10 μm to about 100 μm.

The depth of the trenches (or holes) TR1 (i.e., the thickness of the porous layer PR1) is preferably approximately equal to the length of the spiral inductor SI, as viewed in plan. However, the depth of the trenches (or holes) TR1 which is about one-tenth the length of the spiral inductor SI as viewed in plan can produce the effect of reducing the electromagnetically induced power dissipation.

Figure 44:
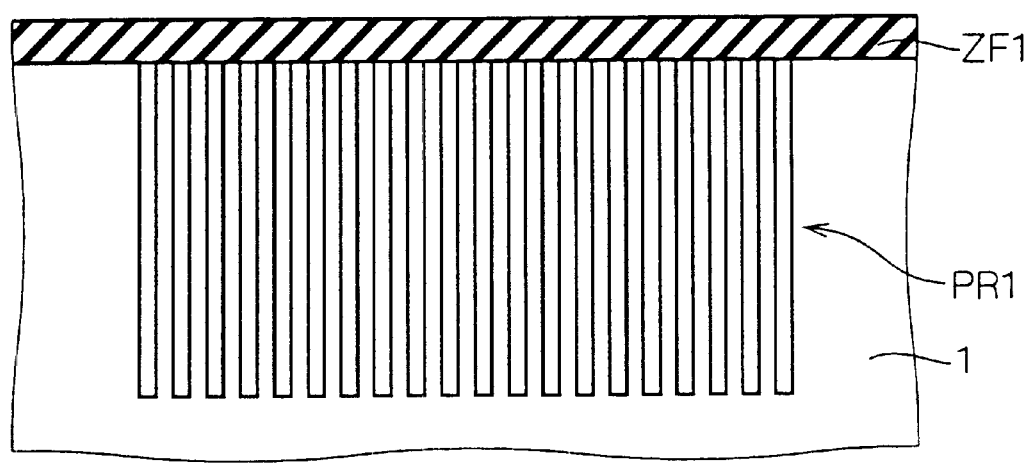

Next, in the step shown in FIG. 44, an insulation film ZF1 made of, for example, silicon oxide is formed to cover the silicon substrate 1, thereby burying the porous layer PR1.

Figure 45:
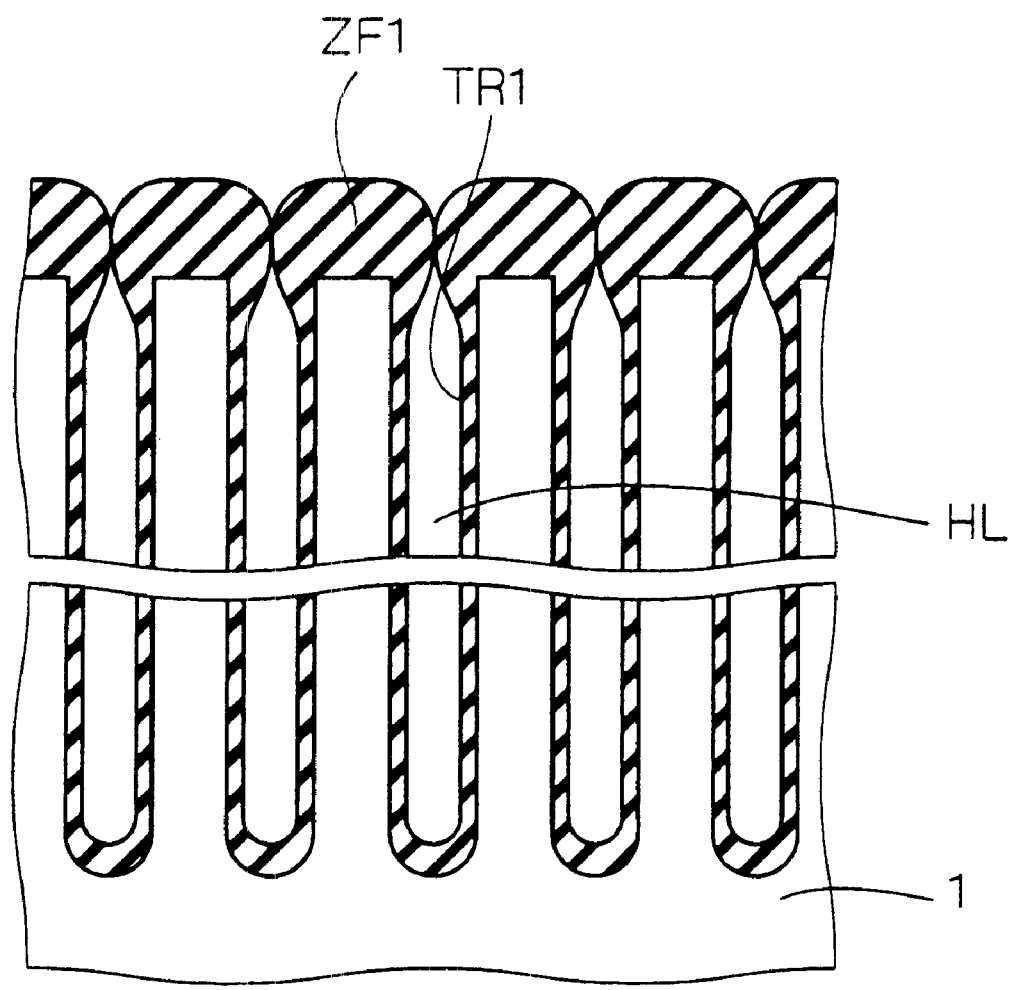

FIG. 45 shows the details of the porous layer PR1, with the insulation film ZF1 formed thereon. As shown in FIG. 45, the insulation film ZF1 is disposed to cover the inner surfaces of the trenches (or holes) TR1 of the porous layer PR1. The use of an insulation film having a coverage property of closing the openings of the respective trenches (or holes) TR1 earlier than completely filling the interior thereof as the insulation film ZF1 produces hollows HL in the respective trenches (or holes) TR1.

In this step, when the insulation film ZF1 is formed in a vacuum environment, a vacuum is maintained in the hollows HL to reduce the electrostatically induced power dissipation because of its low dielectric constant.

When filling the trenches (or holes) TR1 with the insulation film, the use of a low-dielectric-constant insulation film, e.g. a fluorine-containing plasma oxide film (a silicon oxide film formed by a plasma CVD process), as the above-mentioned insulation film reduces the electrostatically induced power dissipation.

When a thermal oxide film is formed by thermal oxidation, the hollows HL may be formed in the respective trenches (or holes) TR1 in the above-mentioned manner.

When the trenches (or holes) TR1 are filled with the silicon oxide film or the like, fluorine (F) ions may be implanted into the silicon oxide film or the like to lower the dielectric constant.

Figure 46:
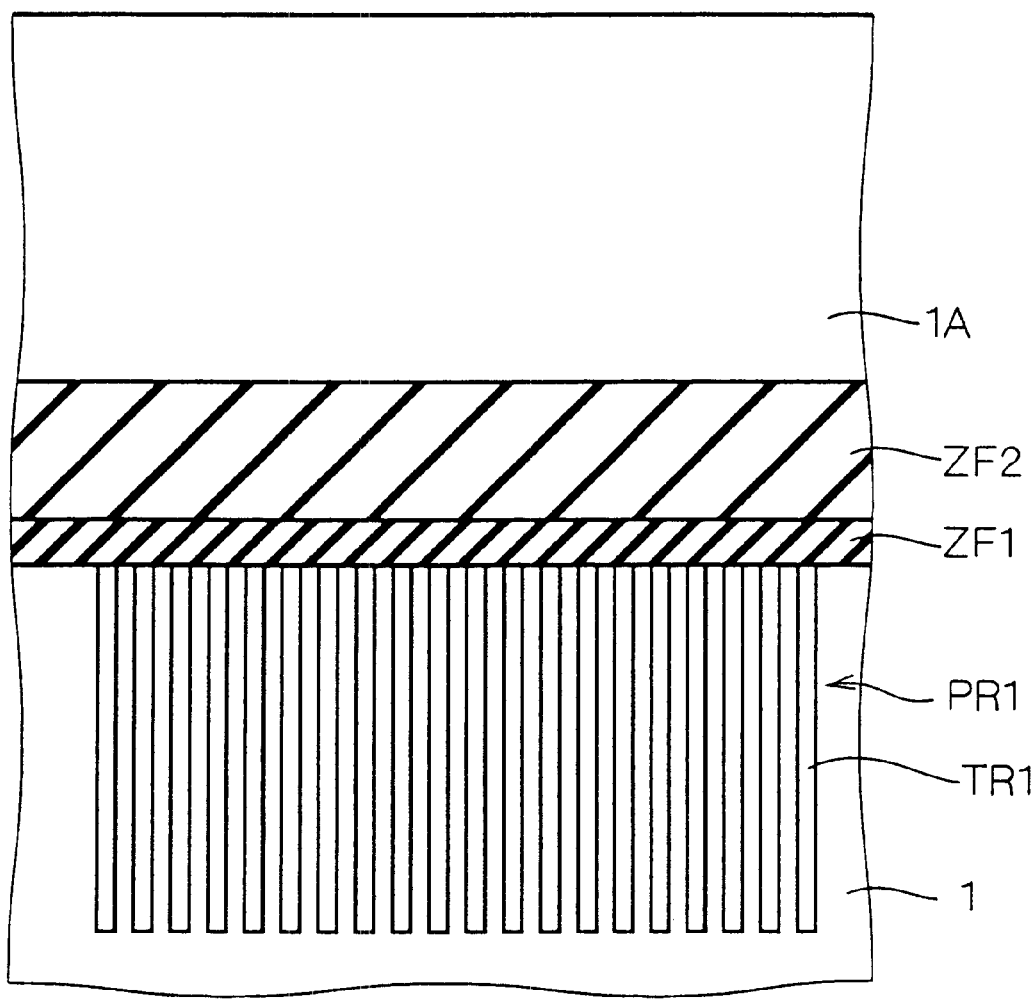

Next, in the step shown in FIG. 46, a silicon substrate 1A with an insulation film ZF2 (e.g., a silicon oxide film) of a predetermined thickness formed on a main surface thereof is prepared. The silicon substrates 1A and 1 are bonded together so that the insulation films ZF1 and ZF2 are in face-to-face relation.

Thereafter, a CMP process is performed on the silicon substrate 1A to reduce the thickness of the silicon substrate 1A. The remaining silicon substrate 1A serves as the SOI layer 3, and the insulation films ZF1 and ZF2 serve as the buried oxide film 2. In this manner, the SOI substrate SB including the silicon substrate 1 with the porous layer PR1 formed therein is provided.

Although the step of covering the porous layer PR1 with the insulation film ZF1 to form the hollows HL in the porous layer PR1 is illustrated above, the openings of the respective trenches or holes constituting the porous layer PR1 may be closed in a manner to be described below.

Figure 47:
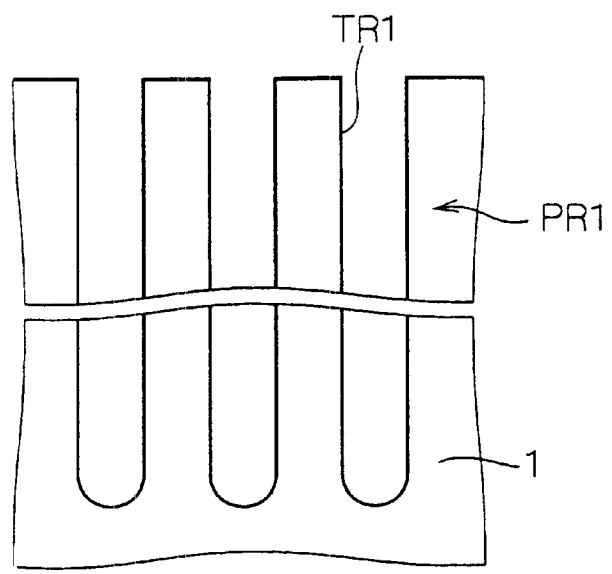
FIGS. 47 through 49 are cross-sectional views showing the steps of providing hollows in a porous layer by hydrogen annealing.
Figure 48:
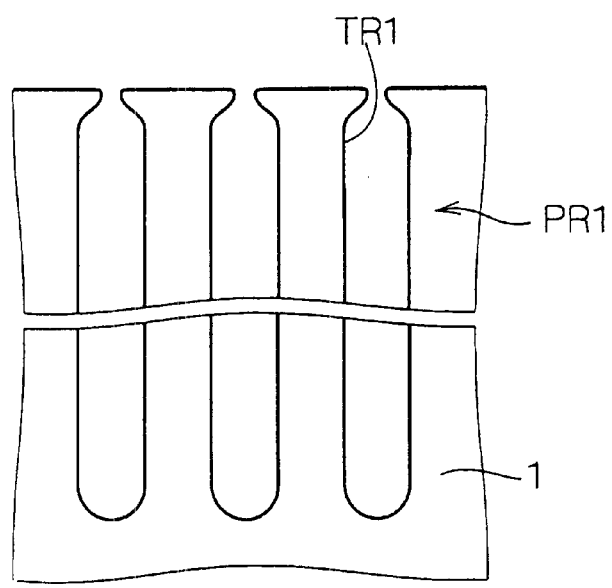
Figure 49:
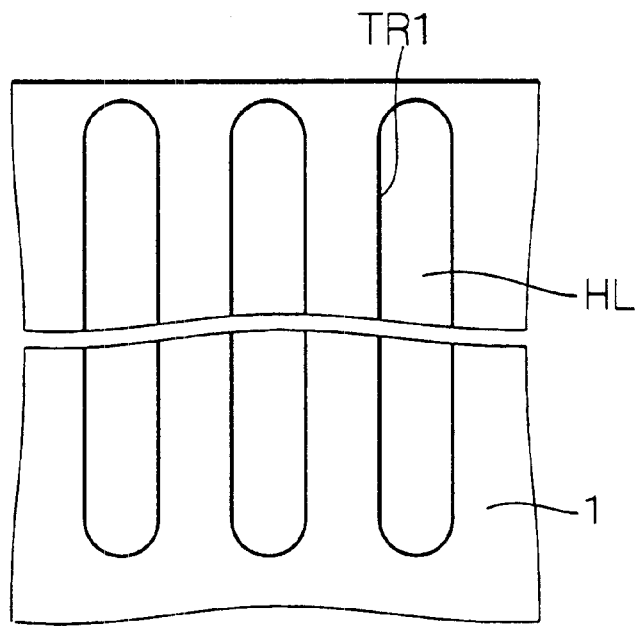

The trenches (or holes) TR1 are formed in the silicon substrate 1 as shown in FIG. 47. Thereafter, heat treatment (hydrogen annealing) at a temperature of 1000° C. or higher is performed in a hydrogen atmosphere for a few seconds. This dramatically enhances the mobility of surface atoms because of the minimization of surface energy of the porous layer PR1. Accordingly, natural oxidation of the surface causes the removal the openings of the respective trenches (or holes) TR1 by reduction (FIG. 48). Connsequently, the interiors of the respective trenches (or holes) TR1 become the hollows HL, and the porous layer PR1 having a smoothed upper surface is formed (FIG. 49).

The subsequent step is similar to the step shown in FIG. 46. Since the insulation film need not be formed on the surface of the silicon substrate 1, the silicon substrates 1 and 1A are bonded together so that the insulation film ZF2 of the silicon substrate 1A is in face-to-face relationship with one of the main surfaces of the silicon substrate 1 in which the porous layer PR1 is formed.

<M-2-2. Anodization Process>

A method of forming the porous layer PR by the anodization process will be described with reference to FIGS. 50 through 53. The formation of the porous layer by the anodization process is disclosed in FIGS. 6 through 10 of Japanese Patent Application No. 11-117770 (1999). The entire disclosure of Japanese Patent Application No. 11-117770 (U.S. patent application Ser. No. 09/396,358 filed on Sep. 15, 1999) is herein incorporated by reference.

The method is described based on the above disclosure. Prepared is an anodizing bath including an upper platinum electrode acting as a cathode and a lower platinum electrode acting as an anode which are opposed to each other, and having an interior to be filled with an anodizing solution.

Next, the silicon substrate 1 is placed between the upper and lower platinum electrodes so that one of the main surfaces thereof in which the porous layer PR2 is to be formed is opposed to the upper platinum electrode, and the anodizing bath is filled with an HF solution. Then, current is caused to flow through the silicon substrate 1. Under the anodization conditions of anodizing time of 30 seconds and an anodizing current density of 10 mA/cm$^2$, the upper surface of the silicon substrate 1 is rendered porous, and the porous layer PR2 having a thickness of about 0.2 μm is formed in the main surface of the silicon substrate 1.

The holes formed in the porous layer PR2 are not of linear shape as formed by etching but of complicated shape. For simplification, the holes are shown as having the shape of FIG. 50.

The thickness of the porous layer PR2 is controllable by the anodizing time and the anodizing current density, and is also controllable depending on the types of the anodizing solution. The density of the porous layer PR2 (corresponding to the ratio between silicon part and hole part) is controllable by the concentration of the HF solution.

The thickness of the porous layer PR2 is preferably approximately equal to the length of the spiral inductor SI, as viewed in plan. However, the thickness of the porous layer PR2 which is about one-tenth the length of the spiral inductor SI as viewed in plan can produce the effect of reducing the electromagnetically induced power dissipation.

Figure 50:
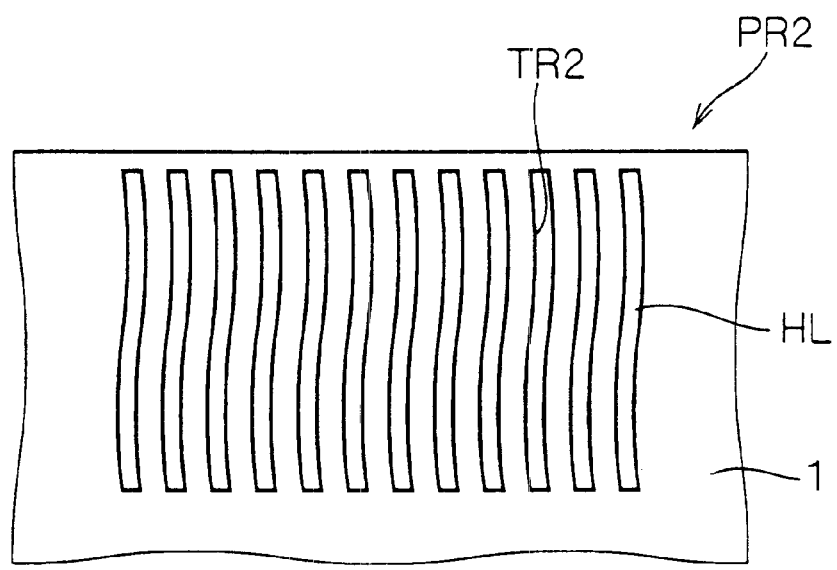

Next, as described above, heat treatment at a temperature of 1000° C. or higher is performed in a hydrogen atmosphere for a few seconds, to cause the removal of the openings of the respective holes by reduction. Consequently, the interiors of the holes become the hollows HL, and the porous layer PR2 having a smoothed upper surface is formed (FIG. 50).

The porous layer PR2 is selectively formed in the silicon substrate 1 so as to correspond to the region in which the spiral inductor SI is to be formed later. A mask should be formed on a region in which the porous layer PR2 is not to be formed, to prevent the HF solution from contacting the region. It is needless to say that the porous layer PR2 may be disposed throughout the silicon substrate 1.

The arrangement of the porous layer PR2 throughout the silicon substrate 1 produces not only the effect of reducing the electromagnetically induced power dissipation caused by the spiral inductor but also the effect of reducing the electromagnetically induced power dissipation caused by the interconnect line.

Figure 51:
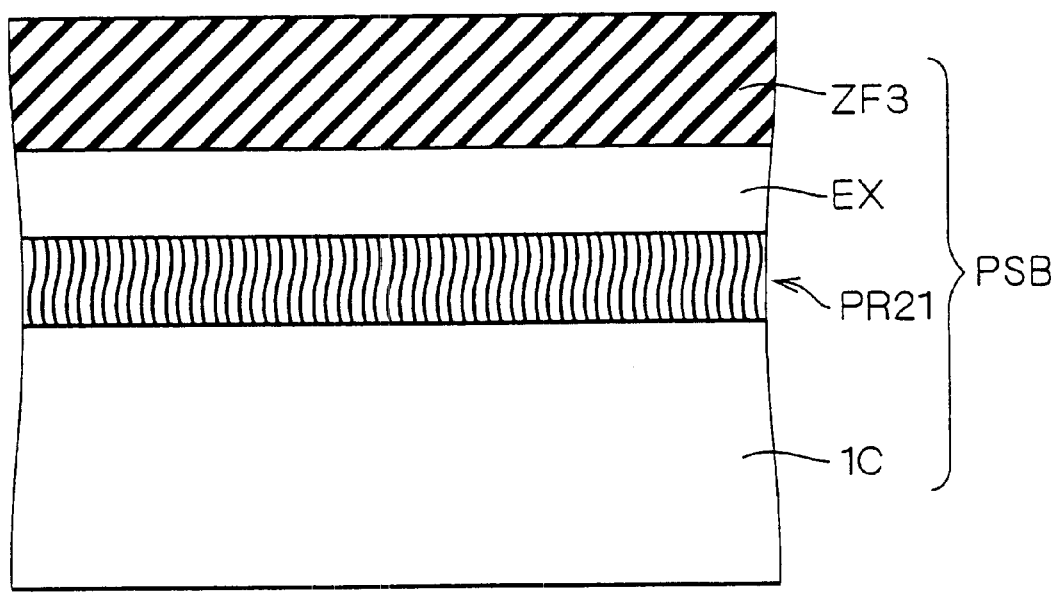

Next, as shown in FIG. 51, a porous substrate PSB is prepared in which a porous layer PR21, an epitaxial layer EX and an insulation film ZF3 are formed in stacked relation on a silicon substrate 1C.

The method disclosed in FIGS. 6 through 10 of Japanese Patent Application No. 11-117770 may be used to form the porous substrate PSB. Steps similar to those of the above-mentioned method of forming the porous layer PR2 are performed to form the porous layer PR21 in the silicon substrate 1C. A single crystal structure of the silicon substrate 1C is maintained in the upper surface of the porous layer PR21, which is similar in crystal orientation to the silicon substrate 1C. Next, the epitaxial layer EX of a predetermined thickness is formed on a main surface of the porous layer PR21 by an epitaxial growth technique. The epitaxial layer EX which will act as the SOI layer 3 later is made as thick as the SOI layer 3.

Thereafter, the insulation film ZF3 having a predetermined thickness and made of, for example, silicon oxide is formed on the epitaxial layer EX. The insulation film ZF3 which will act as the buried oxide film 2 later is made as thick as the buried oxide film 2.

Figure 52:
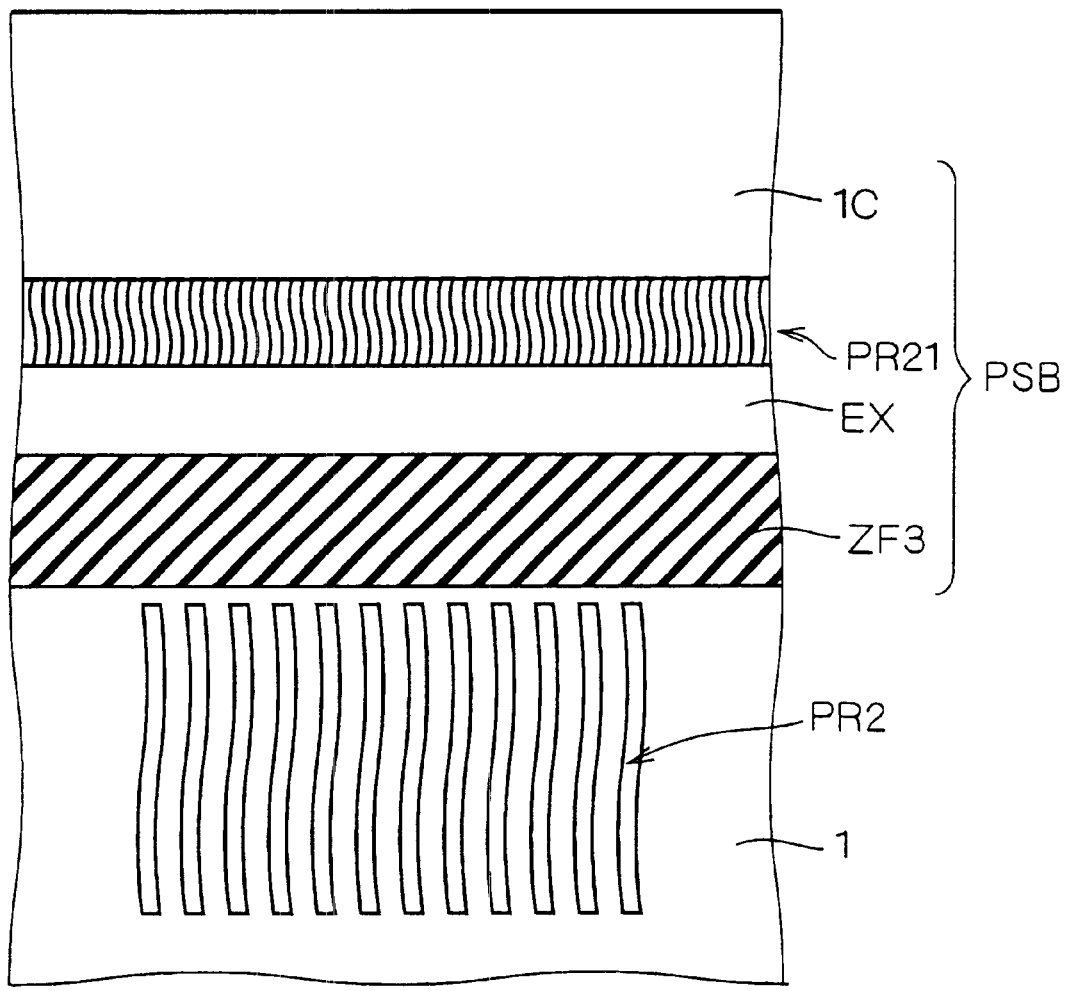

Next, in the step shown in FIG. 52, the silicon substrate 1 and the porous substrate PSB are bonded together so that one of the main surfaces of the silicon substrate 1 in which the porous layer PR2 is formed and the insulation film ZF3 of the porous substrate PSB are in face-to-face relation.

Thereafter, as shown in FIG. 53, the porous layer PR21 and the silicon substrate 1C are removed from the resultant structure, using the porous layer PR21 of the porous substrate PSB as a boundary. Alternatively, the resultant structure is polished down to the upper surface of the epitaxial layer EX by a CMP process. This provides the SOI substrate SB including the silicon substrate 1 with the porous layer PR2 formed therein.

<M-3. Function and Effect>

As described above, the PG shield 102 in the semiconductor device 4000 shown in FIG. 42 can prevent the electrostatically induced power dissipation from being caused by the spiral inductor, without the occurrence of the electromagnetically induced power dissipation resulting from the eddy current generated in the PG shield 102. Additionally, the semiconductor device 4000 has the porous layer PR formed in the silicon substrate 1, and the trenches or holes of the porous layer PR are filled with near-vacuum or insulator. Therefore, the semiconductor device 4000 can interrupt the path of the eddy current generated by the spiral inductor SI to reduce the electromagnetically induced power dissipation in the silicon substrate 1.

<M-4. Modification>

The method of forming the porous layer PR in the semiconductor device 4000 is illustrated as comprising preparing the SOI substrate SB having the porous layer PR and then forming the constituents including the PG shield 102 on the SOI substrate SB. Alternatively, a manufacturing method to be described with reference to FIG. 54 may be employed.

Figure 54:
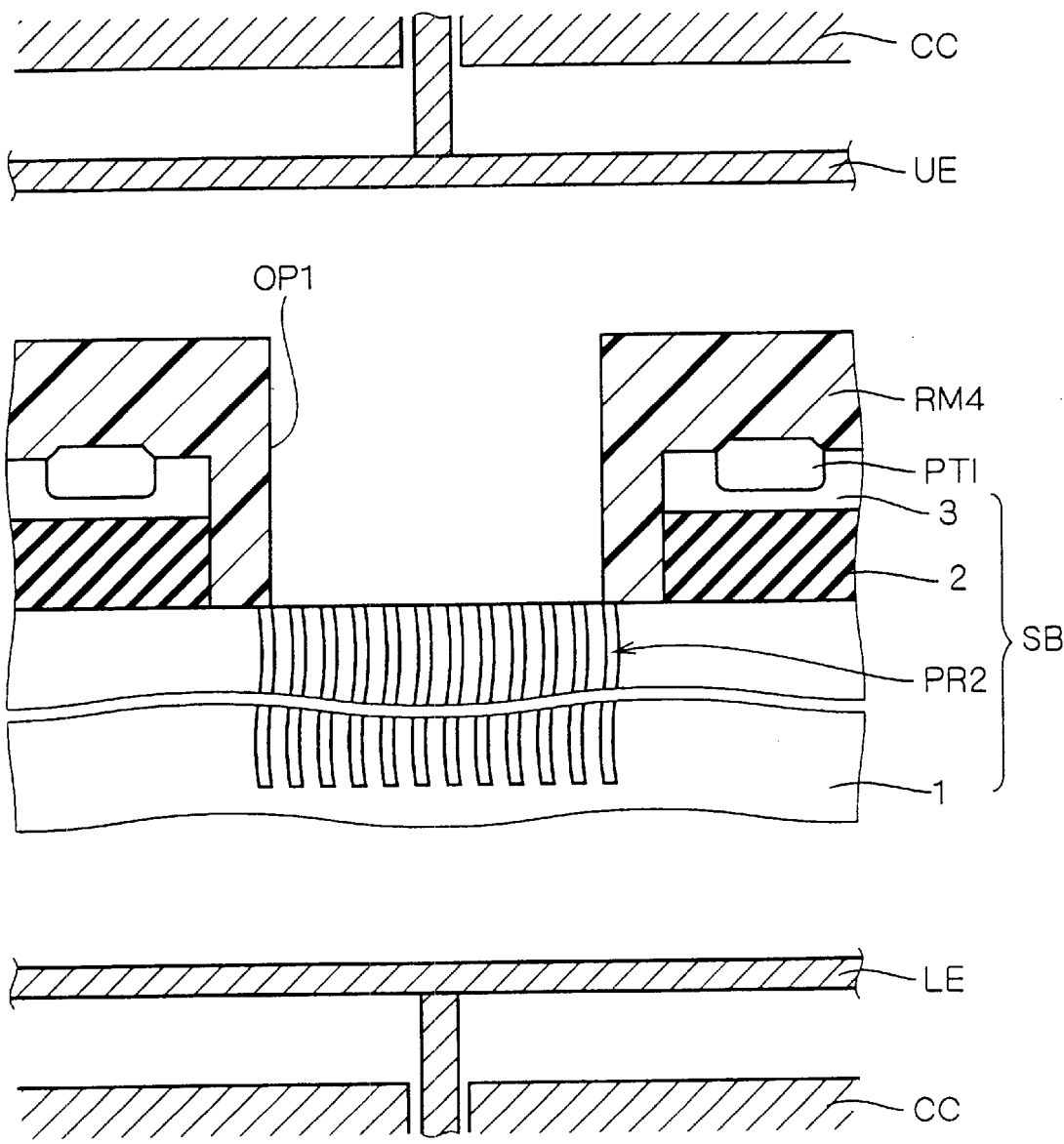
FIG. 54 is a cross-sectional view showing another method of forming the porous layer by the anodization process.

As shown in FIG. 54, the SOI substrate SB is prepared in which constituents such as trench isolation oxide films PTI are formed on the SOI layer 3. Not only the trench isolation oxide films PTI but also MOS transistors and the like may be formed in the SOI layer 3.

Parts of the SOI layer 3 and the buried oxide film 2 which correspond to the region in which the spiral inductor is to be provided are selectively removed from the SOI substrate SB, to form an opening OP1.

Thereafter, a resist mask RM4 is formed which exposes part of the silicon substrate 1 in which the porous layer PR2 is to be formed, and covers the edges of the opening OP1 and the SOI layer 3.

The SOI substrate SB with the resist mask RM4 formed thereon is placed in an anodizing bath CC including an upper platinum electrode UE and a positive lower platinum electrode LE. The anodizing bath CC is filled with the HF solution, and current is caused to flow between the upper platinum electrode UE and the positive lower platinum electrode LE. This forms the porous layer PR2 in the exposed part of the silicon substrate 1.

After the porous layer PR2 is formed, the resist mask RM4 is removed. An insulation film is formed in the opening OP1 to repair the buried oxide film 2. A silicon layer is formed on the insulation film to repair the SOI layer 3. The PG shield 102 is formed in the SOI layer 3 to form the construction similar to that of the semiconductor device 4000 is formed.

When the various PG shields described in the first to tenth preferred embodiments are not used, the opening OP 1 may be only filled with the insulation film.

<N. Fourteenth Preferred Embodiment>

The above-mentioned thirteenth preferred embodiment of the present invention features the porous layer PR formed in the silicon substrate 1 of the SOI substrate SB. However, the porous layer may be formed in the SOI layer of the SOI substrate.

<N-1. Device Construction>

Figure 55:
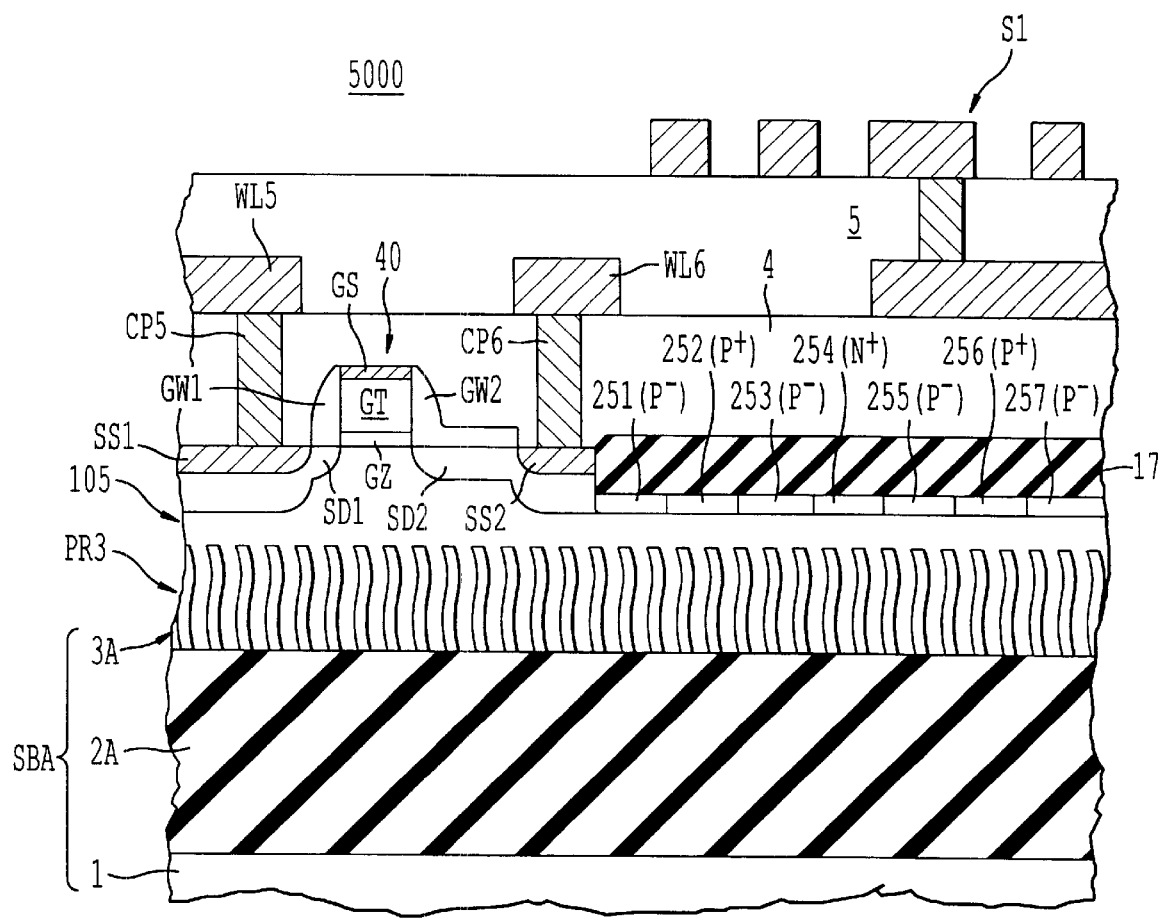
FIG. 55 is a cross-sectional view showing a construction of the semiconductor device according to a fourteenth preferred embodiment of the present invention.
Figure 56:
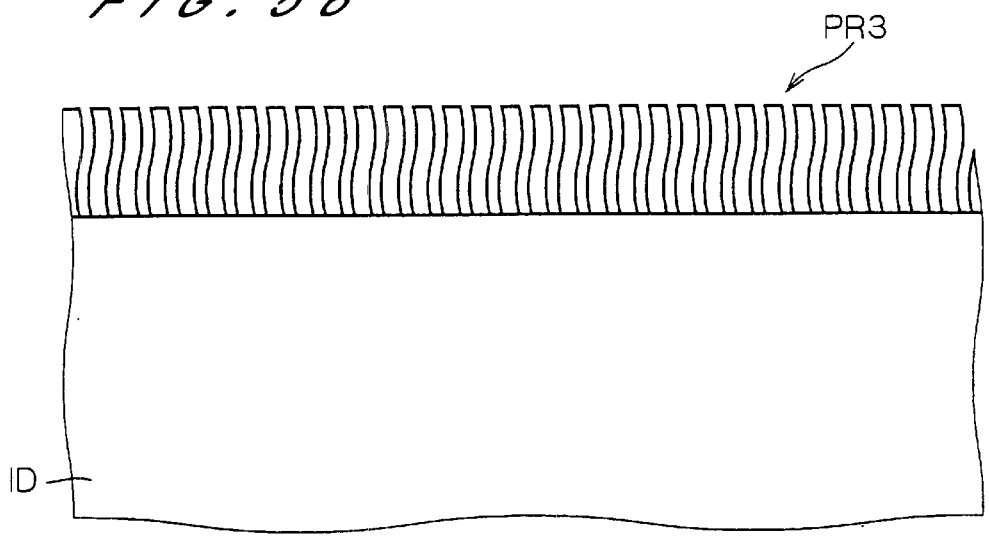
FIGS. 56 through 59 are cross-sectional views showing manufacturing steps of the semiconductor device according to the fourteenth preferred embodiment of the present invention.

FIG. 55 shows a construction of a semiconductor device 5000 according to a fourteenth preferred embodiment of the present invention.

In FIG. 55, the RF circuit portion is shown as disposed on an SOI substrate SBA including the silicon substrate 1, a buried oxide film 2A disposed on the silicon substrate 1, and an SOI layer 3A disposed on the buried oxide film 2A.

The PG shield 105 comprising SOI regions 251 to 257 in intimately contacting relationship is formed in the SOI layer 3A in corresponding relation to the region in which the spiral inductor SI (whose plan configuration is shown in FIG. 70) is provided. The PG shield 105 of FIG. 55 is similar in construction to that of the semiconductor device 500 described with reference to FIG. 18. The PG shield 105 further comprises SOI regions 258 and 259 not shown.

The top surface of the PG shield 105 is covered with the trench isolation oxide film 17 which is the partial isolation oxide film.

A MOS transistor Q40 is formed adjacent to the trench isolation oxide film 17. The MOS transistor Q40 has a gate insulation film GZ disposed on an SOI region defined by the trench isolation oxide film 17, a gate electrode GT disposed on the gate insulation film GZ, a silicide film GS disposed on the gate electrode GT, and sidewall insulation films GW1 and GW2 disposed to cover the side surfaces of the gate insulation film GZ, the gate electrode GT and the silicide film GS.

A source/drain region SD2 on the same side as the sidewall insulation film GW2 is wider than a source/drain region SD1 on the opposite side. The sidewall insulation film GW2 extends onto the source/drain region SD2.

A silicide film SS1 is disposed in the surface of the source/drain region SD1 outside the sidewall insulation film GW1, and a silicide film SS2 is disposed in the surface of the source/drain region SD2 outside the sidewall insulation film GW2. This results in the gate electrode GT offset toward the source/drain region SD1, which is known as an offset gate. The offset gate, which is capable of alleviating electric field concentration in the drain region to increase the breakdown voltage of the MOS transistor, is a suitable structure for power semiconductor devices.

The silicide films SS1 and SS2 are connected through contact portions CP5 and CP6 to overlying interconnect lines WL5 and WL6, respectively.

The constituents of the semiconductor device 5000 similar to those of the semiconductor device 500 of FIG. 18 are designated by the same reference characters, and are not particularly described.

A porous layer PR3 is disposed in the SOI layer 3A, as illustrated in FIG. 55.

The porous layer PR3 includes a plurality of holes formed by the anodization process and extending from the surface of the silicon substrate 1 to the interior thereof. The holes are filled with near-vacuum or insulator.

This interrupts the path of the eddy current generated by the spiral inductor SI to reduce the electromagnetically induced power dissipation in the SOI substrate 3A.

<N-2. Manufacturing Method>

With reference to FIGS. 56 through 59, description will be given on a method of forming the SOI substrate SBA including the SOI layer with the porous layer PR3 formed therein.

A method of forming an SOI substrate including an SOI layer with a porous layer formed therein is disclosed in FIGS. 1 through 9 of Japanese Patent Application No. 11-165951 (1999). The entire disclosure of Japanese Patent Application No. 11-165951 (U.S. patent application Ser. No. 09/448,482 filed on Nov. 24, 1999) is herein incorporated by reference.

The method is described based on the above disclosure. First, in the step shown in FIG. 56, the porous layer PR3 having a thickness of about 1 μm is formed in a main surface of a silicon substrate 1D by the anodization process. After the porous layer PR3 is formed, heat treatment at a temperature of 1000° C. or higher may be, of course, performed in a hydrogen atmosphere for a few seconds, as discussed above, to cause the removal of the openings of the respective holes by reduction, thereby producing the hollows in the interiors of the respective holes and smoothing the upper surface of the porous layer PR3.

A plurality of trenches (or holes) may be formed by etching instead of by the anodization process to constitute the porous layer PR3.

Figure 57:
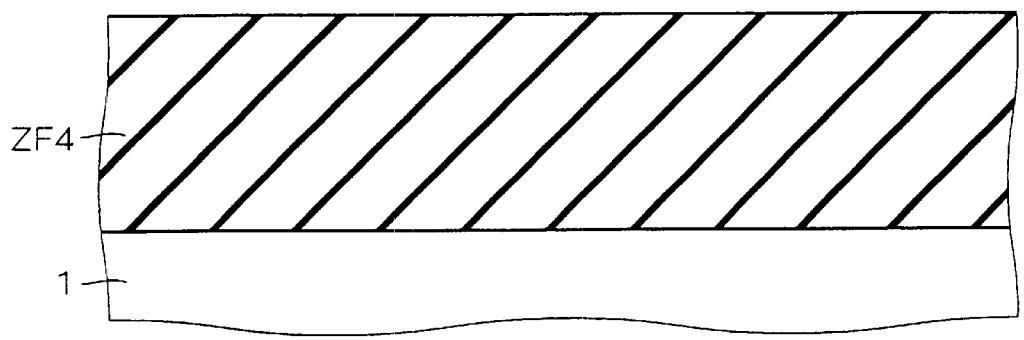

Next, as illustrated in FIG. 57, the silicon substrate 1 with an insulation film ZF4 of a predetermined thickness formed on a main surface thereof is prepared. The insulation film ZF4 which will act as the buried oxide film 2A later is made as thick as the buried oxide film 2A.

Figure 58:
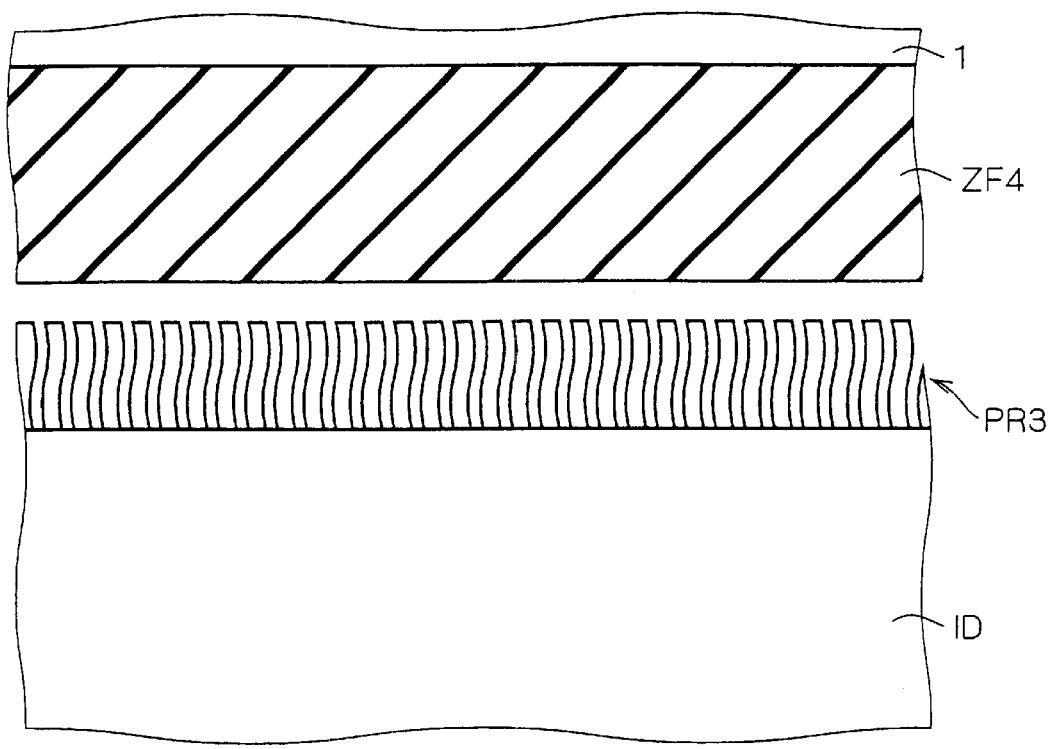

In the step shown in FIG. 58, the silicon substrates 1 and 1D are bonded together so that one of the main surfaces of the silicon substrate 1D in which the porous layer PR3 is formed and the insulation film ZF4 of the silicon substrate 1 are in face-to-face relation.

Figure 59:
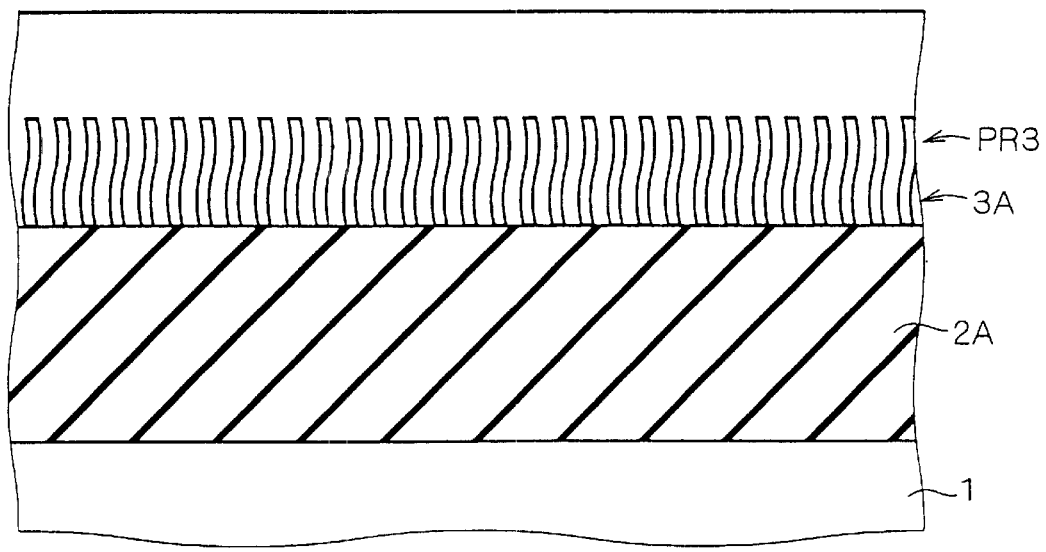

Thereafter, as shown in FIG. 59, the silicon substrate 1D is polished by a CMP process to reduce the thickness thereof until the thickness of the silicon substrate 1D including the porous layer PR3 is equal to the thickness of the SOI layer 3A. In this manner, the SOI substrate SBA including the SOI layer 3A with the porous layer PR3 formed therein is provided.

The method of forming the SOI substrate SBA is not limited to the above-mentioned method. For example, a method disclosed in FIGS. 10 through 19 of Japanese Patent Application No. 11-165951 may be employed.

More specifically, a first porous layer is formed in a first silicon substrate, and an epitaxial layer of a predetermined thickness is formed on the first porous layer by an epitaxial growth technique. Thereafter, a second porous layer is formed in a main surface of the epitaxial layer, and a silicon oxide film is formed on the second porous layer. This provides a first substrate.

Thereafter, a second silicon substrate serving as a second substrate is separately prepared. The first and second substrates are bonded together so that the silicon oxide film of the first substrate and a main surface of the second substrate are in face-to-face relation.

Then, the first porous layer and the first silicon substrate are removed from the resultant structure, using the first porous layer as a boundary. This provides the SOI substrate including the second silicon substrate, the silicon oxide film, the second porous layer and the epitaxial layer formed in stacked relation.

<N-3. Function and Effect>

As described above, the PG shield 105 in the semiconductor device 5000 shown in FIG. 55 can prevent the electrostatically induced power dissipation from being caused by the spiral inductor, without the occurrence of the electromagnetically induced power dissipation resulting from the eddy current generated in the PG shield 105. Additionally, the semiconductor device 5000 has the porous layer PR3 formed in the SOI layer 3A, and the trenches or holes of the porous layer PR3 are filled with near-vacuum or insulator. Therefore, the semiconductor device 5000 can interrupt the path of the eddy current generated by the spiral inductor SI to reduce the electromagnetically induced power dissipation in the SOI layer 3A.

<O. Fifteenth Preferred Embodiment>

The above described twelfth to fourteenth preferred embodiments of the present invention illustrate the constructions of the semiconductor device formed on the SOI substrate wherein the porous layer is formed in the silicon substrate or the SOI layer for preventing the electromagnetically induced power dissipation from being caused by the spiral inductor or the interconnect line in the silicon substrate and in the SOI layer. The present invention is applicable not only to the SOI substrate but also to a silicon substrate known as a bulk substrate.

<O-1. Device Construction>

Figure 60:
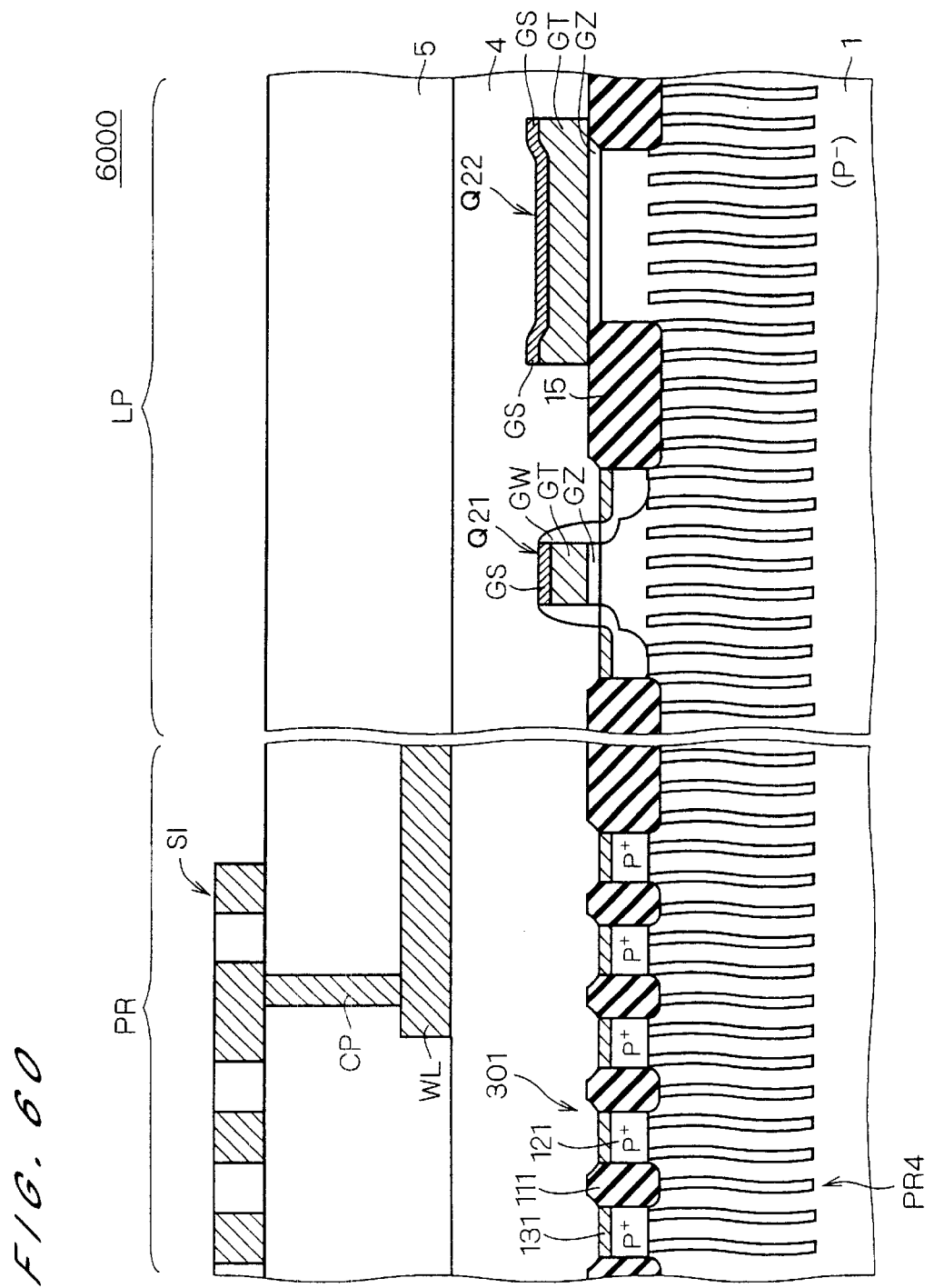
FIG. 60 is a cross-sectional view showing a construction of the semiconductor device according to a fifteenth preferred embodiment of the present invention.

FIG. 60 shows a construction of a semiconductor device 6000 according to a fifteenth preferred embodiment of the present invention. The RF circuit portion RP and the logic portion LP of the semiconductor device 6000 is shown FIG. 60 if the semiconductor device 90 described with reference to FIG. 68 is taken as an example.

Referring to FIG. 60, the region in the P type silicon substrate 1 corresponding to the region in which the spiral inductor SI (whose plan configuration is shown in FIG. 70) is provided is divided into the plurality of doped regions 121 which are implanted with a P type impurity of a relatively high concentration (P$^+$) by the plurality of trench isolation oxide films 111. The trench isolation oxide films 111 are formed by filling trenches extending from the surface of the silicon substrate 1 to a predetermined depth with a silicon oxide film.

The silicide film 131 is disposed on each of the doped regions 121. The plurality of trench isolation oxide films 111, the doped regions 121 and the silicide films 131 constitute the PG shield 301.

In the logic portion LP, the SOI layer 3 is divided into the SOI regions 61 and 62 by the trench isolation oxide film 15. The MOS transistors Q21 and Q22 are formed in the SOI regions 61 and 62, respectively.

The well region NW implanted with an N type impurity of a relative low concentration (N$^-$) is formed beneath the doped regions 121 in the silicon substrate 1 and extends throughout the silicon substrate 1. A porous layer PR4 of a predetermined thickness is formed beneath the doped regions 121 in the silicon substrate 1 including the well region NW and extends throughout the silicon substrate 1.

The constituents of the semiconductor device 6000 similar to those of the semiconductor device 200 of FIG. 8 are designated by the same reference characters, and are not particularly described.

<O-2. Function and Effect>

As described above, the PG shield 301 in the semiconductor device 6000 shown in FIG. 60 can prevent the electrostatically induced power dissipation from being caused by the spiral inductor, without the occurrence of the electromagnetically induced power dissipation resulting from the eddy current generated in the PG shield 301. Additionally, the semiconductor device 6000 has the porous layer PR4 formed in silicon substrate 1, and the trenches or holes of the porous layer PR4 are filled with near-vacuum. Therefore, the semiconductor device 6000 can interrupt the path of the eddy current generated by the spiral inductor SI to reduce the electromagnetically induced power dissipation in the silicon substrate 1.

The arrangement of the porous layer PR4 throughout the silicon substrate 1 produces not only the effect of reducing the electromagnetically induced power dissipation caused by the spiral inductor but also the effect of reducing the electromagnetically induced power dissipation caused by the interconnect line.

<P. Sixteenth Preferred Embodiment>

The above described twelfth to fifteenth preferred embodiments of the present invention illustrate the constructions of the semiconductor device formed on the SOI substrate or the bulk silicon substrate wherein the porous layer is formed in the silicon substrate or the SOI layer for preventing the electromagnetically induced power dissipation from being caused by the spiral inductor and the interconnect line in the silicon substrate and in the SOI layer. Following improvements in construction of the above-mentioned various PG shields of the first to tenth preferred embodiments can prevent the electromagnetically induced power dissipation in the silicon substrate and in the SOI layer.

<P-1. Device Construction>

Figure 61:
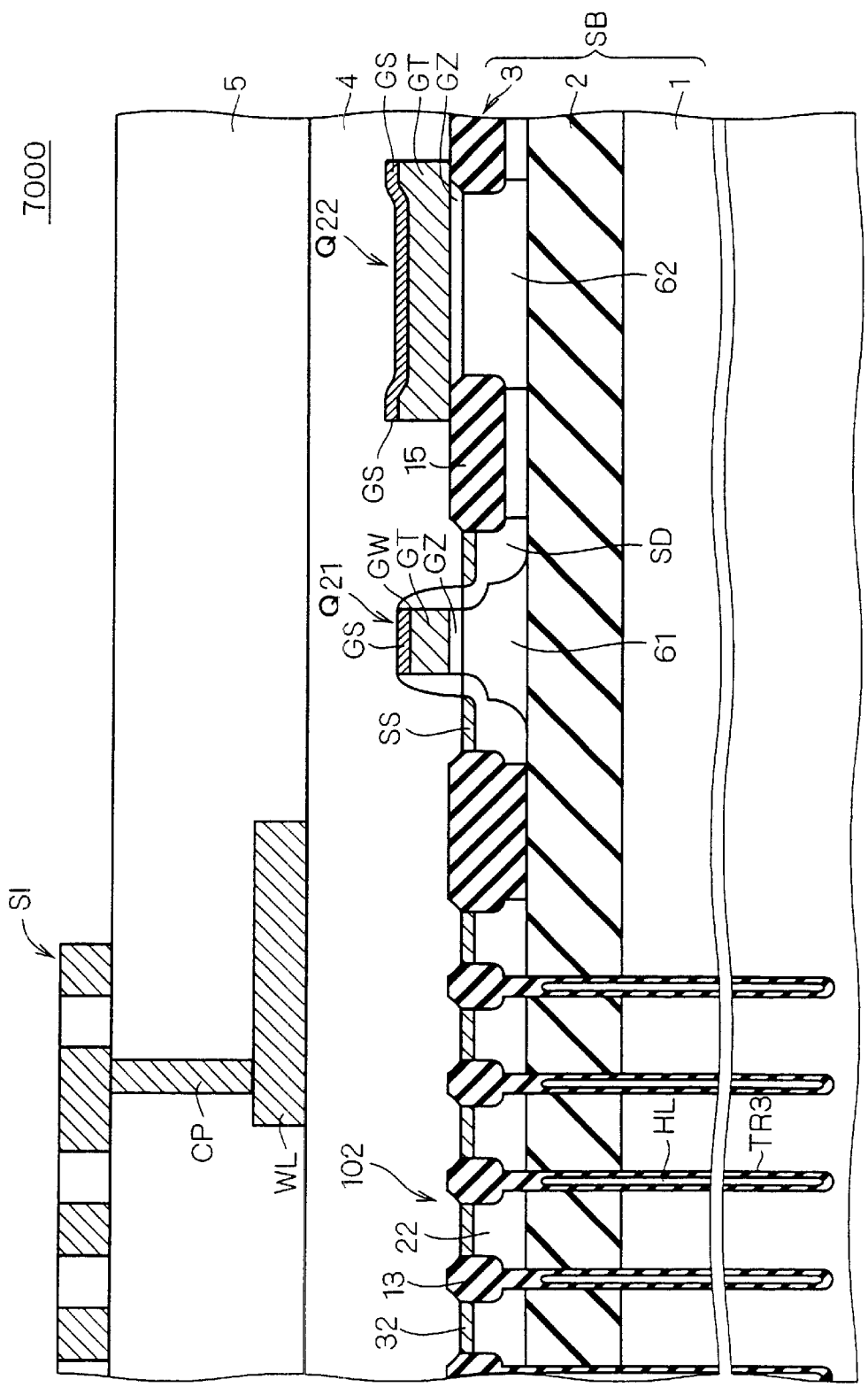
FIG. 61 is a cross-sectional view showing a construction of the semiconductor device according to a sixteenth preferred embodiment of the present invention.

FIG. 61 shows a construction of a semiconductor device 7000 according to a sixteenth preferred embodiment of the present invention. The RF circuit portion RP and the logic portion LP of the semiconductor device 7000 is shown FIG. 61 if the semiconductor device 90 described with reference to FIG. 68 is taken as an example.

With reference to FIG. 61, the RF circuit portion RP and the logic portion LP are disposed on the SOI substrate SB including the silicon substrate 1, the buried oxide film 2 disposed on the silicon substrate 1, and the SOI layer 3 disposed on the buried oxide film 2.

In the RF circuit portion RP, the region in the SOI layer 3 corresponding to the region in which the spiral inductor SI (whose plan configuration is shown in FIG. 70) is provided is divided into the plurality of SOI regions 22 by the plurality of trench isolation oxide films 13. The trench isolation oxide films 13 are formed by filling trenches extending from the surface of the SOI layer 3 to the surface of the buried oxide film 2 with a silicon oxide film, and completely electrically isolate the SOI regions 22 from each other.

The silicide film 32 is disposed on each of the SOI regions 22. The plurality of trench isolation oxide films 13, the SOI regions 22 and the silicide films 32 constitute the PG shield 102.

In the logic portion LP, the SOI layer 3 is divided into the SOI regions 61 and 62 by the trench isolation oxide film 15. The MOS transistors Q21 and Q22 are formed in the SOI regions 61 and 62, respectively.

A trench TR3 with its opening closed by each of the trench isolation oxide films 13 is disposed under each of the trench isolation oxide films 13.

The trench TR3 extends through the buried oxide film 2 to the interior of the silicon substrate 1, and has a depth of about 100 μm.

The hollow HL is formed in the trench TR3 with its opening closed by each of the trench isolation oxide films 13.

The constituents of the semiconductor device 7000 similar to those of the semiconductor device 200 of FIG. 8 are designated by the same reference characters, and are not particularly described.

<P-2. Manufacturing Method>

A method of manufacturing the PG shield 102 and the trenches TR3 will be described with reference to FIGS. 62 through 64.

First, as in the method of manufacturing the semiconductor device 200 described with reference to FIG. 9, the silicon oxide film OX having a thickness of about 20 nm is formed on the SOI layer 3, and the silicon nitride film SN having a thickness of about 200 mn is formed on the silicon oxide film OX. Thereafter, patterning is performed to etch the multi-layer film comprised of the silicon oxide film OX, the silicon nitride film SN and the SOI layer 3 so as to leave a lower part of the SOI layer 3, thereby forming the trenches TR131, TR141 and TR15 in the regions where the respective trench isolation oxide films 13, 14 and 15 are to be formed.

Figure 62:
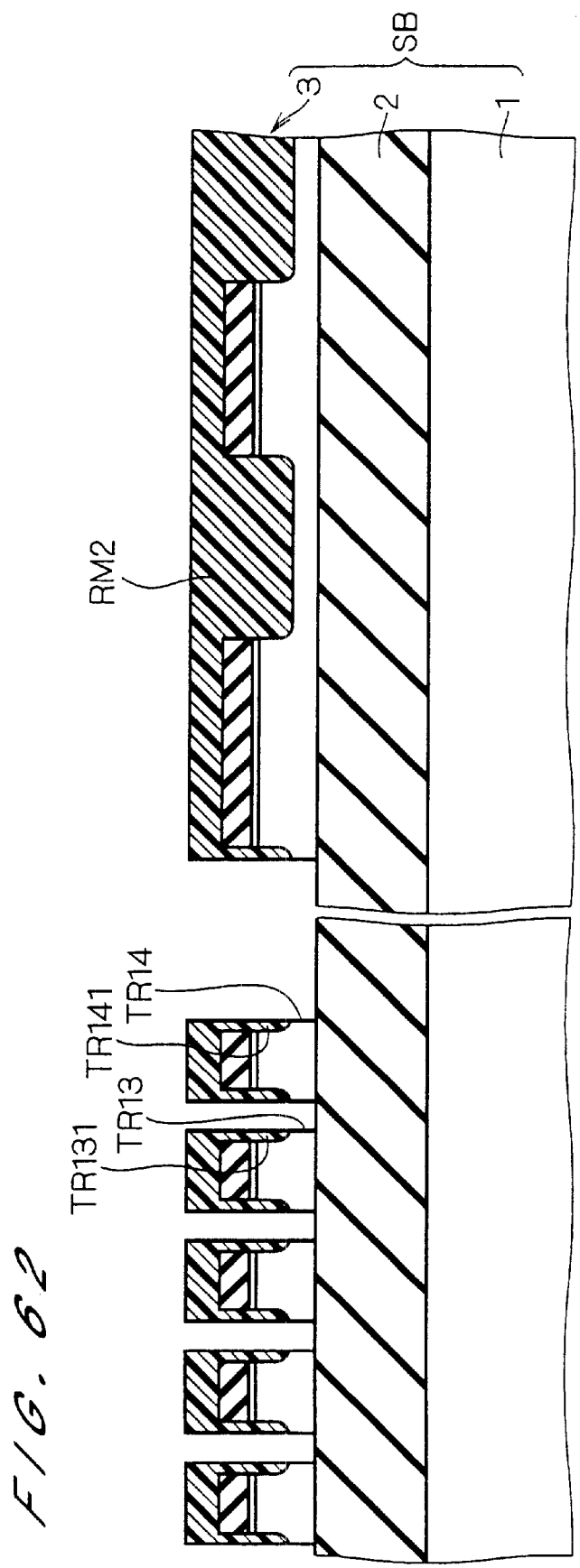
FIGS. 62 through 64 are cross-sectional views showing manufacturing steps of the semiconductor device according to the sixteenth preferred embodiment of the present invention.

Next, in the step shown in FIG. 62, the resist mask RM2 which partially covers the trenches TR131 and TR141 and fully covers the trench TR15 is used to further etch parts of the trenches TR131 and TR141 which are not covered with the resist mask RM2, thereby forming trenches TR13 and TR14 extending through the SOI layer 3.

Figure 63:
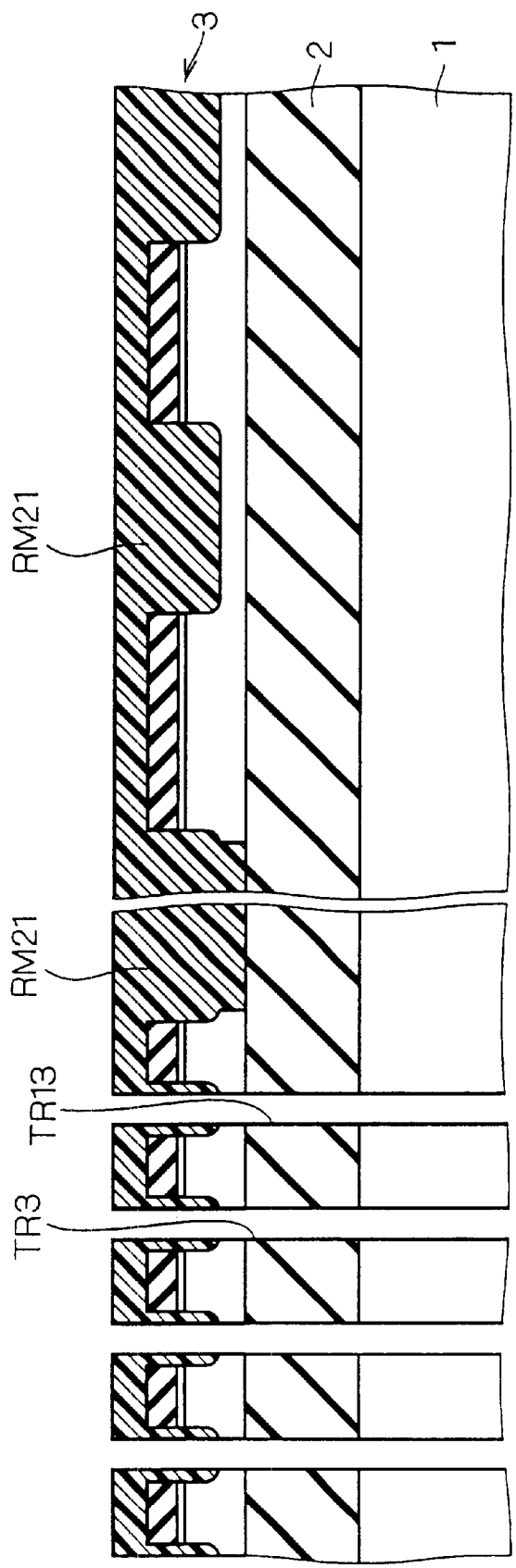

After the resist mask RM2 is removed, the trenches TR3 having a depth of about 100 μm and extending through the buried oxide film 2 to the interior of the silicon substrate 1 are formed using a resist mask RM21 patterned to have openings in corresponding positions to the trenches TR13 in the step shown in FIG. 63.

Figure 64:
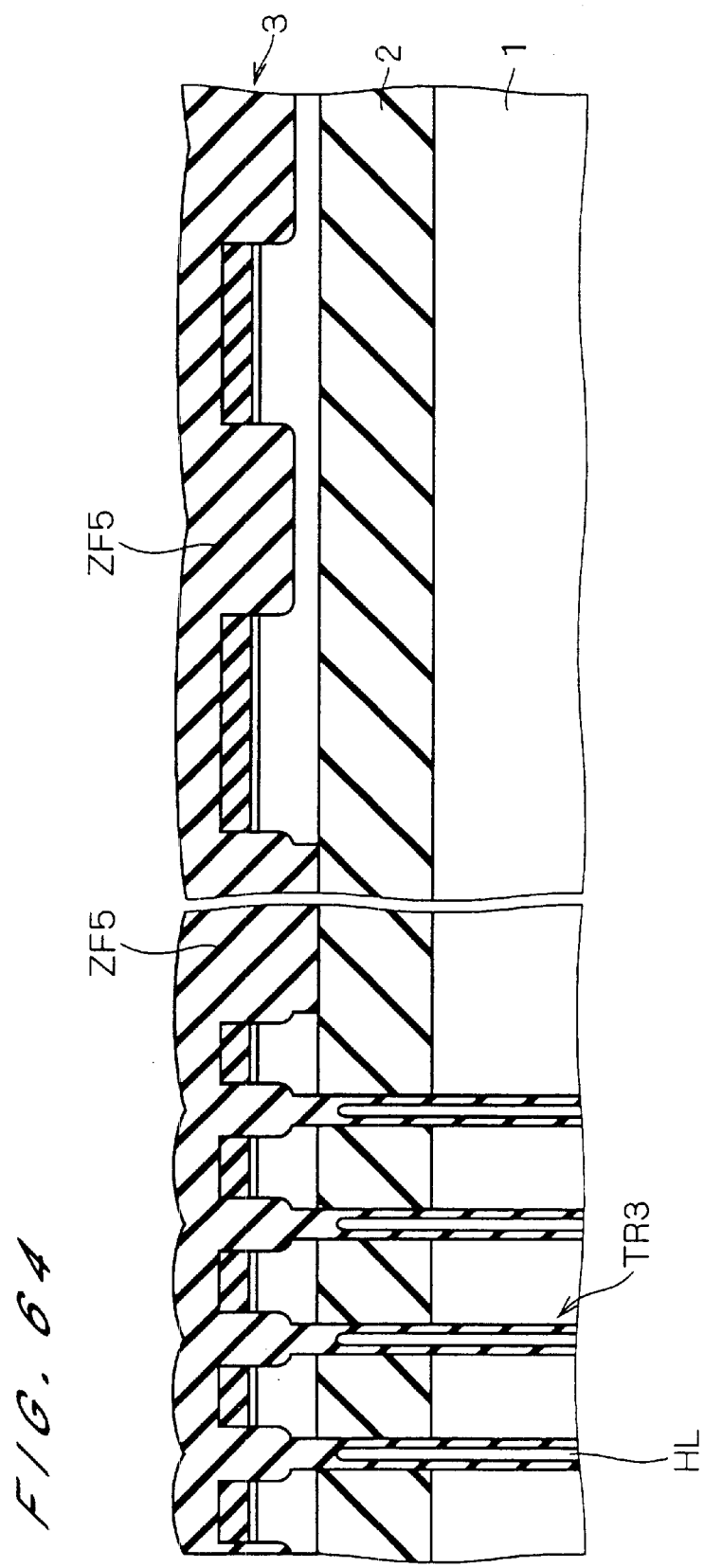

After the resist mask RM21 is removed, a silicon oxide film ZF5 having a thickness greater than the width (e.g., 200 to 500 nm) of the trenches TR3, e.g. a thickness of about 500 nm, is formed on the entire top surface of a resultant structure to bury the trenches TR13, TR14, TR15 and TR3 in the step shown in FIG. 64. A CMP (Chemical Mechanical Polishing) process is performed until the silicon nitride film SN is partway polished away. Then, the silicon nitride film SN and the silicon oxide film OX are removed. This provides the trench isolation oxide films 13 to 15 and the trenches TR13 covered with the trench isolation oxide films 13.

The silicon oxide film ZF5 is disposed to cover the inner surfaces of the trenches TR13. The use of an insulation film having a coverage property of closing the openings of the respective trenches TR13 earlier than completely filling the interior thereof as the silicon oxide film ZF5 produces the hollows HL in the respective trenches TR3.

In this step, when the insulation film ZF5 is formed in a vacuum environment, a vacuum is maintained in the hollows HL to reduce the electrostatically induced power dissipation because of its low dielectric constant.

Thereafter, the existing steps of manufacturing a MOS transistor (including the existing salicide step), manufacturing an interlayer insulation film, manufacturing an interconnect layer, and manufacturing a spiral inductor are performed to provide the semiconductor device 7000.

The plan configuration of the PG shield 102 may be, for example, the configuration illustrated with reference to FIG. 2 or any one of the configurations illustrated with reference to FIGS. 3 through 7. The plan configuration of the trenches TR3 is geometrically similar to the configuration of the trench isolation oxide films of the various shields.

<P-3. Function and Effect>

As described above, the PG shield 102 in the semiconductor device 7000 shown in FIG. 61 can prevent the electrostatically induced power dissipation from being caused by the spiral inductor, without the occurrence of the electromagnetically induced power dissipation resulting from the eddy current generated in the PG shield 102. Additionally, the trenches TR3 disposed under the respective trench isolation oxide films 13 and extending through the buried oxide film 2 to the interior of the silicon substrate 1 can interrupt the path of the eddy current generated by the spiral inductor SI to reduce the electromagnetically induced power dissipation in the silicon substrate 1.

<P-4. First Modification>

Figure 65:
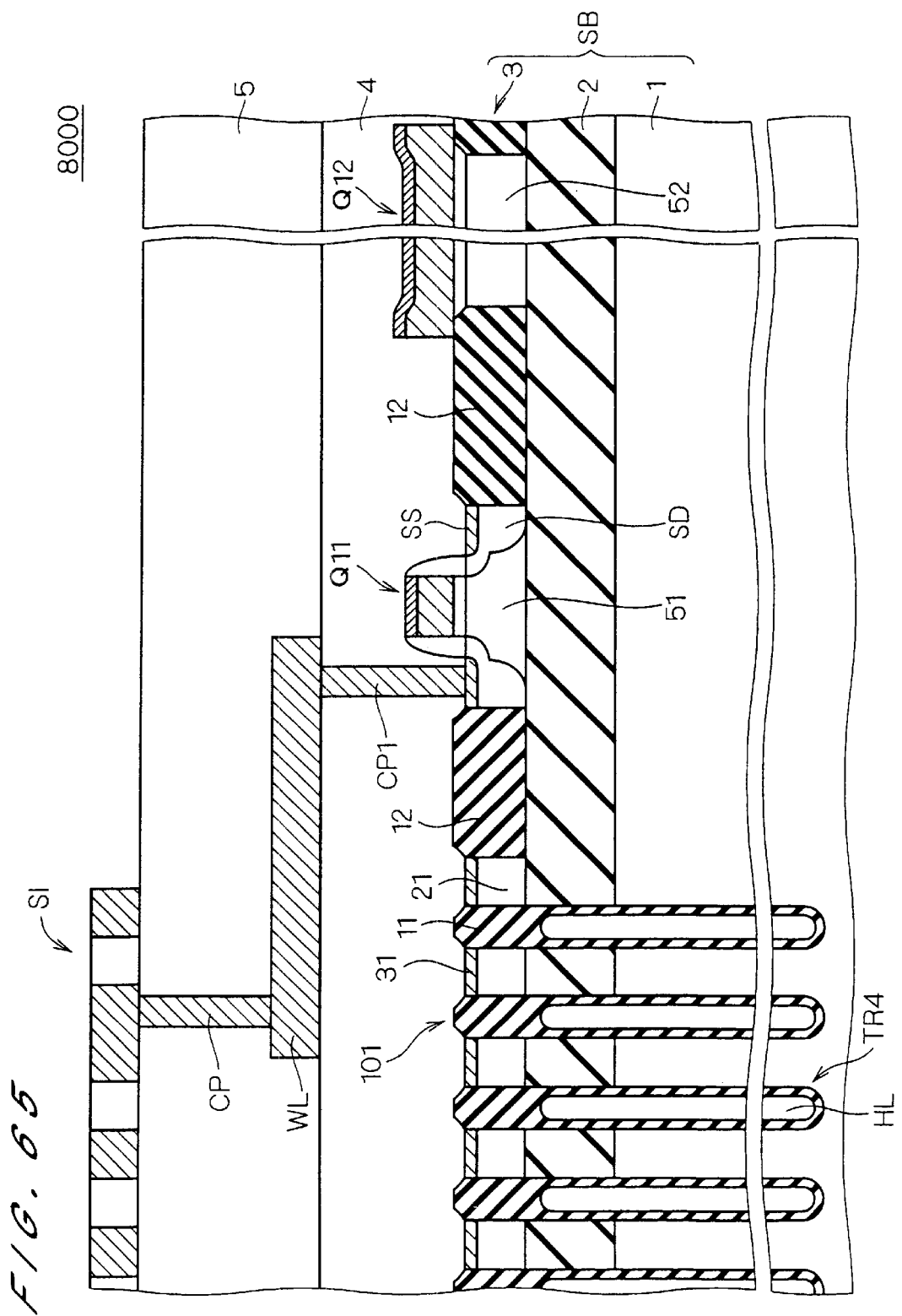
FIGS. 65 through 67 are cross-sectional views showing constructions of modifications of the semiconductor device according to the sixteenth preferred embodiment of the present invention.

In the above-mentioned semiconductor device 7000, the trenches TR3 extending through the buried oxide film 2 to the interior of the silicon substrate 1 are disposed under the respective trench isolation oxide films 13 constituting the PG shield 102. Instead, a semiconductor device 8000 as shown in FIG. 65 may be employed wherein trenches TR4 extending through the buried oxide film 2 to the interior of the silicon substrate 1 are provided under the respective trench isolation oxide films 11 constituting the PG shield 101.

The trenches TR4 have a depth of about 100 μm, and the hollows HL are formed in the trenches TR4 with their openings closed by the trench isolation oxide films 11, respectively.

The constituents of the semiconductor device 8000 similar to those of the semiconductor device 100 of FIG. 1 are designated by the same reference characters, and are not particularly described.

<P-5. Second Modification>

Figure 66:
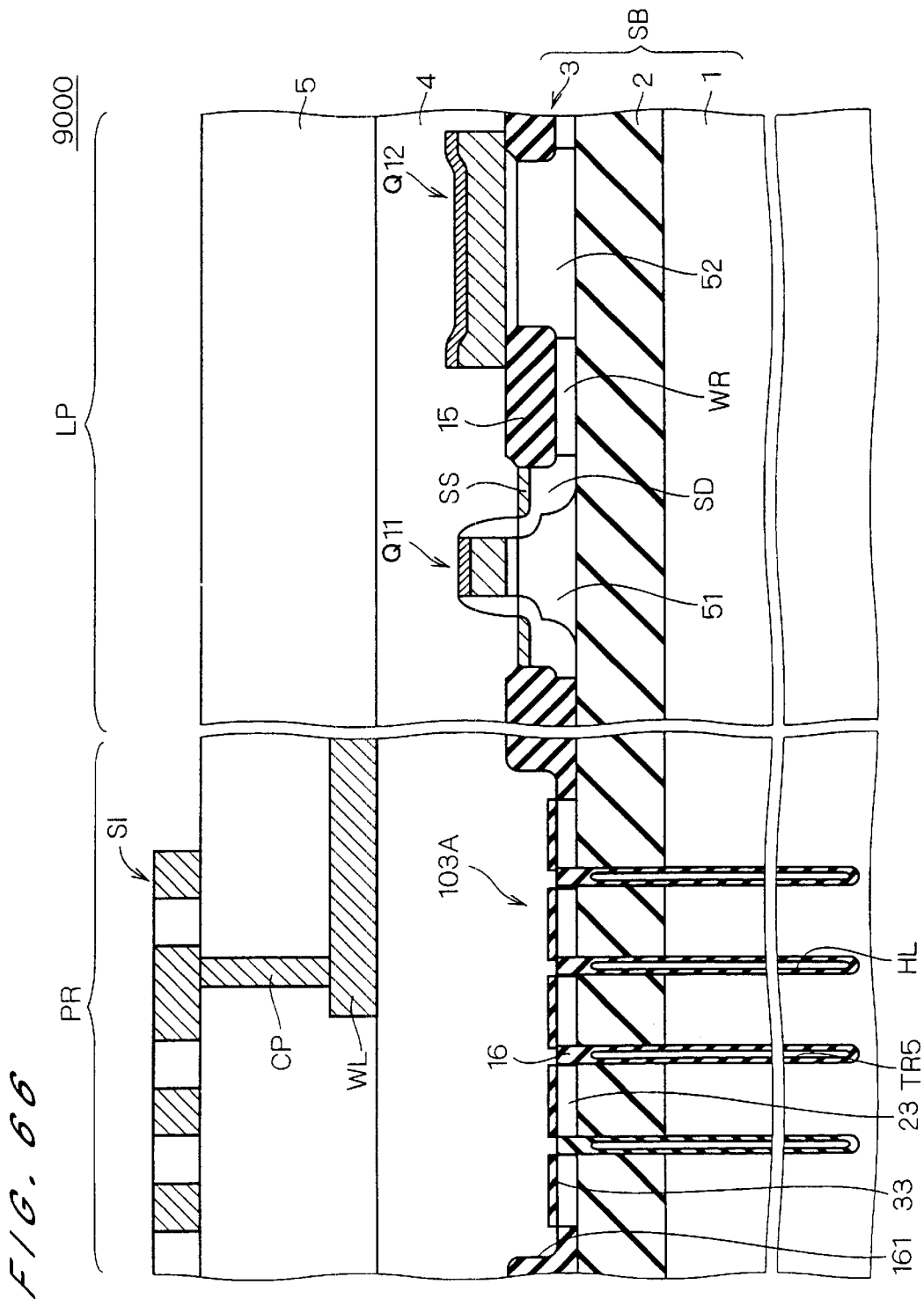

A semiconductor device 9000 as shown in FIG. 66 may be employed wherein trenches TR5 extending through the buried oxide film 2 to the interior of the silicon substrate 1 are provided under the respective trench isolation oxide films 16 constituting the PG shield 103A.

The trenches TR5 have a depth of about 100 μm, and the hollows HL are formed in the trenches TR5 with their openings closed by the trench isolation oxide films 16, respectively.

The constituents of the semiconductor device 9000 similar to those of the semiconductor device 300A of FIG. 14 are designated by the same reference characters, and are not particularly described.

<P-6. Third Modification>

Figure 67:
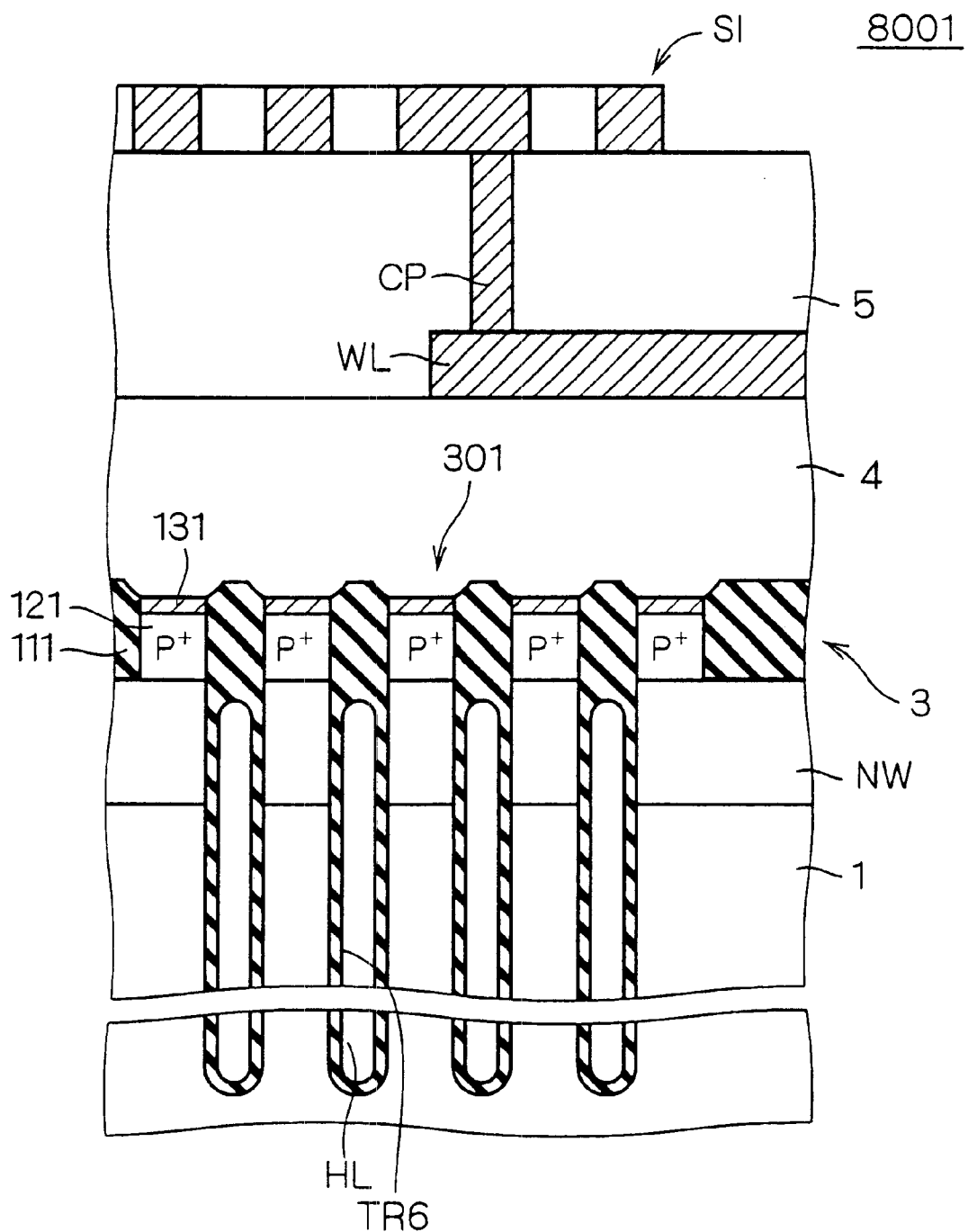

A semiconductor device 8001 as shown in FIG. 67 may be employed wherein trenches TR6 of a predetermined depth are provided under the respective trench isolation oxide films 111 constituting the PG shield 301 formed in the region in the P type silicon substrate 1 corresponding to the region in which the spiral inductor SI (whose plan configuration is shown in FIG. 70) is provided.

The trenches TR6 have a depth of about 100 μm, and the hollows HL are formed in the trenches TR6 with their openings closed by the trench isolation oxide films 111, respectively.

The constituents of the semiconductor device 8001 similar to those of the semiconductor device 2000 of FIG. 40 are designated by the same reference characters, and are not particularly described.

While the invention has been described in detail, the foregoing description is in all aspects illustrative and not restrictive. It is understood that numerous other modifications and variations can be devised without departing from the scope of the invention.

What is claimed is:

1. A semiconductor device comprising:
   a semiconductor substrate having a semiconductor layer;
   a shield layer disposed in a main surface of a first region of said semiconductor layer;
   an inductance element disposed over a region in which said shield layer is formed, with an interlayer insulation film therebetween, and
   a semiconductor element disposed in a second region of said semiconductor layer different from said first region,
   wherein said shield layer has at least one conductive portion composed of part of said semiconductor layer and connected to a ground potential, and at least one current interrupting portion for interrupting a path of an eddy current induced by said inductance element in a plane of said at least one conductive portion.

2. The semiconductor device according to claim 1,
   wherein said semiconductor substrate is an SOI substrate comprising a substrate portion serving as a foundation, a buried oxide film disposed on said substrate portion, and an SOI layer disposed on said buried oxide film;
   wherein said at least one current interrupting portion comprises a plurality of selectively disposed isolation oxide films extending from a surface of said SOI layer through said SOI layer to said buried oxide film; and
   wherein said at least one conductive portion comprises a plurality of SOI regions electrically isolated from each other by said plurality of isolation oxide films.

3. The semiconductor device according to claim 2,
wherein each of said plurality of isolation oxide films has a predetermined width and extends substantially perpendicularly to a surface of said buried oxide film.

4. The semiconductor device according to claim 2,
wherein each of said plurality of isolation oxide films includes a first portion having a first width and extending substantially perpendicularly to a surface of said buried oxide film, and a second portion continuous with and beneath said first portion, said second portion having a second width smaller than said first width and extending substantially perpendicularly to the surface of said buried oxide film.

5. The semiconductor device according to claim 1,
wherein said semiconductor substrate is an SOI substrate comprising a substrate portion serving as a foundation, a buried oxide film disposed on said substrate portion, and an SOI layer disposed on said buried oxide film;
wherein said at least one conductive portion comprises a plurality of SOI regions obtained by thinning said SOI layer to a predetermined thickness; and
wherein said at least one current interrupting portion comprises an insulation film disposed to at least fill a space between said plurality of SOI regions.

6. The semiconductor device according to claim 5,
wherein each of said plurality of SOI regions contains a semiconductor impurity of a relatively high concentration.

7. The semiconductor device according to claim 5,
wherein each of said plurality of SOI regions has a silicide film formed on an upper surface thereof.

8. The semiconductor device according to claim 1,
wherein said semiconductor substrate is an SOI substrate comprising a substrate portion serving as a foundation, a buried oxide film disposed on said substrate portion, and an SOI layer disposed on said buried oxide film;
wherein said shield layer comprises
a first group of SOI regions of a first conductivity type, and
a second group of SOI regions of a second conductivity type,
said first group of SOI regions and said second group of SOI regions being combined to constitute a plurality of diodes;
wherein said at least one current interrupting portion includes at least one reverse-biased diode which is at least one of said plurality of diodes to which a reverse bias is applied; and
wherein said at least one conductive portion includes one of said first and second groups connected to a ground potential.

9. The semiconductor device according to claim 8,
wherein said first group of SO regions and said second group of SOI regions are formed in a region obtained by thinning said SOI layer to a predetermined thickness,
said semiconductor device further comprising
an isolation oxide film for entirely covering said first group of SOI regions and said second group of SOI regions.

10. The semiconductor device according to claim 8,
wherein each of said first group of SOI regions includes a first region approximately equal in thickness to said SOI layer, and a second region adjacent to said first region and obtained by thinning said SOI layer; and
wherein each of said second group of SOI regions is approximately equal in thickness to said SOI layer,
said semiconductor device further comprising
an isolation oxide film for covering an upper surface of each of said second regions.

11. The semiconductor device according to claim 10,
wherein each of said first regions of said first group of SOI regions and said second group of SOI regions has a silicide film formed on an upper surface thereof.

12. The semiconductor device according to claim 8,
wherein each of said first group of SOI regions is a region obtained by thinning said SOI layer to a predetermined thickness;
wherein each of said second group of SOI regions is approximately equal in thickness to said SOI layer; and
wherein said first group of SOI regions and said second group of SOI regions are adjacent to each other,
said semiconductor device further comprising
an isolation oxide film for individually covering said first group of SOI regions.

13. The semiconductor device according to claim 12,
wherein each of said second group of SOI regions has a silicide film formed on an upper surface thereof.

14. The semiconductor device according to claim 12,
wherein said second group of SOI regions are of a rectangular plan configuration; and
wherein said shield layer is of a plan configuration in which said second group of SOI regions are arranged in a matrix, with said isolation oxide film therebetween.

15. The semiconductor device according to claim 12,
wherein said second group of SOI regions are electrically connected to each other by a gate interconnect line similar in construction to a gate electrode of a MOS transistor.

16. The semiconductor device according to claim 8,
wherein said first group of SO1 regions and said second group of SOI regions are arranged in an alternating pattern; and
wherein a gate structure of a MOS transistor is disposed on each of said first group of SOI regions.

17. The semiconductor device according to claim 8,
wherein said first group of SOI regions and said second group of SOI regions are arranged in an alternating pattern;
wherein each of said first group of SOI regions includes a first region and a second region adjacent to said first region; and
wherein a gate structure of a MOS transistor is disposed on each of said second regions.

18. The semiconductor device according to claim 8,
wherein said first group of SOI regions and said second group of SOI regions are arranged in an alternating pattern;
wherein each of said first group of SOI regions includes a first region and a second region adjacent to said first region; and
wherein each of said second group of SOI regions and said first regions has a silicide film formed thereon selectively for non-engagement with said second regions.

19. The semiconductor device according to claim 8,
wherein said first group of SOI regions and said second group of SOI regions are arranged in an alternating pattern; and
wherein each of said first group of SOI regions has a silicide film formed thereon selectively for non-engagement with said second group of SOI regions.

* * * * *